United States Patent
Ujiie et al.

(10) Patent No.: US 10,886,335 B2
(45) Date of Patent: Jan. 5, 2021

(54) IMAGING ELEMENT, STACKED-TYPE IMAGING ELEMENT, IMAGING APPARATUS AND ELECTRONIC APPARATUS

(71) Applicant: SONY CORPORATION, Tokyo (JP)

(72) Inventors: Yasuharu Ujiie, Kanagawa (JP); Masakazu Muroyama, Kanagawa (JP); Masashi Bando, Kanagawa (JP); Masaki Murata, Tokyo (JP); Hideyuki Kumita, Kanagawa (JP); Sachiko Sakaigawa, Kanagawa (JP); Shintarou Hirata, Tokyo (JP); Yuya Kumagai, Tokyo (JP); Yu Kato, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 16/349,759

(22) PCT Filed: Nov. 17, 2017

(86) PCT No.: PCT/JP2017/041394
§ 371 (c)(1),
(2) Date: May 14, 2019

(87) PCT Pub. No.: WO2018/097046
PCT Pub. Date: May 31, 2018

(65) Prior Publication Data
US 2019/0288040 A1   Sep. 19, 2019

(30) Foreign Application Priority Data

Nov. 22, 2016 (JP) ................. 2016-227291

(51) Int. Cl.
*H01L 27/30* (2006.01)
*H01L 51/00* (2006.01)
(Continued)

(52) U.S. Cl.
CPC ........ *H01L 27/307* (2013.01); *H01L 51/0059* (2013.01); *H01L 51/0067* (2013.01);
(Continued)

(58) Field of Classification Search
CPC ............ H01L 51/0059; H01L 51/0067; H01L 51/0068; H01L 51/0072; H01L 51/0074; H01L 51/4273; H01L 51/441
See application file for complete search history.

(56) References Cited

U.S. PATENT DOCUMENTS

| 5,843,607 A | 12/1998 | Hu et al. |
| 2003/0047730 A1* | 3/2003 | Konuma ........... H01L 29/66757 257/42 |

(Continued)

FOREIGN PATENT DOCUMENTS

| JP | 4677314 | 4/2011 |
| JP | 2011-125020 | 6/2011 |

(Continued)

OTHER PUBLICATIONS

Park et al., "Photo-Stable Organic Thin-Film Transistor Utilizing a New Indolocarbazole Derivative for Image Pixel and Logic Applications," Advanced Functional Materials, vol. 24, No. 8, Feb. 26, 2014, pp. 1109-1116.

(Continued)

*Primary Examiner* — Golam Mowla
(74) *Attorney, Agent, or Firm* — Sheridan Ross P.C.

(57) ABSTRACT

There is provided an imaging device including an upper electrode; a lower electrode; a photoelectric conversion layer disposed between the upper electrode and the lower electrode; and a first organic semiconductor material including an indolocarbazole derivative and disposed between the upper electrode and the lower electrode. Further, there is provided an electronic apparatus including an imaging (Continued)

device that includes an upper electrode; a lower electrode; a photoelectric conversion layer disposed between the upper electrode and the lower electrode; and a first organic semiconductor material including an indolocarbazole derivative and disposed between the upper electrode and the lower electrode.

18 Claims, 5 Drawing Sheets

(51) Int. Cl.
 *H01L 51/42* (2006.01)
 *H01L 51/44* (2006.01)
(52) U.S. Cl.
 CPC ...... *H01L 51/0068* (2013.01); *H01L 51/0072* (2013.01); *H01L 51/0074* (2013.01); *H01L 51/4273* (2013.01); *H01L 51/441* (2013.01); H01L 51/008 (2013.01); H01L 51/0046 (2013.01); H01L 51/0077 (2013.01); H01L 51/0078 (2013.01); H01L 51/4253 (2013.01); H01L 2251/308 (2013.01)

(56) References Cited

U.S. PATENT DOCUMENTS

| | | | | |
|---|---|---|---|---|
| 2004/0061121 | A1* | 4/2004 | Uchida | H01L 51/5234 257/82 |
| 2014/0084273 | A1* | 3/2014 | Nakayama | H01L 51/0071 257/40 |
| 2014/0124756 | A1* | 5/2014 | Yokoyama | H01L 51/0073 257/40 |
| 2014/0191227 | A1* | 7/2014 | Inoue | H01L 51/5028 257/40 |
| 2015/0228913 | A1* | 8/2015 | Miyawaki | H01L 51/0068 546/281.1 |

FOREIGN PATENT DOCUMENTS

| | | |
|---|---|---|
| JP | 2011-187937 | 9/2011 |
| WO | WO 2011/125020 | 10/2011 |

OTHER PUBLICATIONS

International Search Report and Written Opinion prepared by the European Patent Office dated Feb. 13, 2018, for International Application No. PCT/JP2017/041394.

* cited by examiner

[Fig. 1]
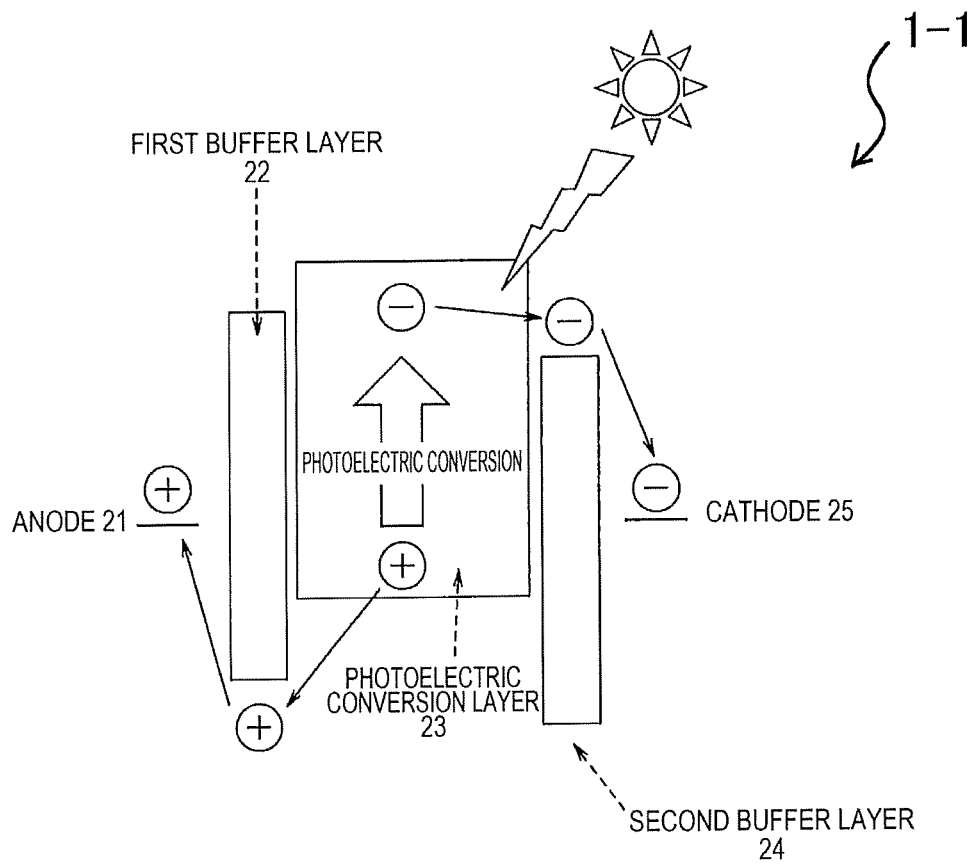
[Fig. 2A]
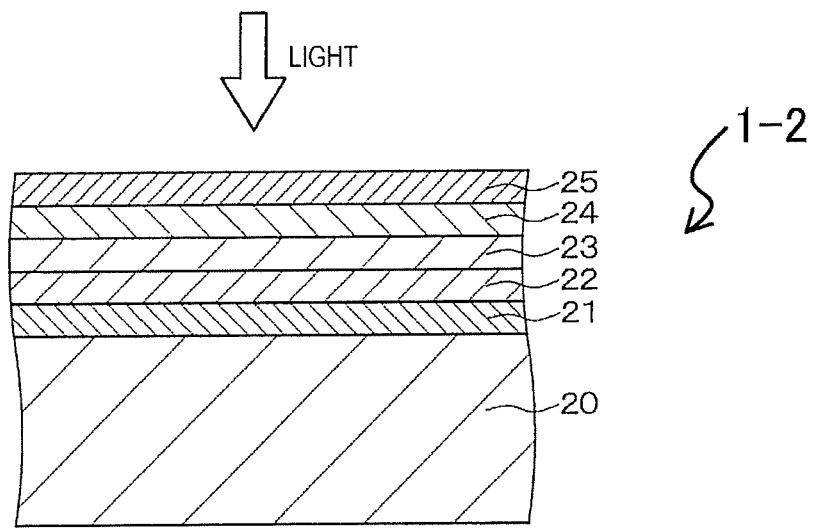

[Fig. 2B]
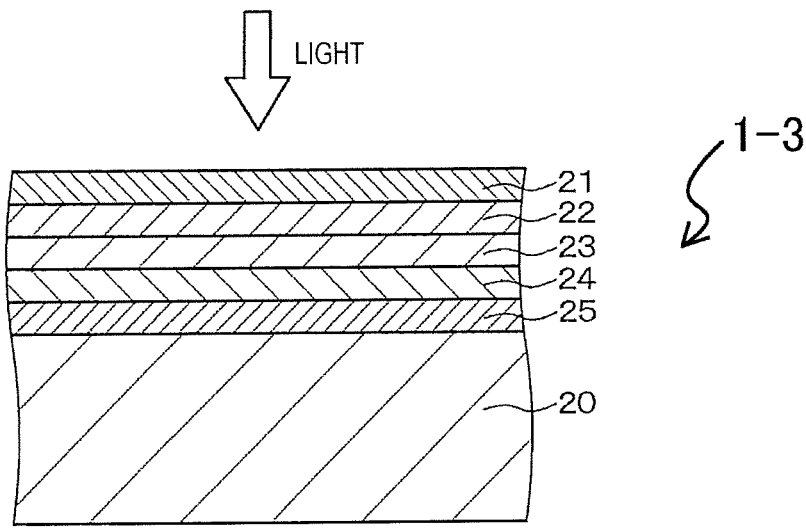
[Fig. 3]
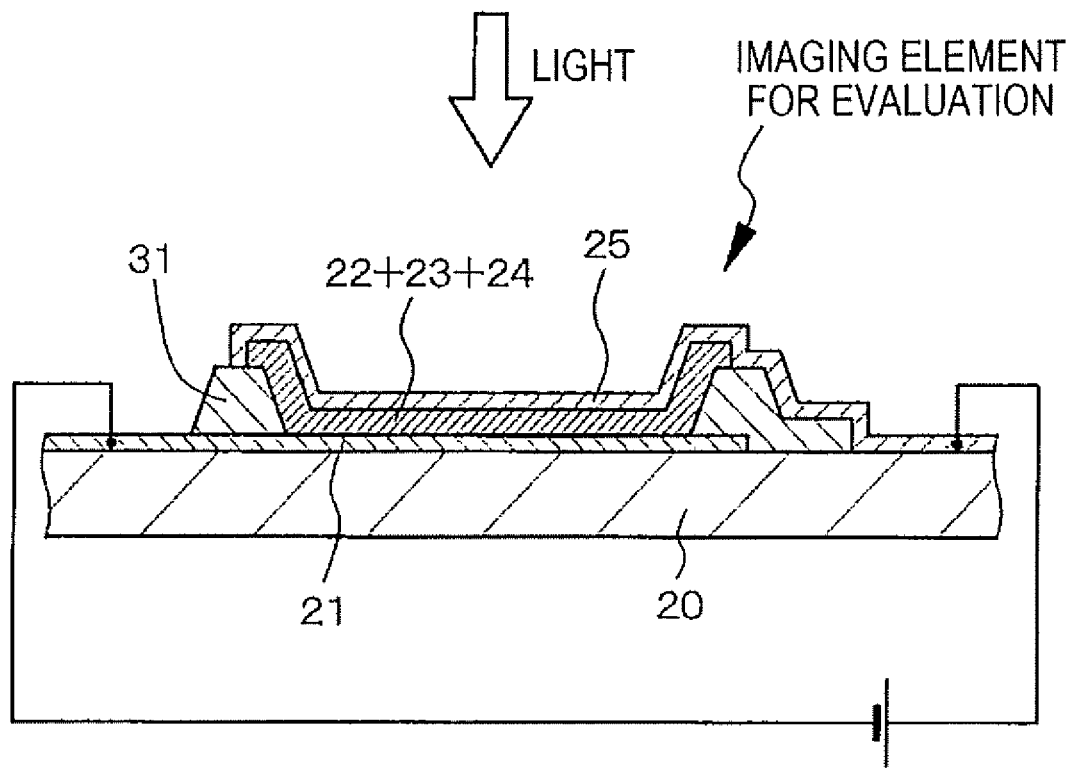

[Fig. 4]
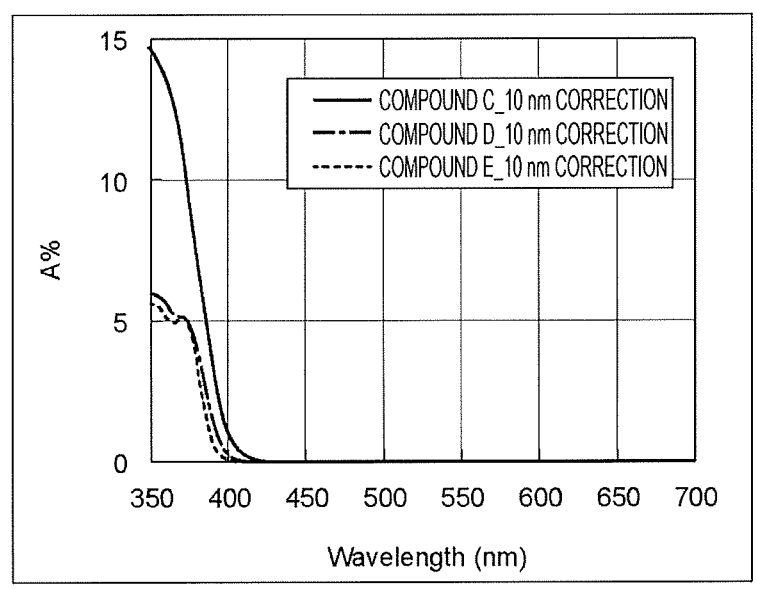

[Fig. 5]
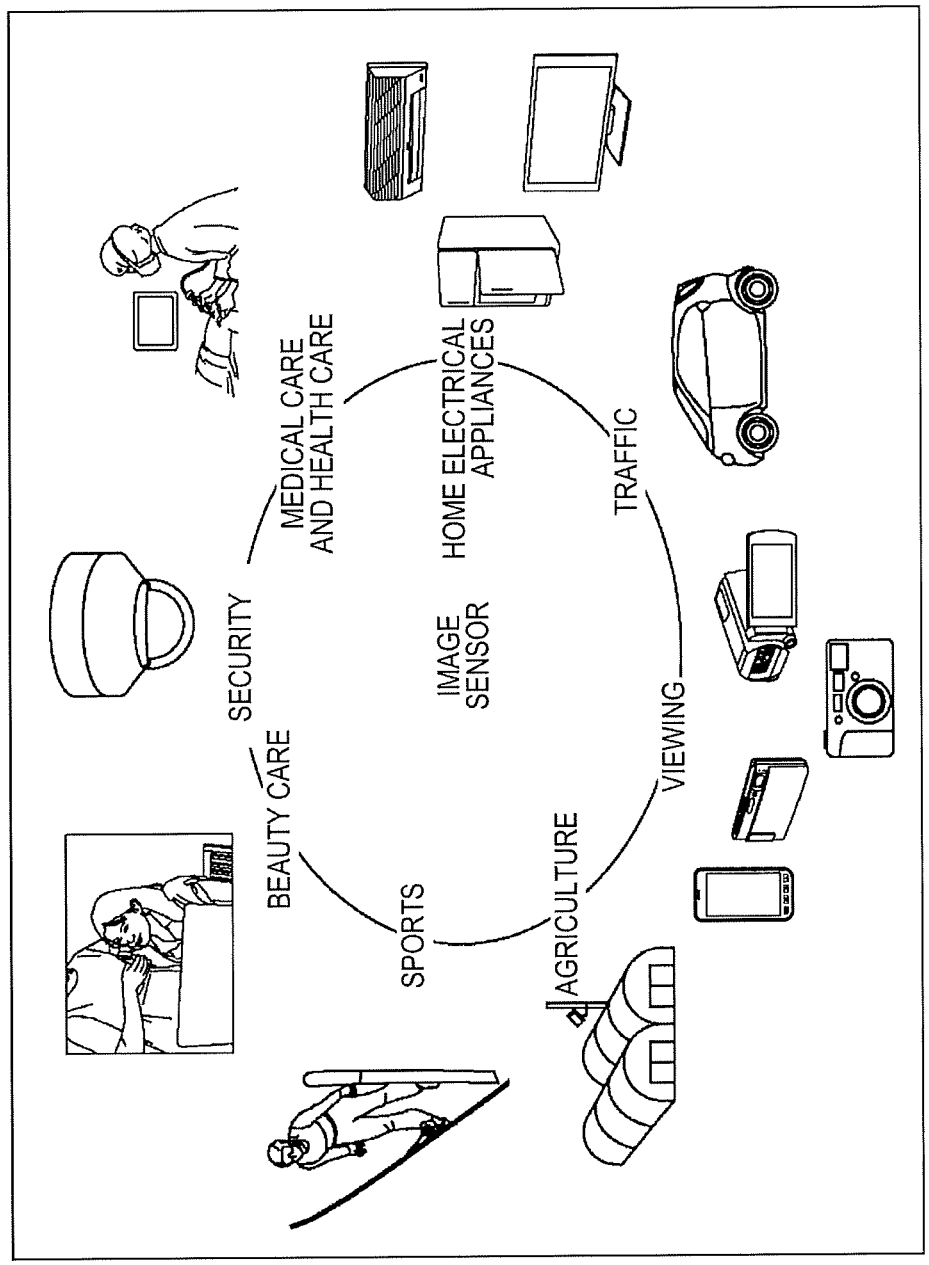

C 6 0

IMAGING ELEMENT, STACKED-TYPE IMAGING ELEMENT, IMAGING APPARATUS AND ELECTRONIC APPARATUS

CROSS REFERENCE TO RELATED APPLICATIONS

This application is a national stage application under 35 U.S.C. 371 and claims the benefit of PCT Application No. PCT/JP2017/041394 having an international filing date of 17 Nov. 2017, which designated the United States, which PCT application claimed the benefit of Japanese Patent Application No. 2016-227291 filed 22 Nov. 2016, the entire disclosures of each of which are incorporated herein by reference.

TECHNICAL FIELD

The present technology relates to an imaging element, a stacked-type imaging element, an imaging apparatus and electronic apparatus.

BACKGROUND ART

Recently, applications of an imaging element, not only in digital cameras and video camcorders but also in smartphone cameras, surveillance cameras, automotive back monitors, and collision prevention sensors, have widened and are receiving much attention. In order to cope with various applications, improvement of performance and functional diversification of imaging elements are being attempted, and advances continue to be made in imaging elements.

For example, a sensor including an organic photoelectric conversion element which has an organic photoelectric conversion layer containing an organic compound refined by sublimation between a pair of electrodes, and an organic hole blocking layer disposed between one electrode and the organic photoelectric conversion layer, and a voltage applying unit for applying a voltage of $1.0 \times 10^5$ V/cm to $1.0 \times 10^7$ V/cm to the organic photoelectric conversion layer during light irradiation, where the ionization potential of the hole blocking layer is 1.3 eV or more higher than the work function of one adjacent electrode and the electron affinity of the hole blocking layer is equal to or higher than the electron affinity of the adjacent organic photoelectric conversion layer, has been proposed (see PTL 1).

Furthermore, a photoelectric conversion element including a conductive thin film, an organic photoelectric conversion film, a blocking layer, and a transparent conductive thin film, where the organic photoelectric conversion film contains a p-type organic photoelectric conversion material having a glass transition point (Tg) of 100° C. or more and forming an amorphous film, and the blocking layer contains a blocking material having a Tg of 140° C. or more, has been proposed (see PTL 2).

CITATION LIST

Patent Literature

[PTL 1]
JP 4677314B
[PTL 2]
JP 2014-520522A

SUMMARY

Technical Problem

However, with the technologies proposed in PTLs 1 and 2, there is a possibility that further improvement of image quality and reliability may not be possible.

The present technology is made in view of such a situation, and the main purpose of the present technology is to provide an imaging element, a stacked-type imaging element, an imaging apparatus and an electronic apparatus that can further improve image quality and reliability.

Solution to Problem

Various embodiments are directed towards imaging devices that include an upper electrode; a lower electrode; a photoelectric conversion layer disposed between the upper electrode and the lower electrode; and a first organic semiconductor material including an indolocarbazole derivative and disposed between the upper electrode and the lower electrode.

Additional embodiments are directed towards an electronic apparatus including an imaging device that includes an upper electrode; a lower electrode; a photoelectric conversion layer disposed between the upper electrode and the lower electrode; and a first organic semiconductor material including an indolocarbazole derivative and disposed between the upper electrode and the lower electrode.

Further, the imaging devices may have the first organic semiconductor material disposed between the photoelectric conversion layer and the lower electrode. In various embodiments, the indolocarbazole derivative may be selected from the group consisting of

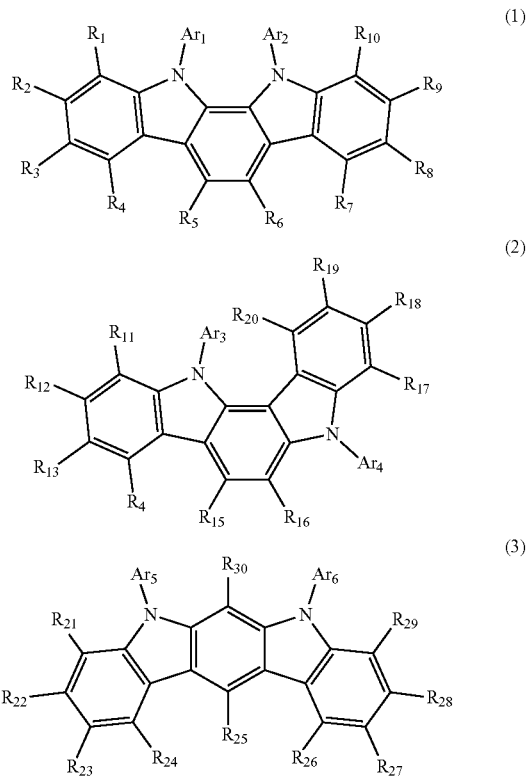

-continued (4)
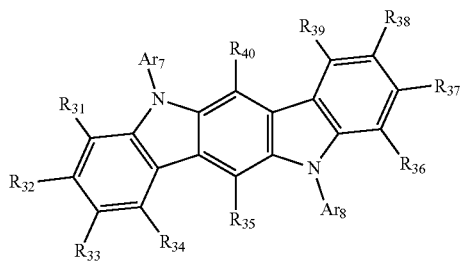

(5)
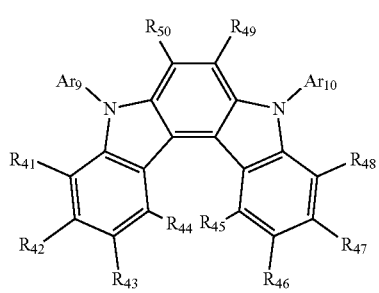

(6)
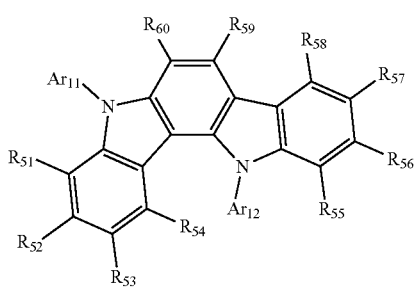

(7)
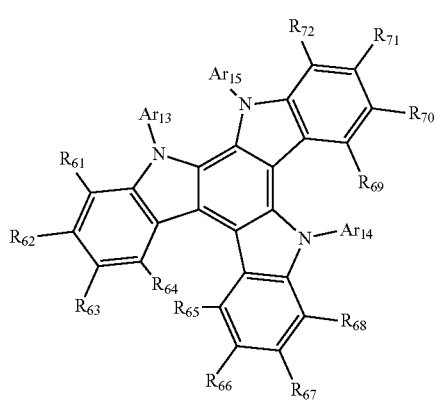

-continued (8)
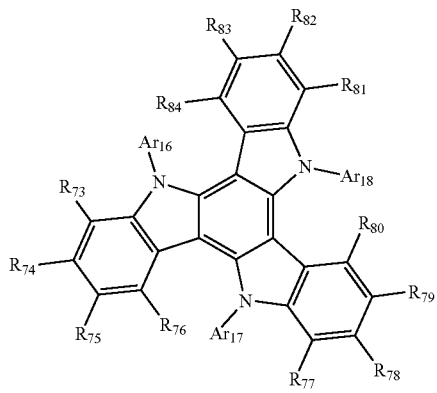

(9)
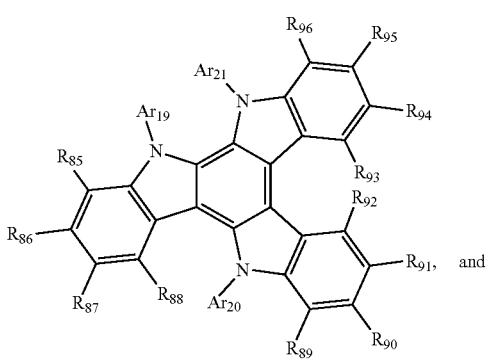

and

(10)
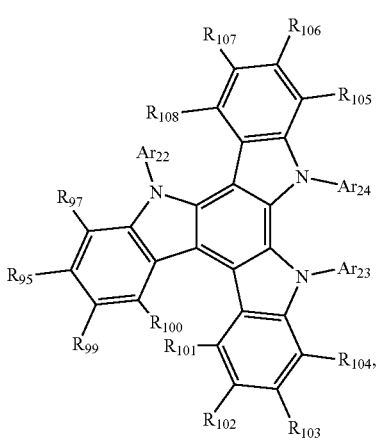

where in the formulas (1) to (10), the $Ar_1$ to $Ar_{24}$ each independently represent an aryl group; and $R_1$ to $R_{108}$ each independently represent a hydrogen group, an alkyl group, an aryl group, an arylamino group, an aryl group having an arylamino group as a substituent, or a carbazolyl group, and the formulas (1) to (10) may further be selected from the group consisting of

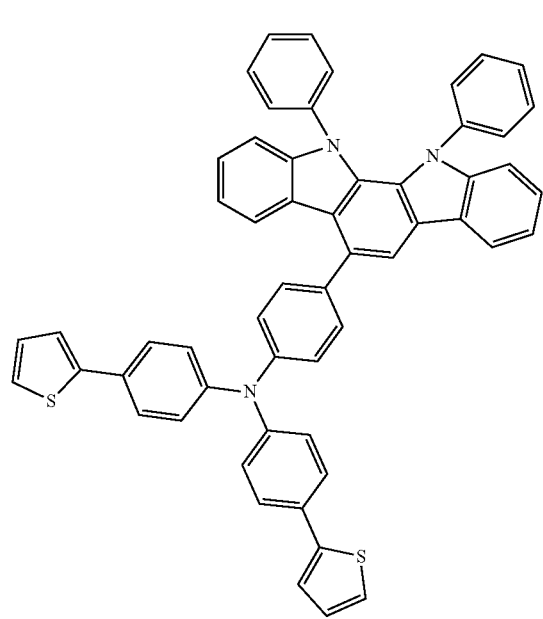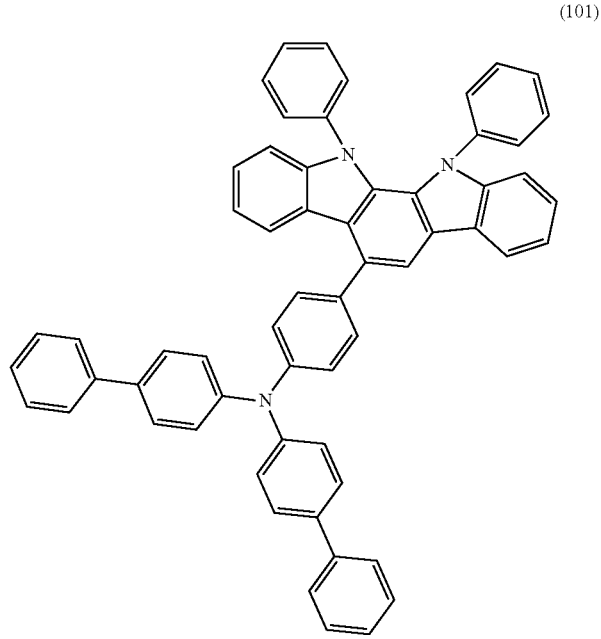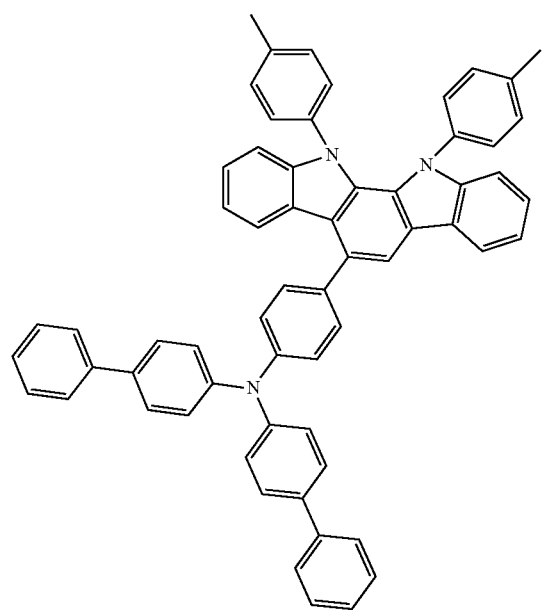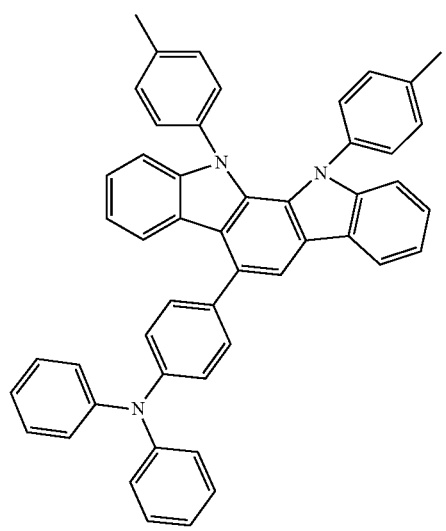

-continued
(104)
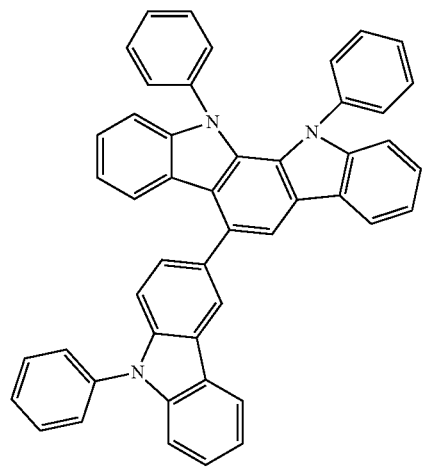
(105)
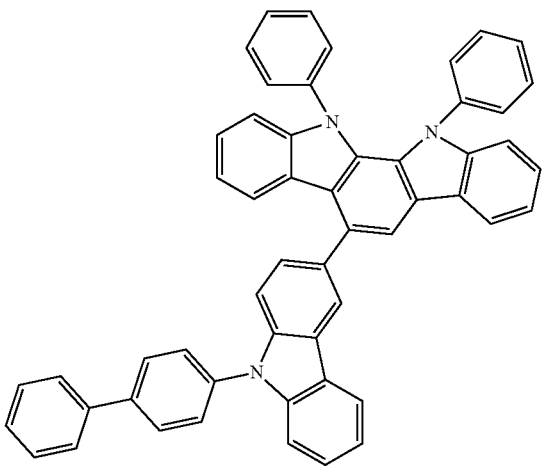
(106)
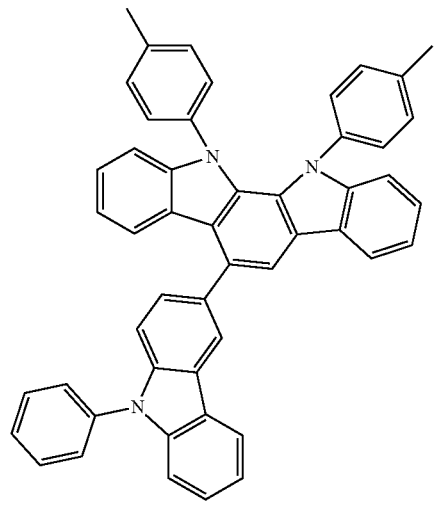
(107)
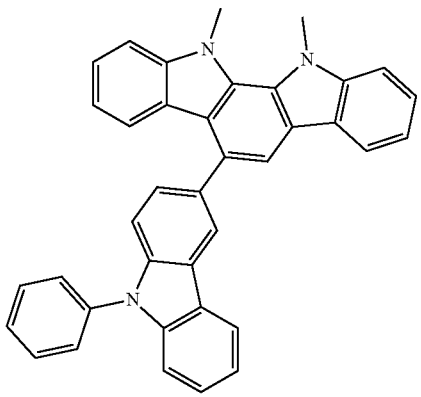
(108)
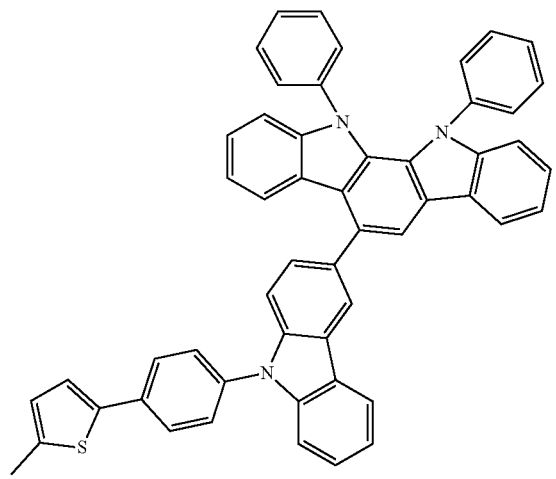
(109)
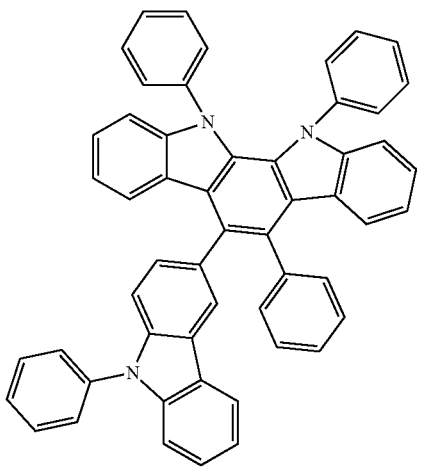

-continued
(110)
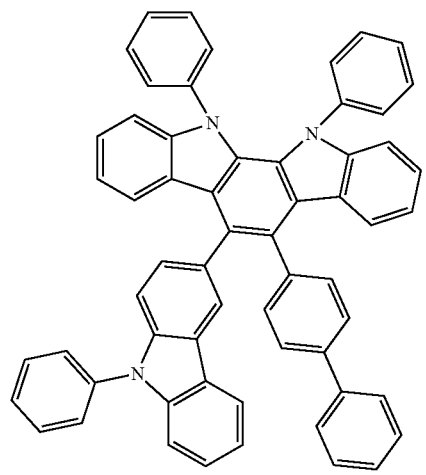
(111)
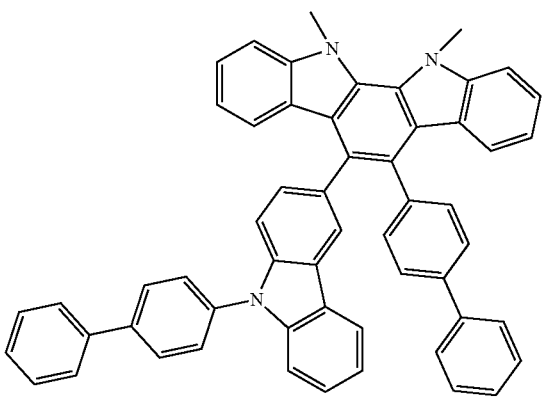
(112)
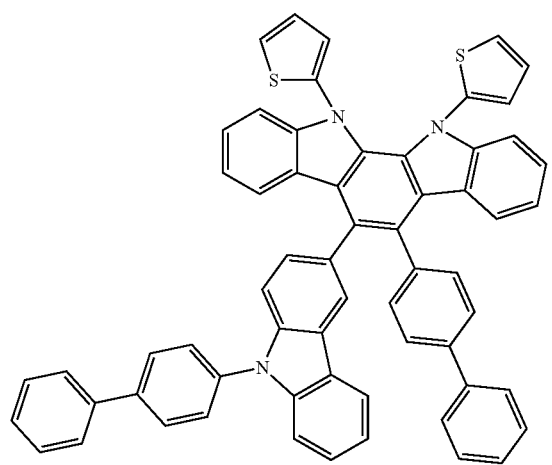
(113)
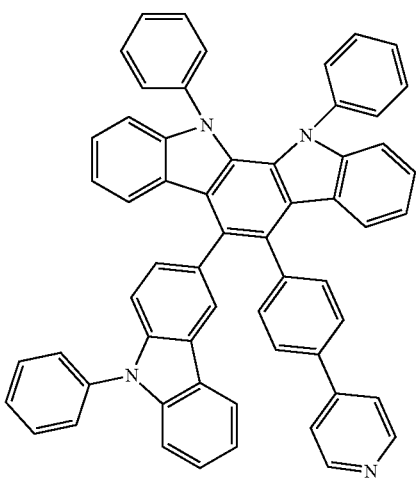
(114)
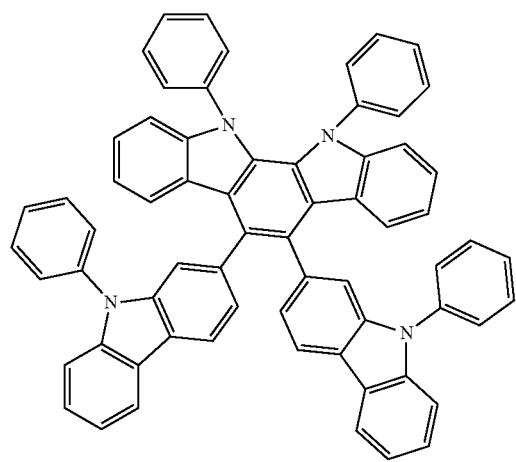
(115)
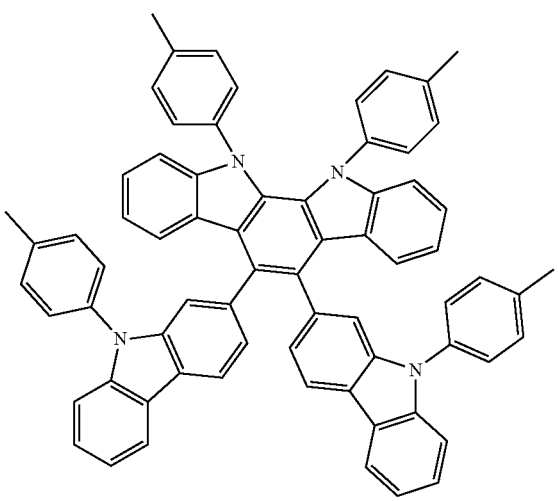

(116)
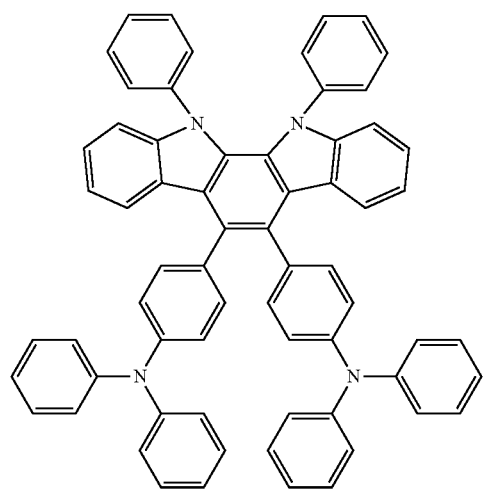
(117)
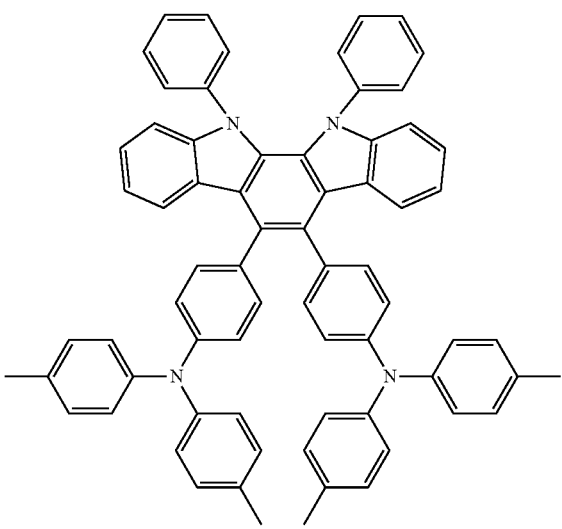
(118)
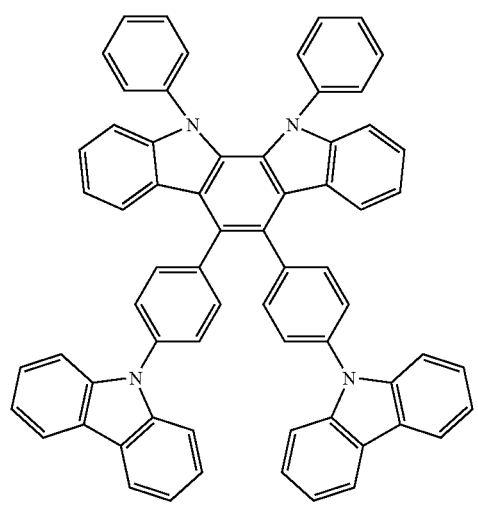
(119)
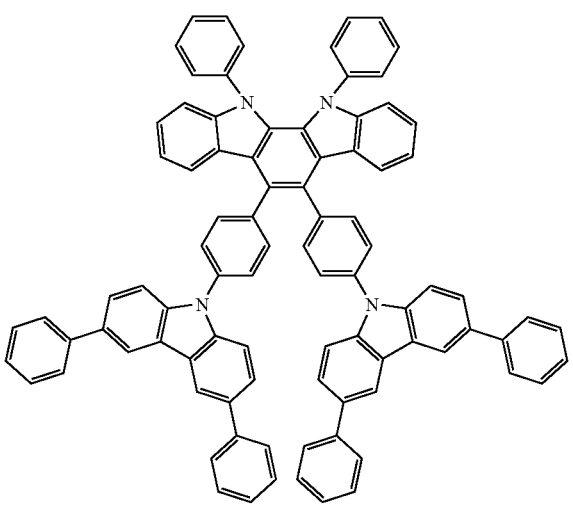
(120)
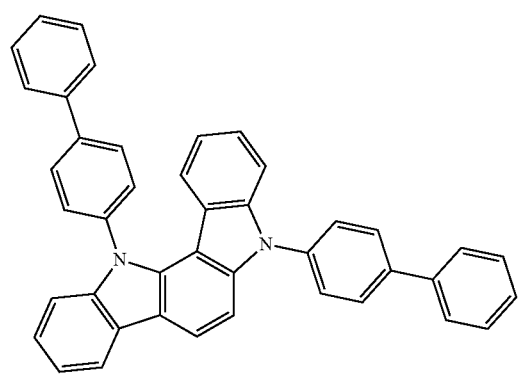
(121)
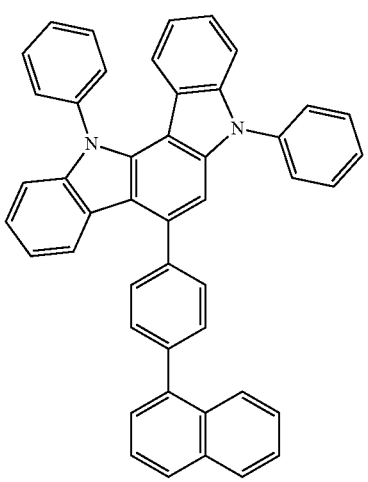

(122)
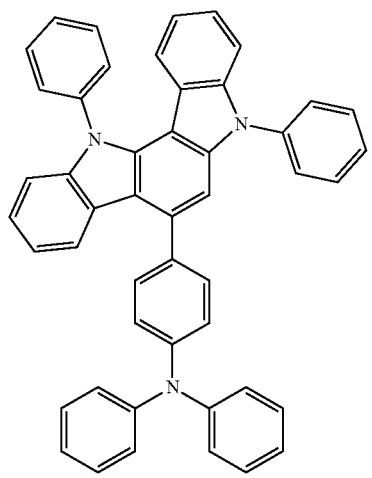
(123)
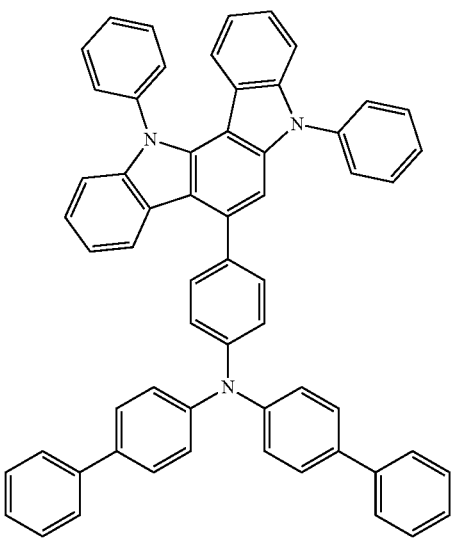
(124)
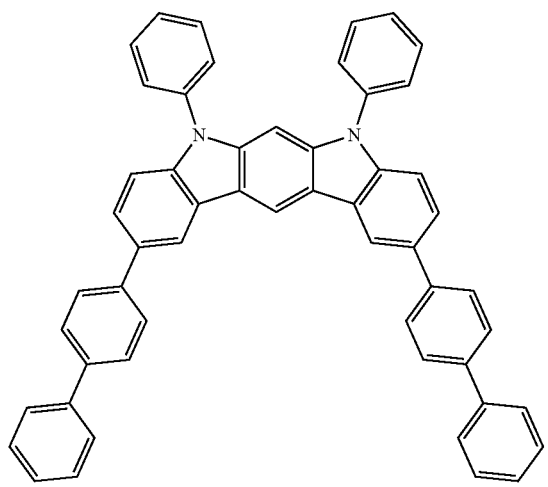
(125)
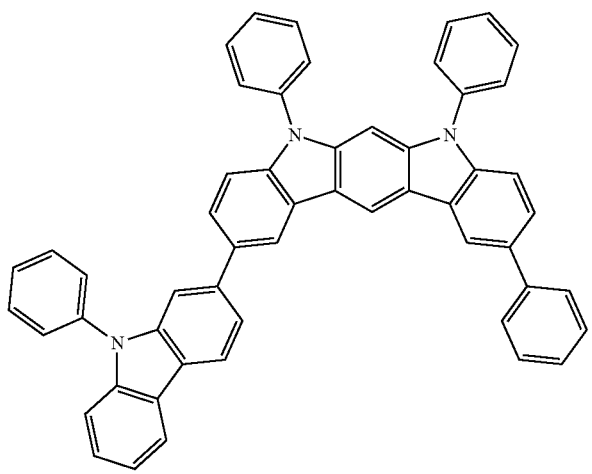
(126)
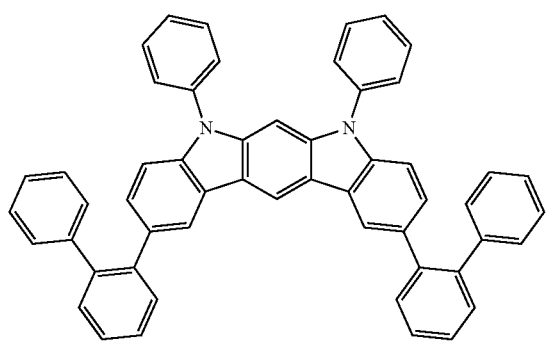
(127)
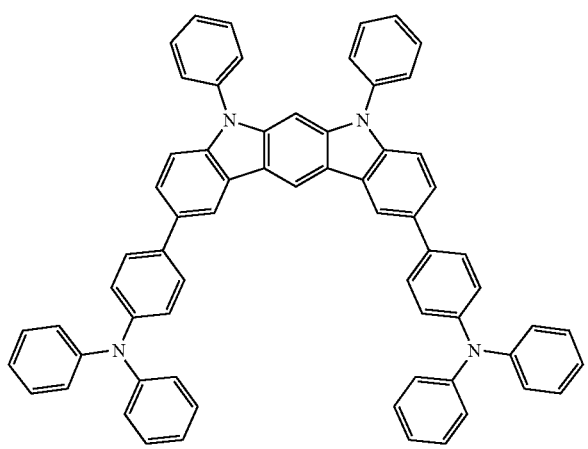

(128)
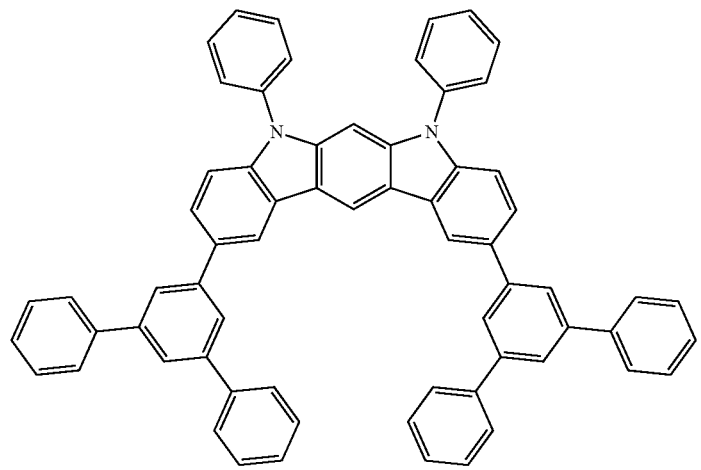
(129)
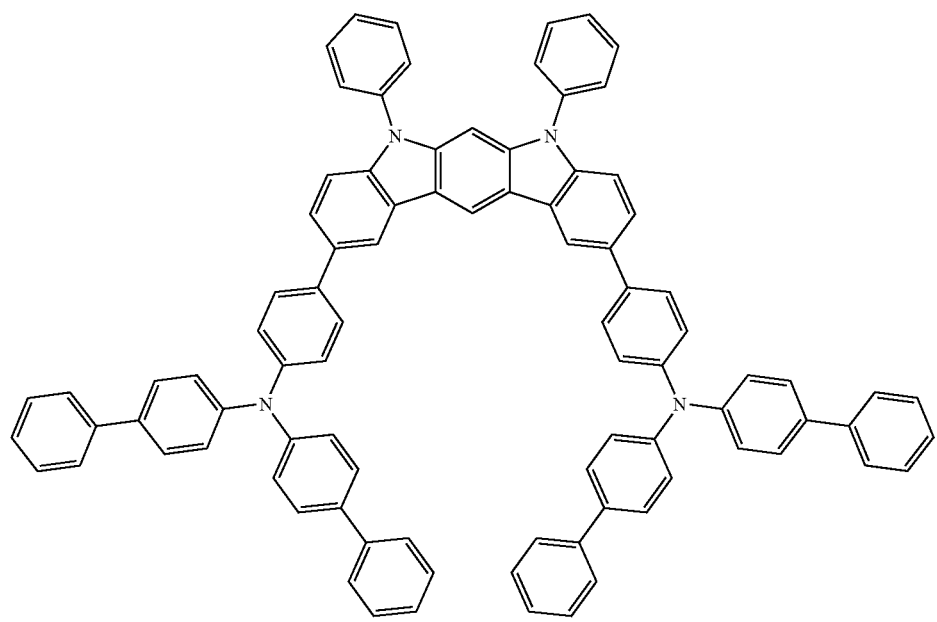

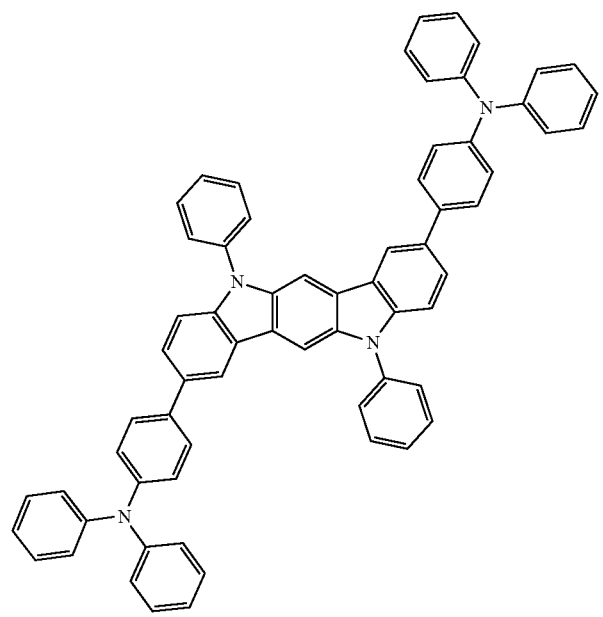
(130)
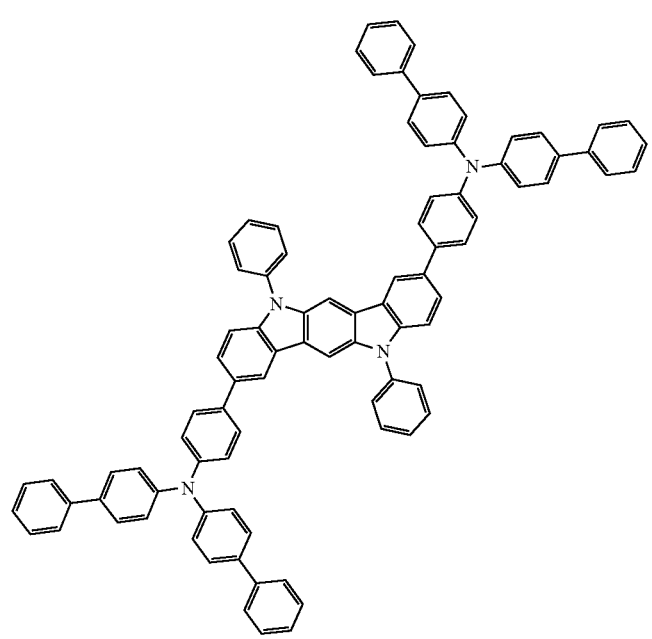
(131)

-continued
(132)
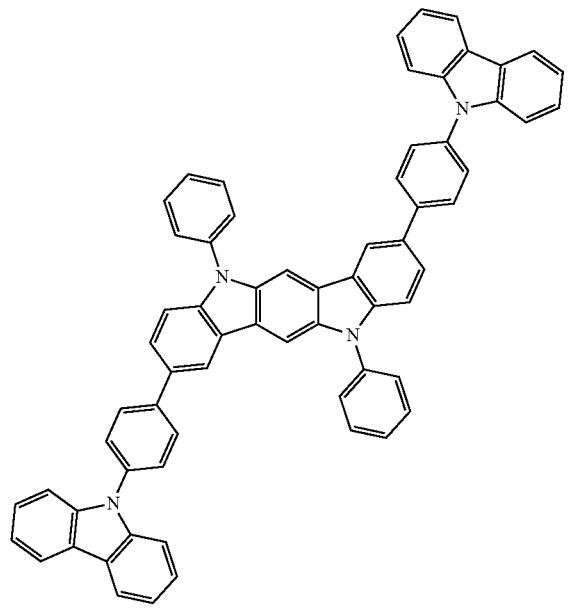
(133)
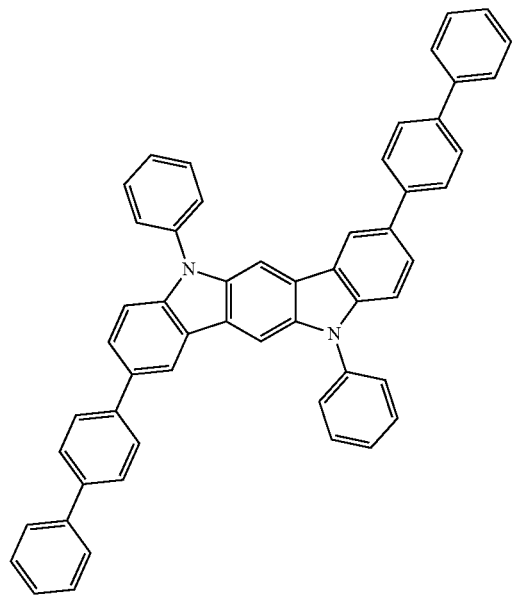
(134)
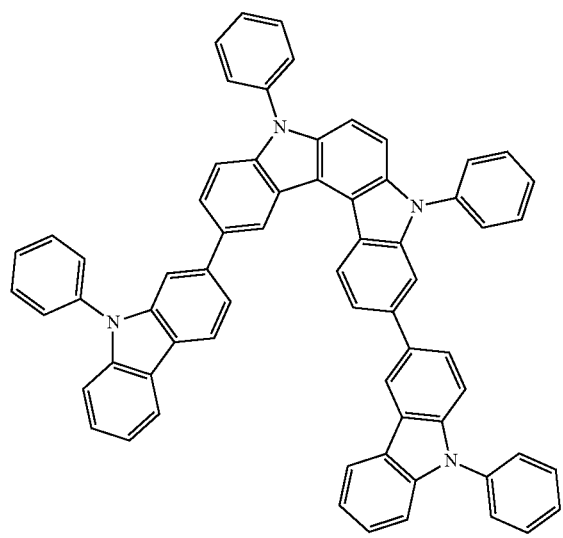
(135)
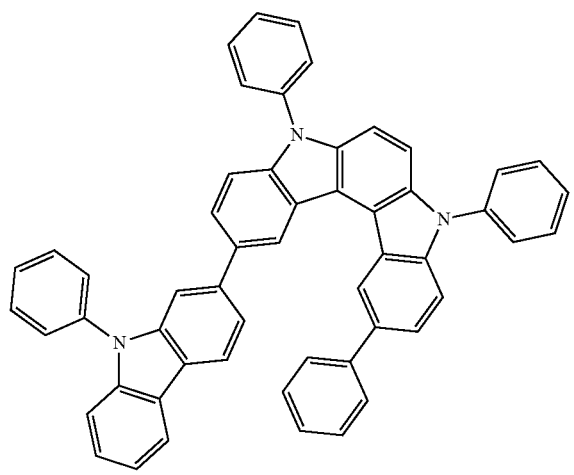

-continued
(136)
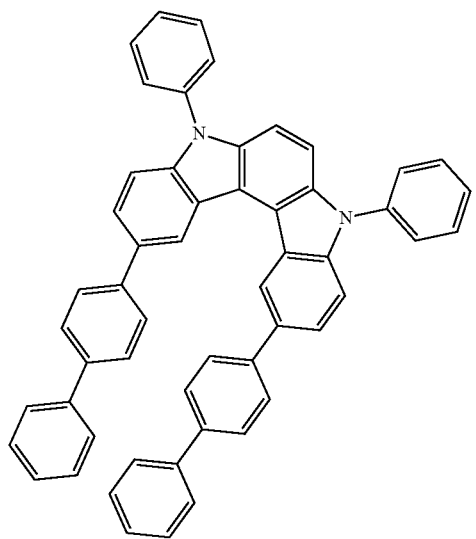
(137)
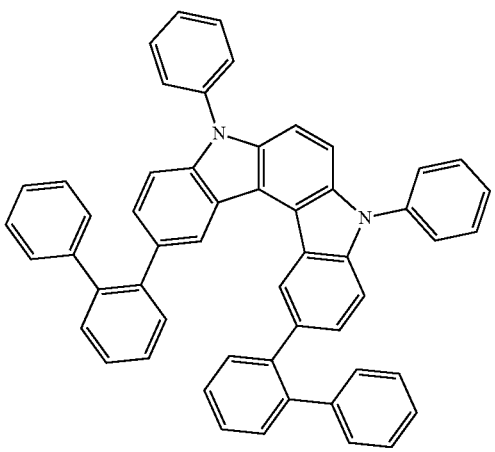
(138)
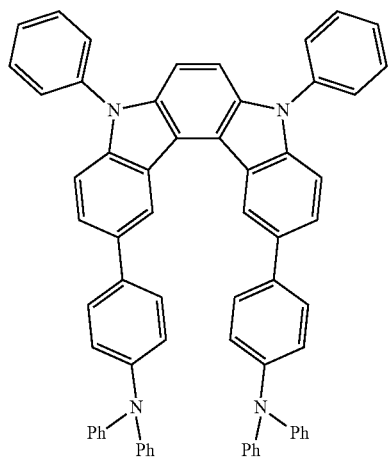
(139)
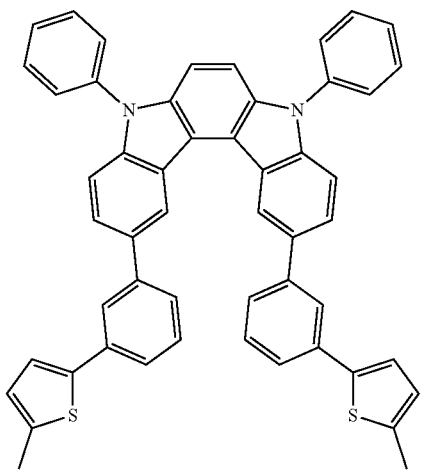
(140)
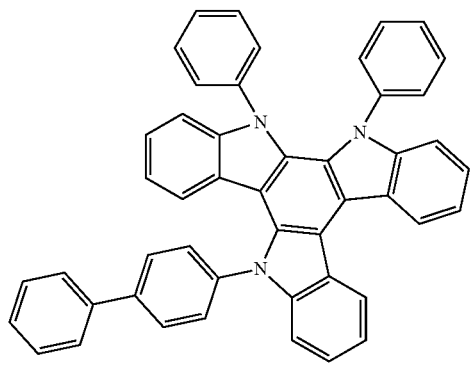
(141)
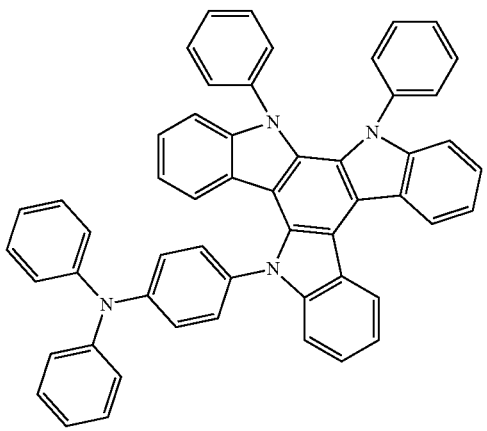

-continued
(142)
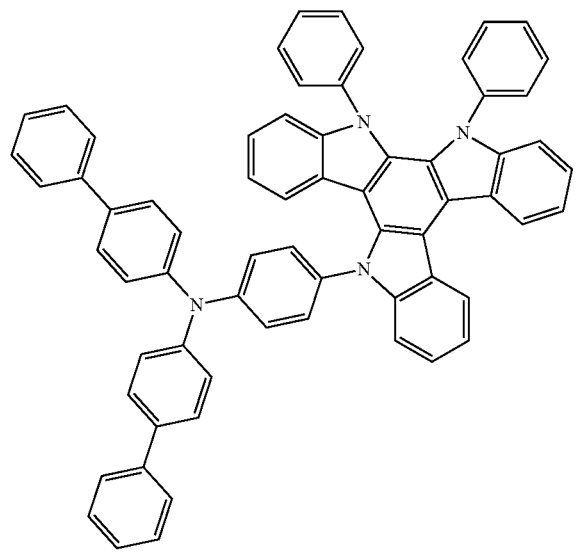
(143)
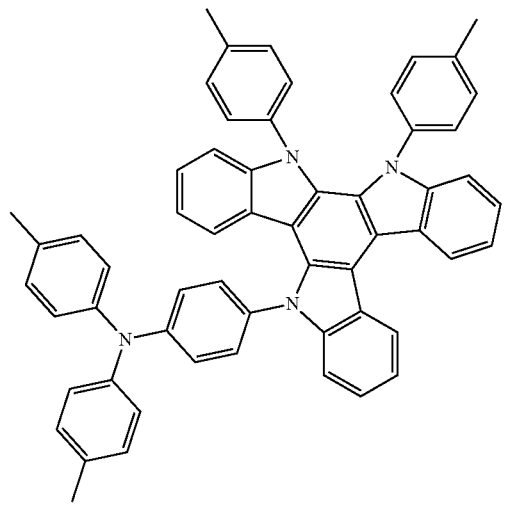
(144)
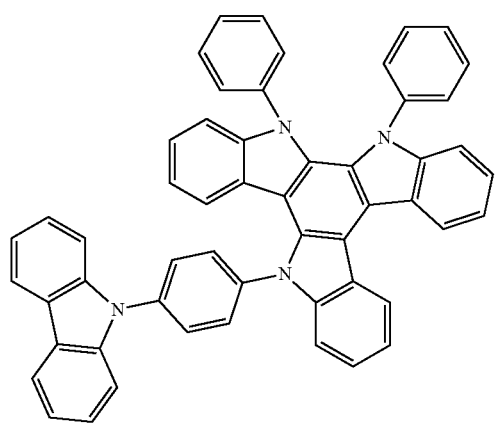
(145)
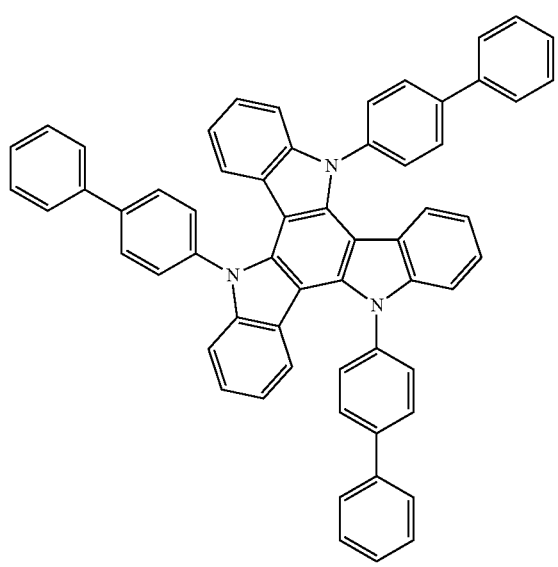

-continued
(146)
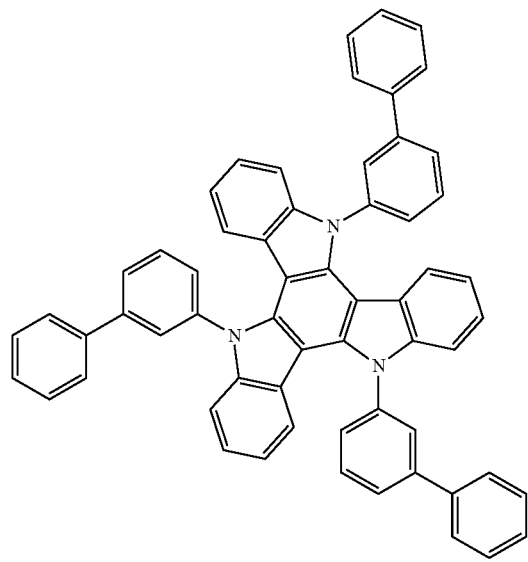
(147)
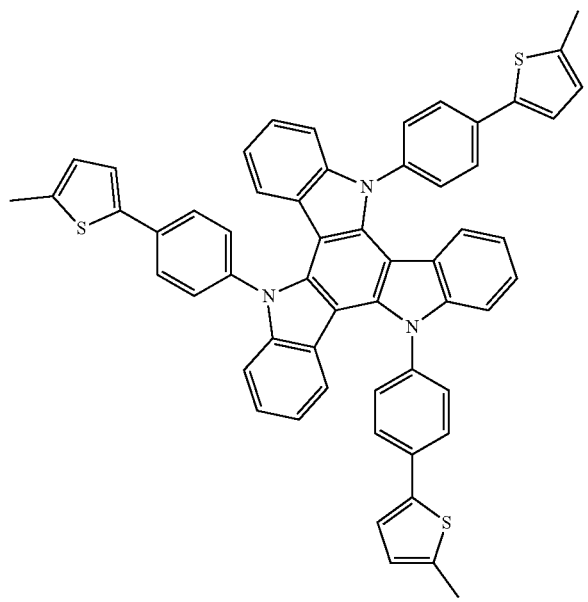
(148)
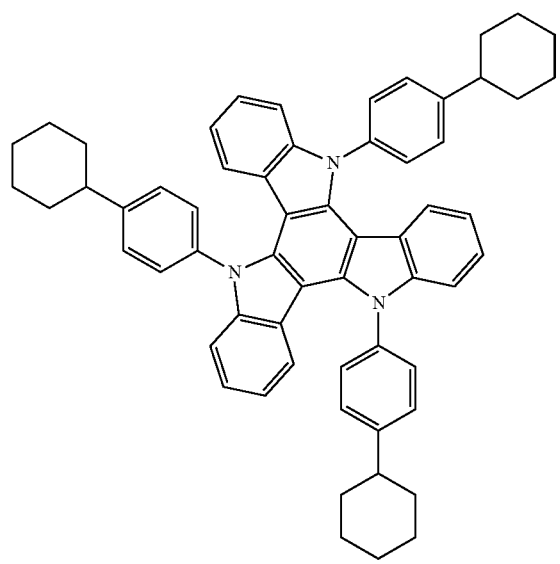
(149)
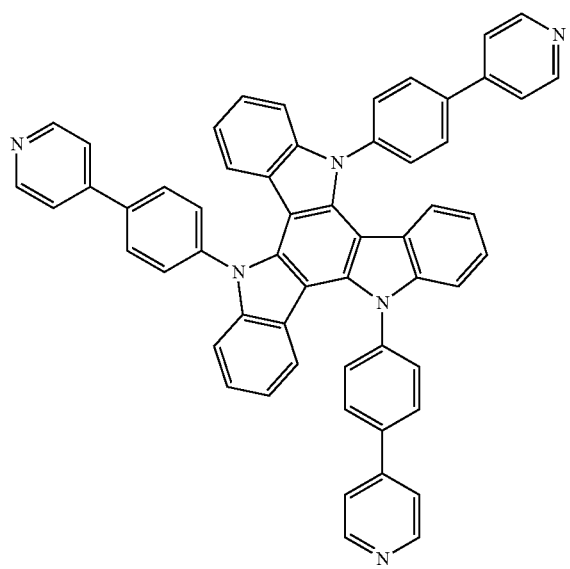

(150)

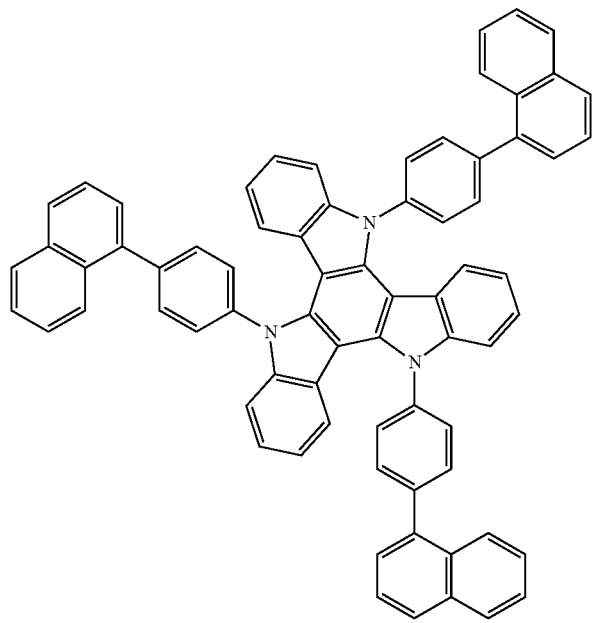

The imaging devices may have a highest occupied molecular orbital level or work function of a p-type semiconductor contained in the photoelectric conversion layer be from about −5.6 eV to about −5.7 eV.

The imaging devices may have a difference between a highest occupied molecular orbital level of the first organic semiconductor material and a highest occupied molecular orbital level or work function of a p-type semiconductor contained in the photoelectric conversion layer be in the range of ±0.2 eV, or a difference between a highest occupied molecular orbital level of the first organic semiconductor material and the highest occupied molecular orbital level or the work function of the p-type semiconductor be in the range of ±0.2 eV.

The imaging devices may have an indolocarbazole skeleton of the indolocarbazole derivative with intramolecular symmetry and a 5-membered pyrrole ring; a mother skeleton of the indolocarbazole derivative having a large size and no molecular rotation when heat, light and voltage are applied to the mother skeleton; a mother skeleton of the indolocarbazole derivative having no molecular rotation when heat, light and voltage are applied simultaneously to the mother skeleton; the first organic semiconductor material being an electron blocking layer; the upper electrode including indium-zinc oxide; and/or the lower electrode including indium-tin oxide.

The imaging devices may have the photoelectric conversion layer including at least two materials selected from the group consisting of a naphthalene derivative, an anthracene derivative, a phenanthrene derivative, a pyrene derivative, a perylene derivative, a tetracene derivative, a pentacene derivative, a quinacridone derivative, a picene derivative, a chrysene derivative, a fluoranthene derivative, a phthalocyanine derivative, a subphthalocyanine derivative, a metal complex having a heterocyclic compound as a ligand, a thienoacene material typified by a benzothienothiophene (BTBT) derivative, a dinaphthothienothiophene (DNTT) derivative, a dianthracenothienothiophene (DATT) derivative, a benzobisbenzothiophene (BBBT) derivative, a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, and a compound represented by the following formula (11)

[Chem. 1]

(11)

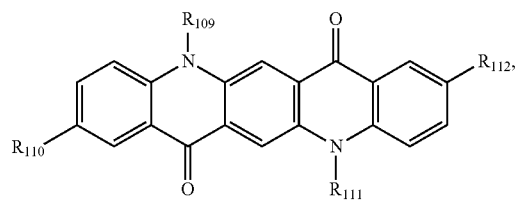

where, $R_{109}$ to $R_{112}$ each may independently represent a hydrogen group, an alkyl group, an aryl group, an arylamino group, or a carbazolyl group, organic semiconductors having HOMO levels and LUMO levels higher than those of p-type organic semiconductors, transparent inorganic metal oxides, a heterocyclic compound containing a nitrogen atom and an oxygen atom and a sulfur atom, organic molecules, organometallic complexes and subphthalocyanine derivatives having pyridine, pyrazine, pyrimidine, triazine, quinoline, quinoxaline, isoquinoline, acridine, phenazine, phenanthroline, tetrazole, pyrazole, imidazole, thiazole, oxazole, benzimidazole, benzotriazole, benzoxazole, carbazole, benzofuran, dibenzofuran, fullerenes, and fullerene derivatives.

The imaging devices may further include a second organic semiconductor material disposed between the photoelectric conversion layer and the upper electrode, where the second organic semiconductor material includes at least one of pyridine, quinoline, acridine, indole, imidazole, benzimidazole, phenanthroline, and fullerenes and derivatives thereof having absorption in the visible light region from 400 nm to 700 nm and typified by C60 and C70.

The imaging devices may have the indolocarbazole derivative including at least two indole rings in one molecule.

The imaging devices may further include a second organic semiconductor material disposed between the photoelectric conversion layer and the upper electrode, where the upper electrode includes indium-zinc oxide, where the lower electrode includes indium-tin oxide, where the photoelectric conversion layer includes 2 Ph-benzothienothiophene, subphthalocyanine, and C60, and where the second organic semiconductor material includes at least one of pyridine, quinoline, acridine, indole, imidazole, benzimidazole, phenanthroline, and fullerenes and derivatives thereof having absorption in the visible light region from 400 nm to 700 nm and typified by C60 and C70.

Advantageous Effects of Invention

According to the embodiments of the present technology, image quality and reliability can be improved. Further, the advantageous effects described above are not restrictive at all and any described in the present technology may be achieved.

BRIEF DESCRIPTION OF DRAWINGS

FIG. 1 is a view showing an illustrative configuration of an imaging element of a first embodiment to which the present technology is applied.

FIG. 2A is a cross-sectional view showing an illustrative configuration of an imaging element of the first embodiment to which the present technology is applied.

FIG. 2B is a cross-sectional view showing an illustrative configuration of an imaging element of the first embodiment to which the present technology is applied.

FIG. 3 is a cross-sectional view of an illustrative portion of an imaging element for evaluation used in examples.

FIG. 4 is an illustrative light absorption rate in a thickness (10 nm) of the first buffer layer formed of an indolocarbazole derivative.

FIG. 5 is an illustrative view showing usage examples of an imaging apparatus to which an embodiment of the present technology is applied.

DESCRIPTION OF EMBODIMENTS

Figure 6:
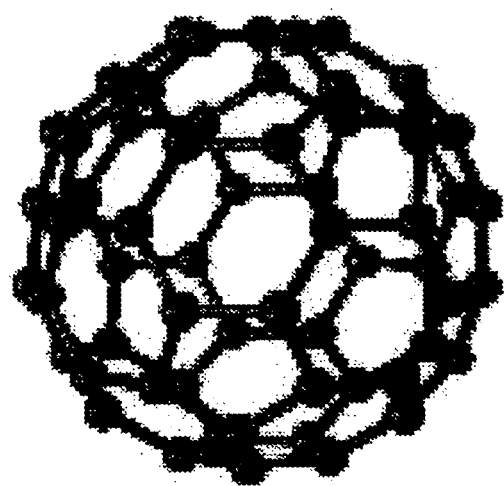
FIG. 6 is an illustrative drawing showing the structure of C60.

Hereinafter, embodiments for carrying out the present technology will be described. It should be noted that the embodiments described below are merely examples of representative embodiments of the present technology and should not be interpreted as narrowing the scope of the present technology.

Further, the description will be given in the following order.
1. Overview of imaging element
2. First embodiment (imaging element)
3. Second embodiment (stacked-type imaging element)
4. Third embodiment (imaging apparatus)
5. Fourth embodiment (electronic apparatus)
6. Usage examples of imaging apparatus to which present technology is applied 1. Overview of Imaging Element First, a summary of an imaging element according to an embodiment of the present technology will be described.

Photoelectric conversion by an organic semiconductor material in place of photoelectric conversion by an inorganic semiconductor material is one example of next generation technology. Such an imaging element may be referred to as an "organic imaging element." Further, an imaging element having spectral sensitivity corresponding to red, green and blue by stacking a plurality of organic semiconductor layers (referred to as a "stacked-type imaging element") is being developed and attracting attention. Since a color separation optical system is not necessary for such a stacked-type imaging element and three types of electrical signals (image signals) corresponding to red, green, and blue can be extracted from one pixel, a light utilization rate can be improved, openings expanded, and thus false signals reduced. It is said that, in the case of the imaging element having a general color filter, about 40% of incident light is lost in the transmission absorption of the color filter.

Imaging elements using silicon (Si) as a photoelectric conversion material have recently become mainstream. Further, there has been miniaturization of pixels for improvement of recording density, and the pixel size has almost reached 1 μm. The optical absorption coefficient of Si is about $10^3$ to $10^4$ cm$^{-1}$ in the visible light region, and the photoelectric conversion layer in the imaging element is generally positioned at a depth of 3 μm or more in the silicon semiconductor substrate. Here, as the pixel size is miniaturized, the aspect ratio of the pixel size to the depth of the photoelectric conversion layer increases. As a result, light leakage from adjacent pixels occurs, and an incident angle of light is restricted, thereby leading to performance degradation of the imaging element. To improve such a problem, an organic material with a high absorption coefficient has attracted attention. In the organic imaging element or stacked-type imaging element, the absorption coefficient of the organic material in the visible light region can be about $10^5$ cm$^{-1}$ or more, the thickness of the photoelectric conversion layer can be reduced, false color can be suppressed, sensitivity can be improved, and the number of pixels can be increased.

While there are various problems in using organic imaging elements, at least all of the initial characteristics of the photoelectric conversion efficiency, dark current, an SN ratio (which is the ratio of light current to dark current), afterimage characteristics, and heat resistance in the manufacturing process may be necessary to meet the standards required for commercialization. Various efforts have been made to solve the problems of these initial characteristics. For example, there is a technology in which dark current is not increased even if a voltage is applied from the outside to improve photoelectric conversion efficiency and responsiveness (afterimage characteristic), that is, the SN ratio (which is the ratio of light current to dark current) and the response characteristic can both be achieved by satisfying conditions that the electron affinity of the buffer layer on the anode side be lower than the work function of the adjacent electrode by 1.3 eV or more and the work function of the electron blocking layer (the first buffer layer of an embodiment of the present technology) be equal to or lower than the work function of the adjacent photoelectric conversion layer. Furthermore, there is a technology that can improve resistance to heating processes (such as the process of forming the imaging element, particularly the installation of the color filter, the installation of the protective film, the soldering of the element, and the like), and preservability by using an organic photoelectric conversion film which contains a p-type organic photoelectric conversion material having a glass transition temperature of 100° C. or more and forming an amorphous film, and using a material having a glass transition temperature of 140° C. or more for a buffer layer.

The above two technologies seem reasonable in consideration of the characteristics of organic compounds and organic semiconductor physics, but as will be shown in examples later, actual investigations have found that they may not be so. Further, considering use as products, it may be necessary to secure reliability against loads such as continuous application of voltage, heat generation in the product housing, and external light during photographing, among others. Organic imaging elements that satisfy both the initial characteristics and reliability are still under development and finding materials and new technologies that can achieve both characteristics has been problematic.

The inventors of the present technology have performed earnest development and found that using an indolocarbazole derivative in the first buffer layer of an organic imaging element leads not only to excellent initial characteristics, such as SN ratio and afterimage characteristics, but is also capable of suppressing deterioration of electric characteristics even in a reliability test in which three loads of light, voltage and heat are applied simultaneously and continuously.

Attempts have been made to apply an indolocarbazole derivative as a hole transport material for an organic electroluminescent device. Although there is a technology relating to resistance against application of a voltage of less than 20 Vm and driving stability at 45° C. or more in the application of six types of indolocarbazole isomers to an organic electroluminescent device, it is not a technology for application to an imaging element. Furthermore, in this technology, the number of benzene rings disposed in the central portion of the indolocarbazole skeleton is defined as 1 to 3, and the absorption characteristics in the visible light region may be necessary for an organic imaging element and a stacked-type imaging element (in other words, the transparency of the first buffer layer which absorbs light having a wavelength of 400 nm to 700 nm as little as possible), is not taken into consideration. Also, spectral characteristics in the case of use as a hole transporting layer are not considered.

The present technology has been made in view of the above-mentioned situation and enables image quality and reliability to be further improved, and in particular, improves both image quality and reliability by using an imaging element in which at least a first electrode, a first buffer layer, at least a photoelectric conversion layer containing a p-type semiconductor, and a second electrode are stacked sequentially, and the first buffer layer contains an indolocarbazole derivative.

2. First Embodiment (Imaging Element)

An imaging element according to a first embodiment of the present technology is an imaging element in which at least a first electrode, a first buffer layer, at least a photoelectric conversion layer containing a p-type semiconductor, and a second electrode are stacked sequentially, and the first buffer layer contains an indolocarbazole derivative.

The imaging element according to the first embodiment of the present technology, not only has excellent image characteristics (particularly initial characteristics of the SN ratio and the afterimage characteristics), but also has improved reliability that enables suppression of the deterioration of the electric characteristics even in the reliability test in which the three loads of "light, voltage and heat" are simultaneously and continuously applied by using an indolocarbazole derivative in the first buffer layer included in the imaging element.

FIG. 1 shows an imaging element 1-1 according to the first embodiment of the present technology. In the imaging element 1-1 shown in FIG. 1, light is radiated, a photoelectric conversion layer 23 is photoexcited, and carriers including holes and electrons are separated. Further, the first electrode from which holes are extracted is defined as an anode 21, and the second electrode from which electrons are extracted is defined as a cathode 25. The imaging element 1-1 may include a second buffer layer 24, and includes the first electrode (anode) 21, a first buffer layer 22, a photoelectric conversion layer 23 including at least a p-type semiconductor, a second buffer layer 24 and the second electrode (cathode) 25 that are sequentially stacked.

FIG. 2A and FIG. 2B each show an imaging elements 1-2 and 1-3 according to the first embodiment of the present technology (reference number 1-2 denotes an imaging element in FIG. 2A, and reference number 1-3 denotes an imaging element in FIG. 2B). In the imaging element 1-2 shown in FIG. 2A, a second buffer layer 24 may be included, and a first electrode (anode) 21, a first buffer layer 22, a photoelectric conversion layer 23 including at least a p-type semiconductor, a second buffer layer 24, and a second electrode (cathode) 25 are sequentially stacked on the substrate 20. In the imaging element 1-2, light enters from the second electrode (cathode) 25. In the imaging element 1-3 shown in FIG. 2B, the second buffer layer 24 may be included, and the second electrode (cathode) 25, the second buffer layer 24, the photoelectric conversion layer 23 including at least a p-type semiconductor, the first buffer layer 22, and the first electrode (anode) 21 are sequentially stacked on the substrate 20. In the imaging element 1-3, light enters from the first electrode (anode) 21.

(First Buffer Layer)

The first buffer layer 22 contains an indolocarbazole derivative. The first buffer layer 22 may be formed of an indolocarbazole derivative or may be formed of an indolocarbazole derivative and at least one material other than an indolocarbazole derivative. The film thickness of the first buffer layer 22 may be any thickness. In various embodiments, the film thickness of the first buffer layer 22 may be from about 5 nm or more and about 50 nm or less, and it may be about 5 nm or more and about 25 nm or less.

The first buffer layer 22 may have transparency, that is, it may have no absorption in the visible light region. When the first buffer layer 22 has transparency, there is an effect that the light absorption by the photoelectric conversion layer 23 is not inhibited. Accordingly, the absorption spectrum of the first buffer layer 22 may have an absorption maximum at a wavelength of 425 nm or less. In additional embodiments, the absorption spectrum of the first buffer layer 22 may have an absorption maximum at a wavelength of 400 nm or less.

(Indolocarbazole Derivative)

The indolocarbazole derivative may contain at least two indole rings in one molecule. In various embodiments, the indolocarbazole derivative may be a compound represented by the following general formulas (1) to (10).

When the highest occupied molecular orbital (HOMO) level of the indolocarbazole derivative is close to the HOMO level or work function of the p-type semiconductor contained in the photoelectric conversion layer 23, it is possible to achieve the improved image characteristics of both the SN ratio and the afterimage characteristics. Considering the HOMO level of the indolocarbazole derivative, when the HOMO or work function of the p-type semiconductor contained in the photoelectric conversion layer 23 is, for example, −5.6 eV to −5.7 eV, the photoelectric conversion rate is further improved. A compound such as a quinacridone derivative represented by the general formula (11), and a thienoacene material typified by a benzothienothiophene (BTBT) derivative, a dinaphthothienothiophene (DNTT) derivative, a dianthracenothienothiophene (DATT) derivative, a benzobisbenzothiophene (BBBT) derivative, a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative and the like may be used.

The difference between the HOMO level of the first buffer layer containing the indolocarbazole derivative and the HOMO level or work function of the p-type semiconductor may be in the range of ±0.2 eV. According to such illustrative embodiments, the initial characteristics of the SN ratio and the afterimage characteristics are further improved, and deterioration of electric characteristics can be further suppressed in the reliability test in which three loads of "light, voltage, heat" are continuously and simultaneously applied.

Furthermore, as a spectral characteristic, an indolocarbazole skeleton has intramolecular symmetry, and moreover, due to inclusion of a 5-membered pyrrole ring, the molecular conjugation length is suppressed with respect to the molecular size, as compared to the condensed ring of only the benzene ring, and lengthening of the absorption wavelength is suppressed. Consequently, absorption in the visible region is suppressed, and light absorption by the photoelectric conversion layer is not inhibited. When an indolocarbazole derivative is used in the first buffer layer 22, transparency of the first buffer layer 22 can be secured.

Furthermore, the indolocarbazole derivative has a large size of the mother skeleton in the whole molecule, has no molecular rotation of the mother skeleton itself due to heat, light and voltage, and has no change in the molecular structure of the mother skeleton, and thus the thin film form of the first buffer layer can be maintained even when three loads of heat, light and voltage are applied. Accordingly, when an indolocarbazole derivative is used in an imaging element, degradation of an imaging element is small even if three loads of voltage, temperature, and light are simultaneously applied, and reliability can be improved.

[Chem.2]

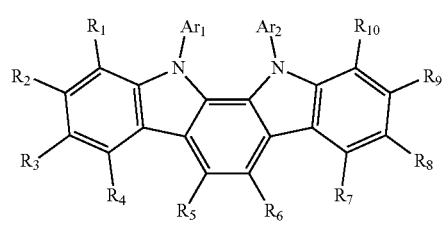

(1)

[Chem.3]

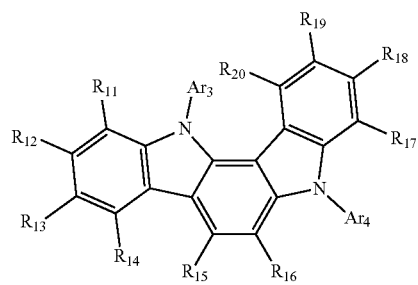

(2)

[Chem.4]

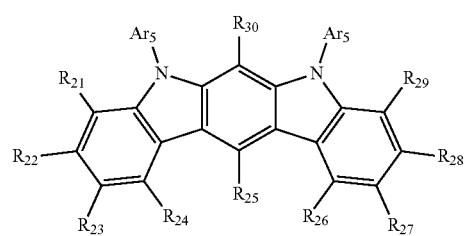

(3)

[Chem.5]

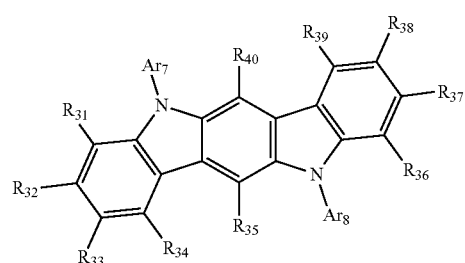

(4)

[Chem.6]

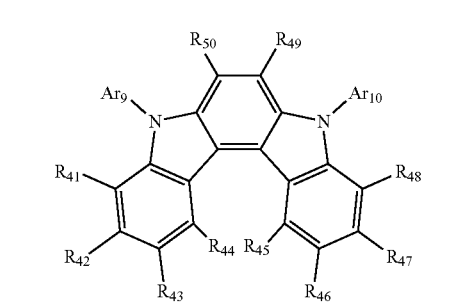

(5)

[Chem.7]

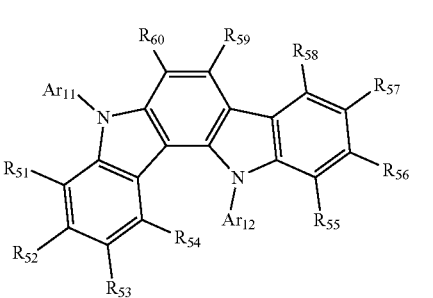

(6)

[Chem.8]

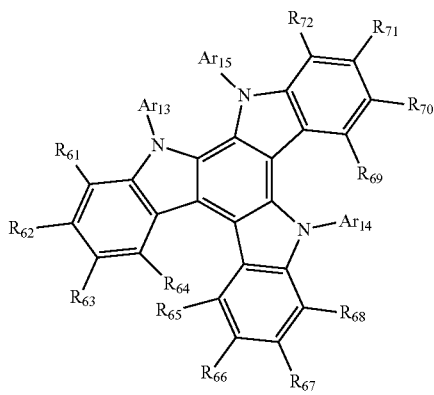

(7)

[Chem.9]

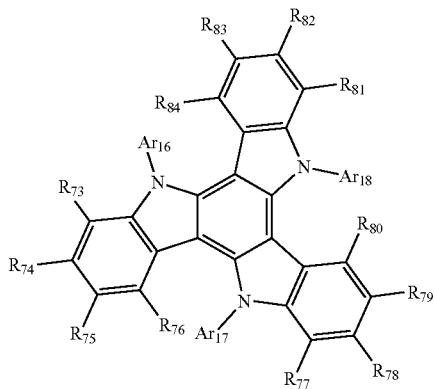

(8)

[Chem.10]

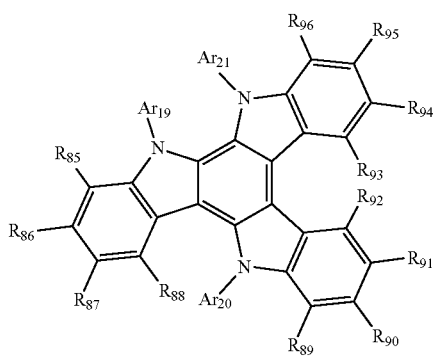

(9)

[Chem.11]

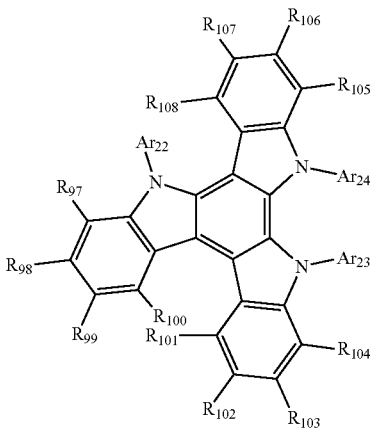

(10)

In the above general formulas (1) to (10), $Ar_1$ to $Ar_{24}$ each independently represent an aryl group, and the aryl group may or may not have a substituent. $R_1$ to $R_{108}$ each independently represent a hydrogen group, an alkyl group, an aryl group, an arylamino group, an aryl group having an arylamino group as a substituent, or a carbazolyl group, and the alkyl group, the aryl group, the arylamino group, the aryl group having an arylamino group as a substituent, and the carbazolyl group may or may not have a substituent.

Each of the aryl group and the aryl group having an arylamino group as a substituent may be a phenyl group, a biphenyl group, a naphthyl group, a naphthylphenyl group, a phenylnaphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, or a thienyl group. In various embodiments, the alkyl group may be a methyl group, an ethyl group, a propyl group, a butyl group, a pentyl group, or a hexyl group. The alkyl group may be a linear alkyl group or a branched alkyl group.

Example compounds 100 to 150 of the compounds represented by general formulas (1) to (10) are shown below. Further, the compounds represented by general formulas (1) to (10) are not limited to these example compounds.

[Chem.12]
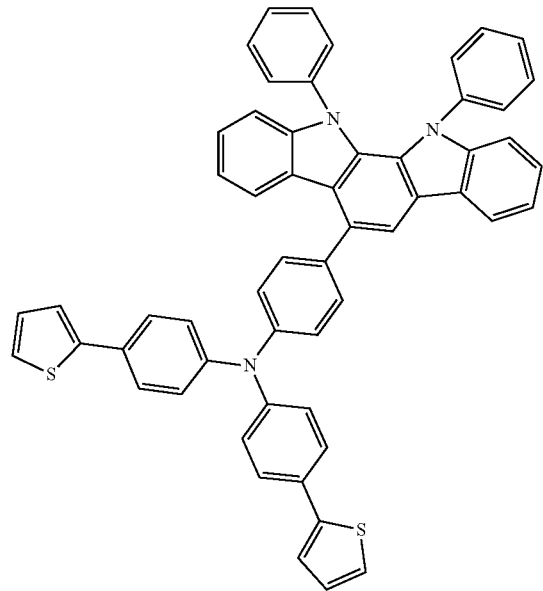
(100)
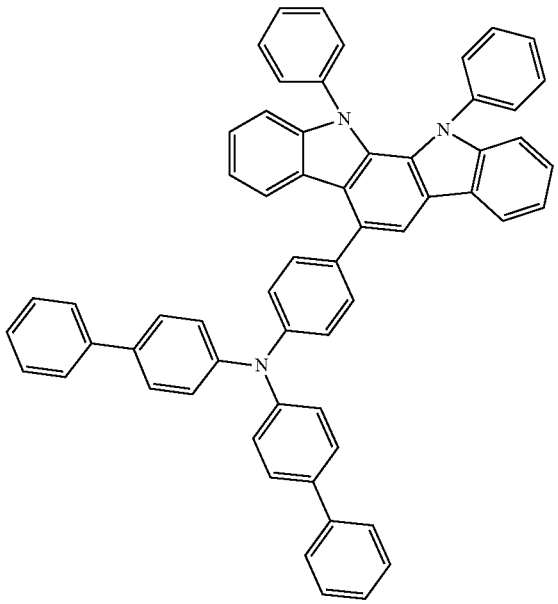
(101)
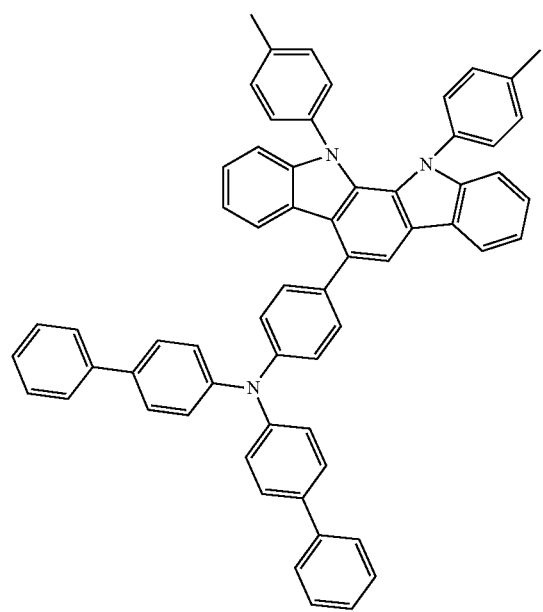
(102)
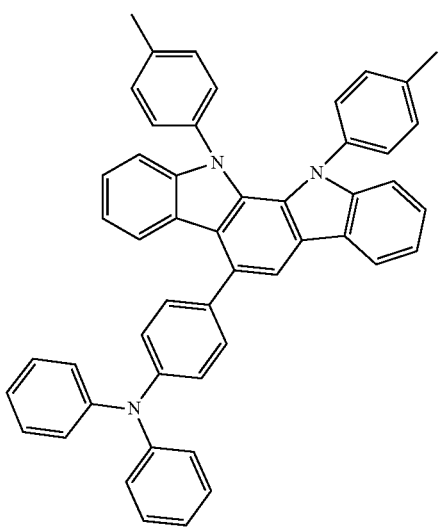
(103)

(104)
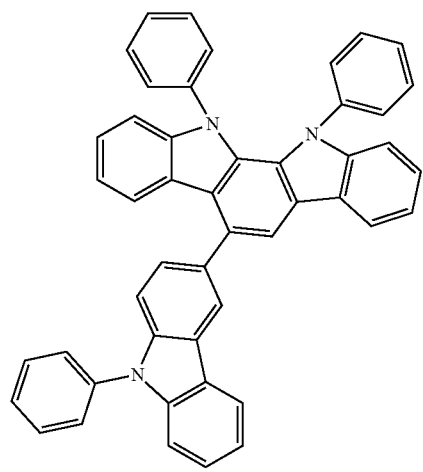
(105)
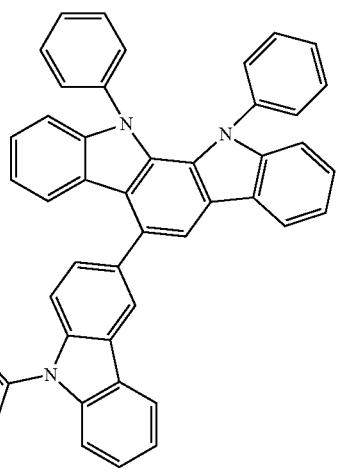
(106)
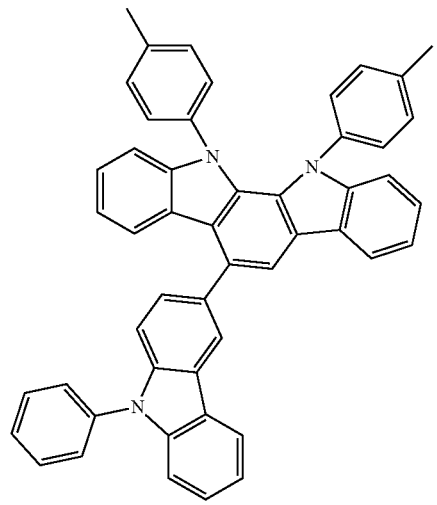
(107)
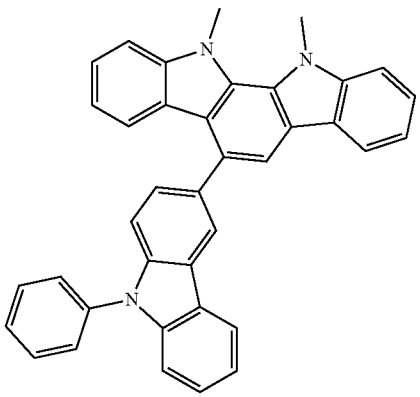
[Chem.13]
(108)
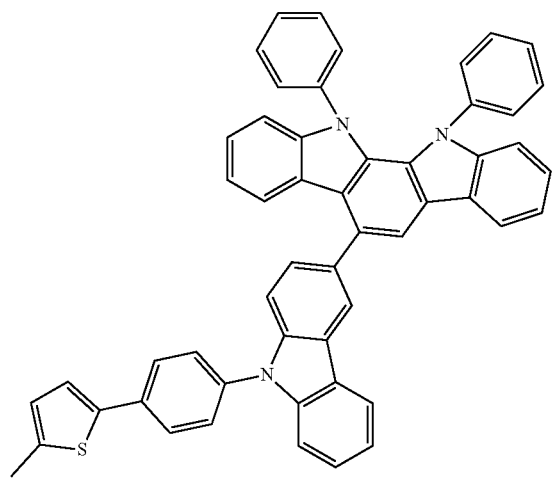
(109)
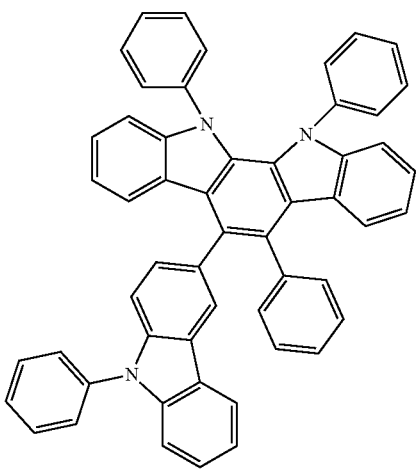

-continued
(110)
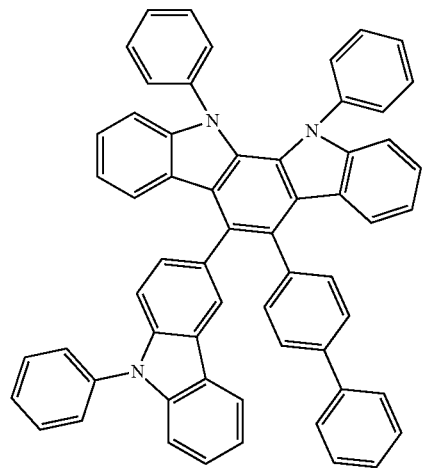
(111)
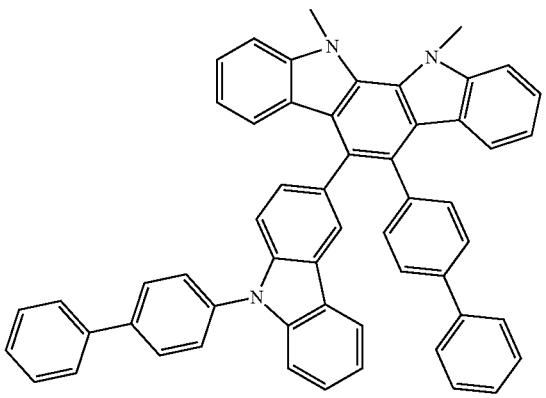
(112)
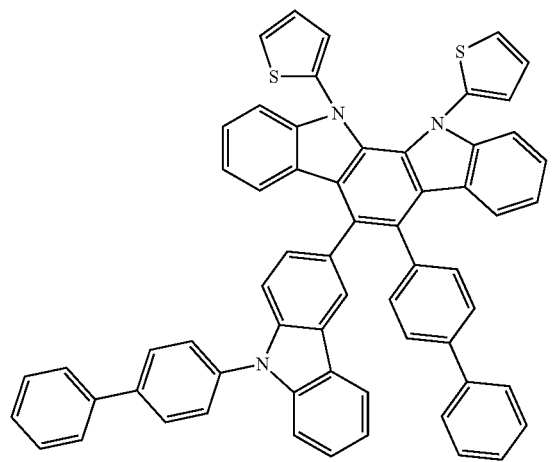
(113)
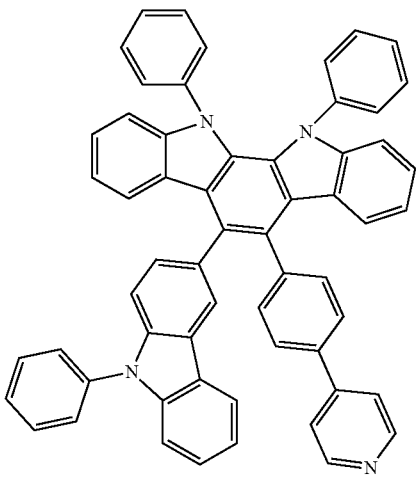
(114)
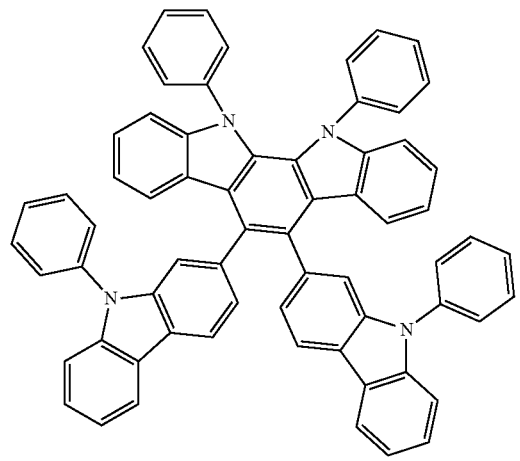
(115)
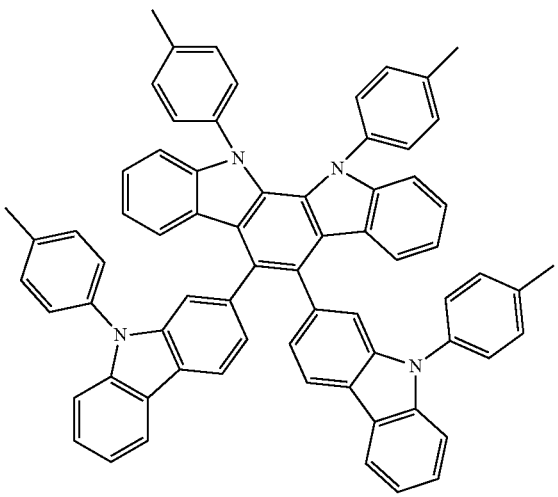

[Chem.14]
(116)
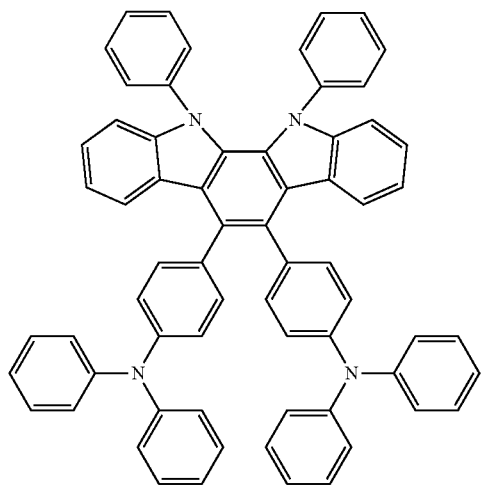
(117)
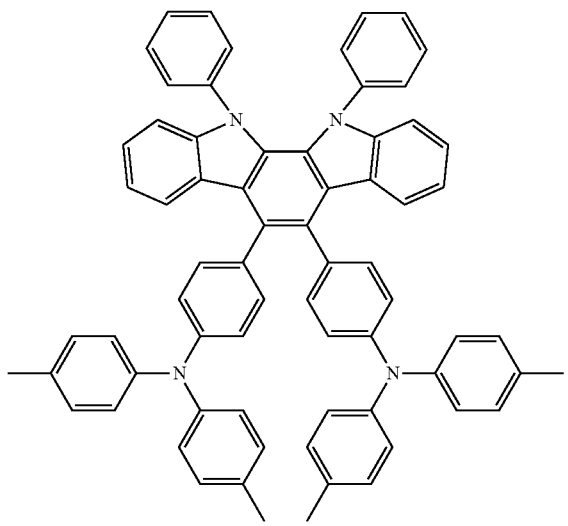
(118)
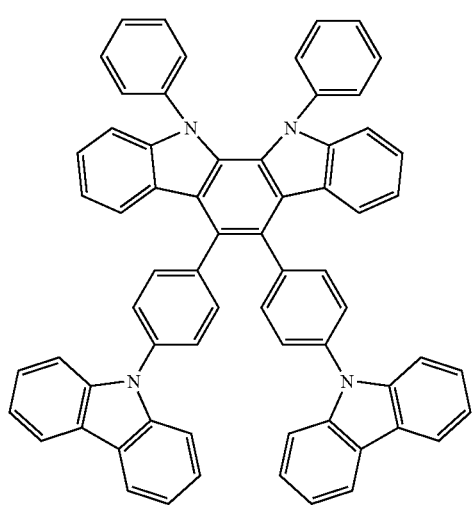
(119)
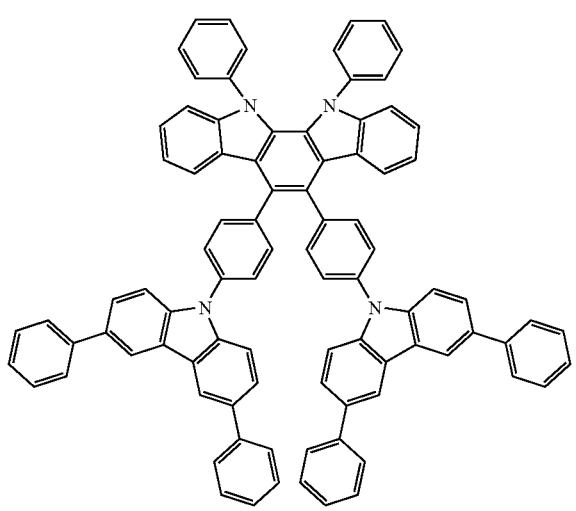
(120)
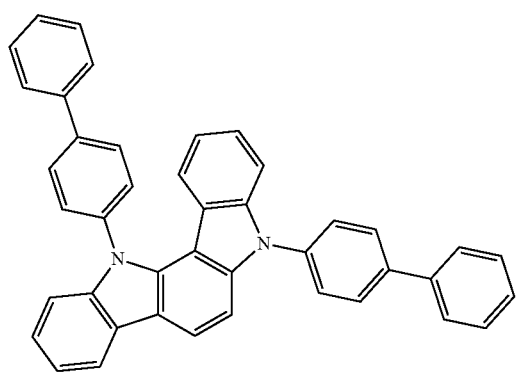
(121)
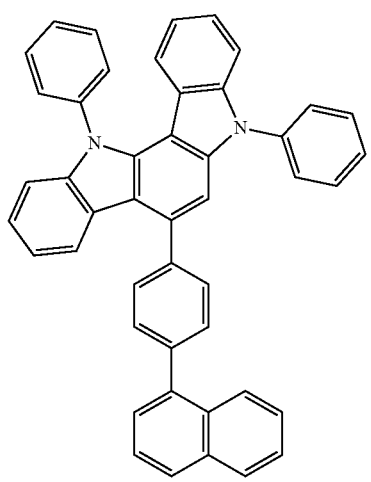

(122)
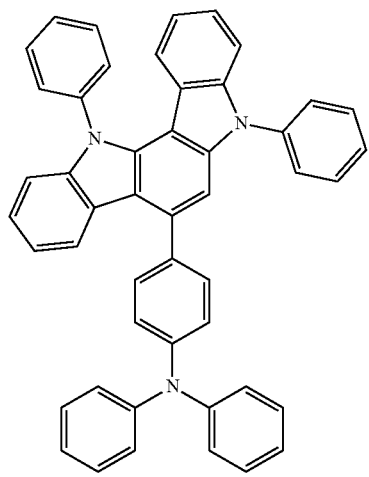
(123)
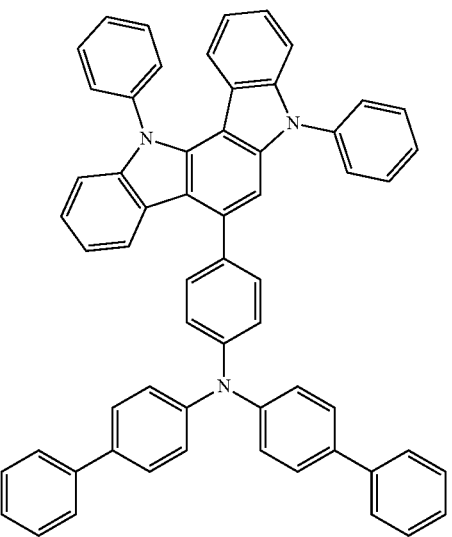
[Chem.15]
(124)
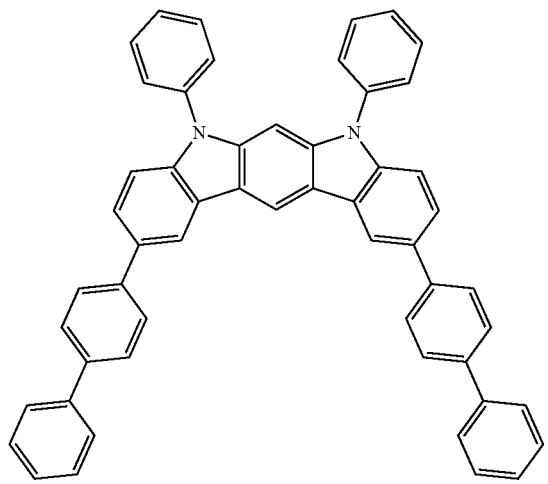
(125)
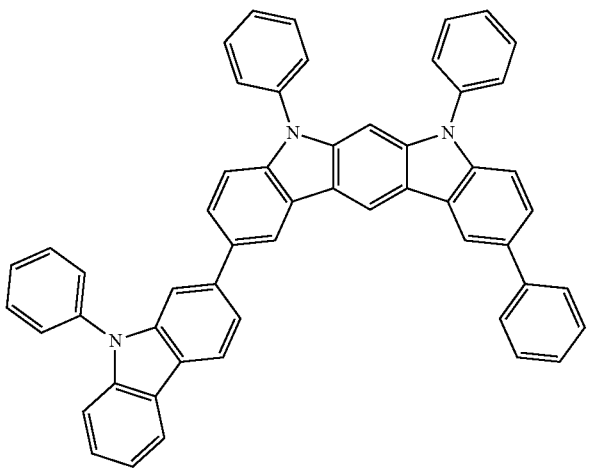
(126)
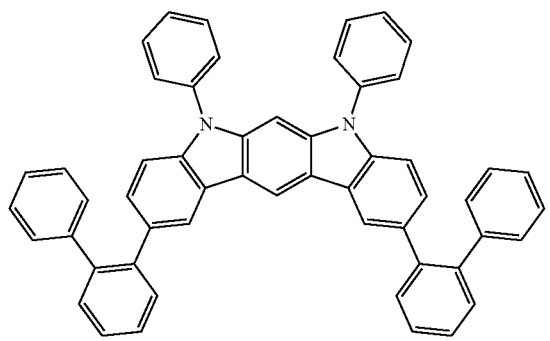
(127)
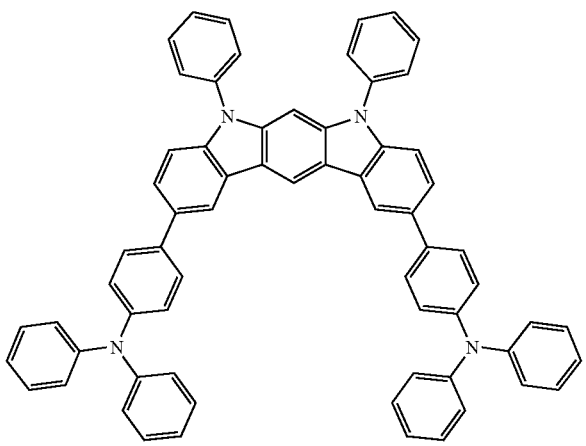

(128)
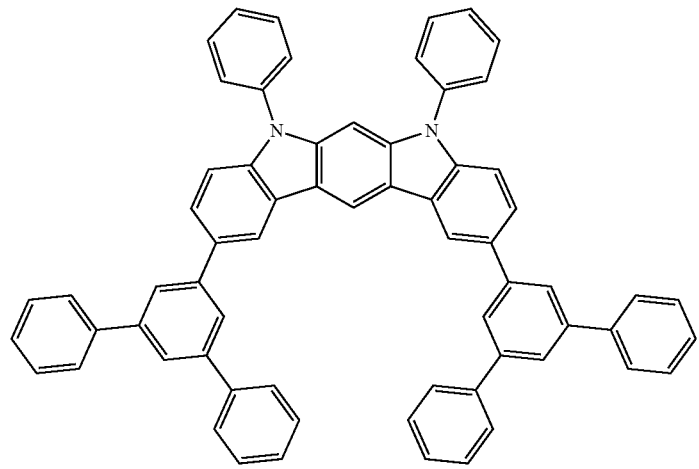
(129)
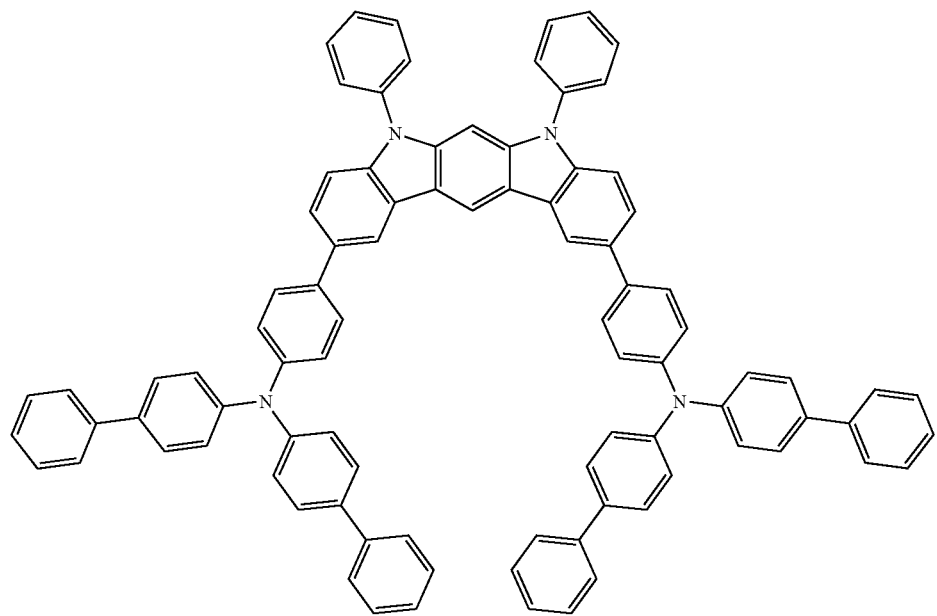

(130)
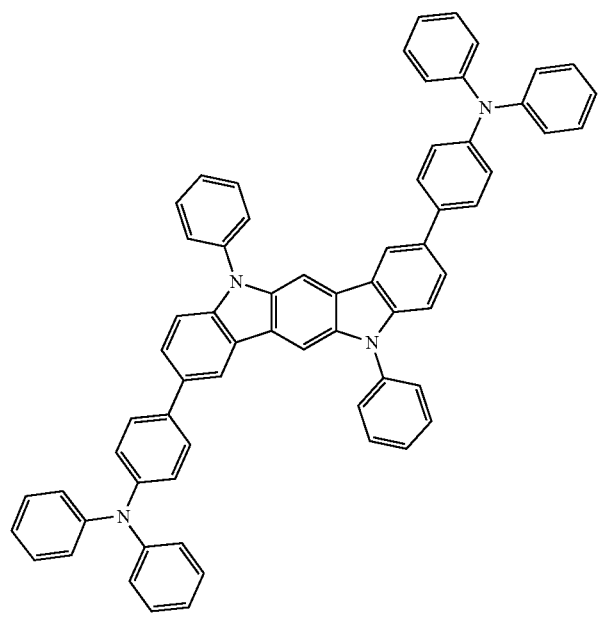
(131)
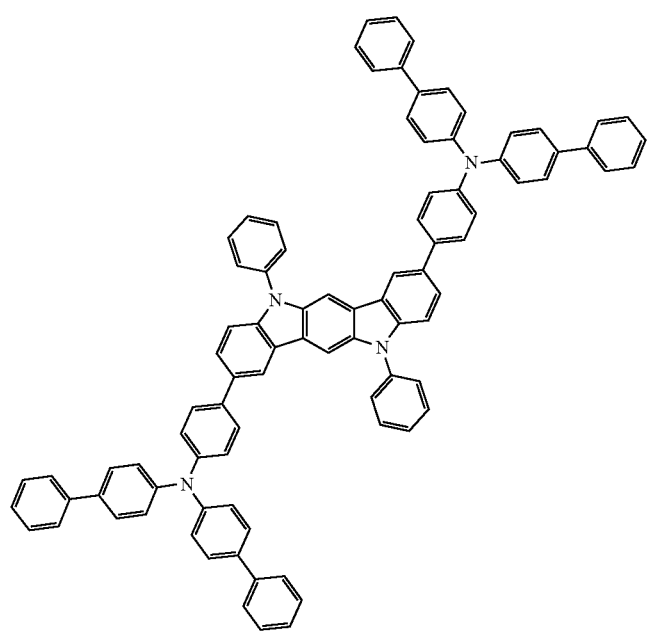

-continued
[Chem.16]
(132)
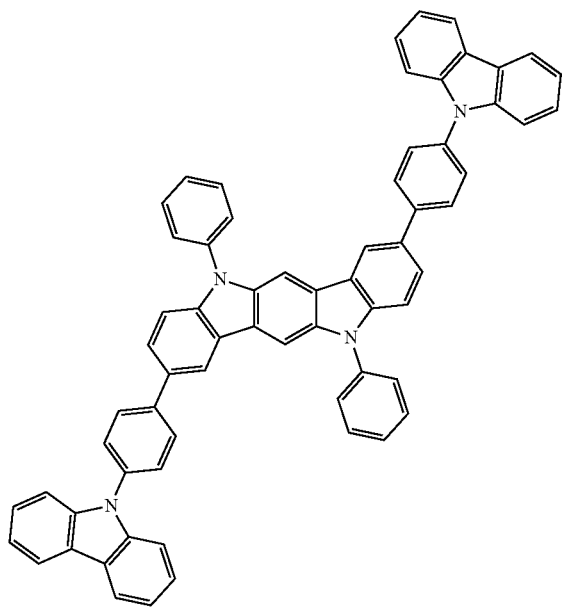
(133)
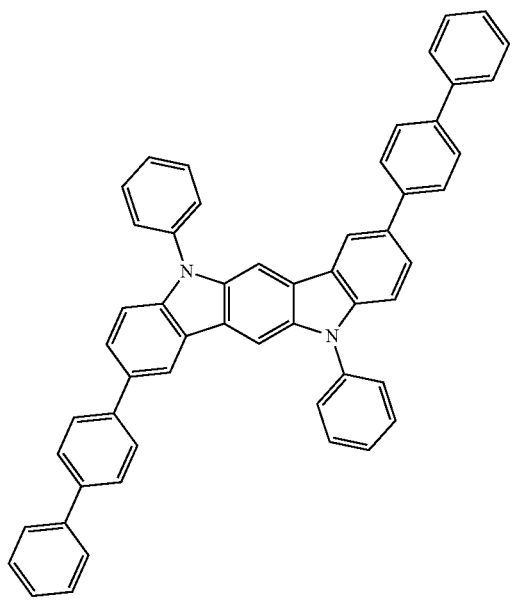
(134)
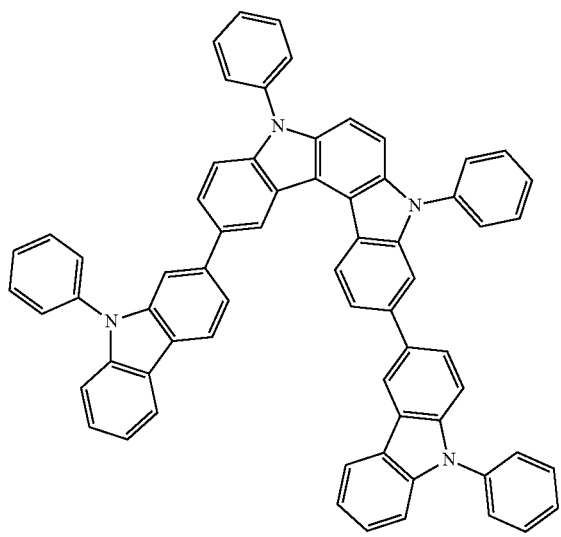
(135)
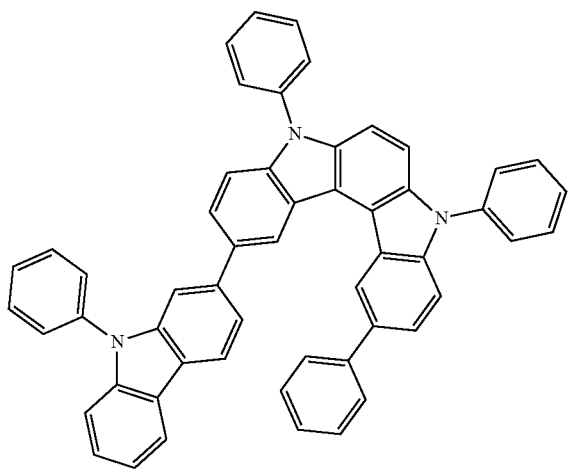

-continued
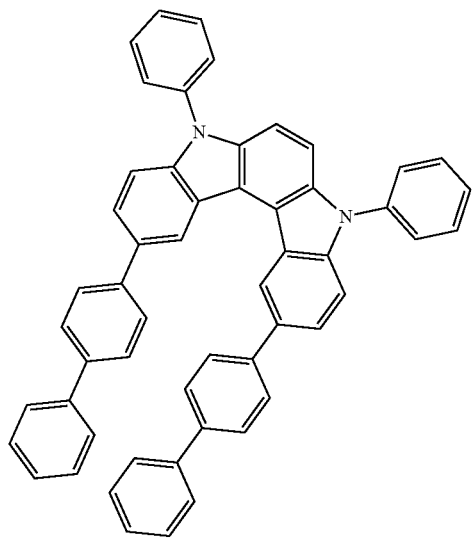
(136)
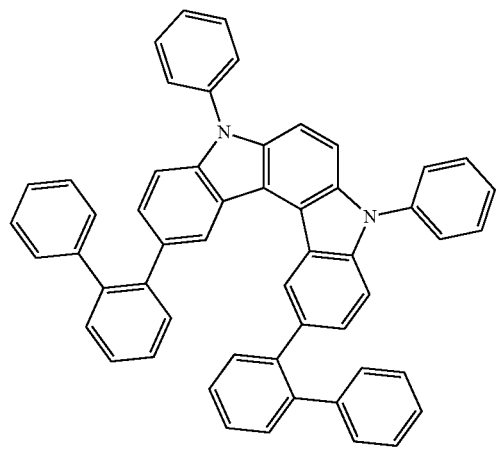
(137)
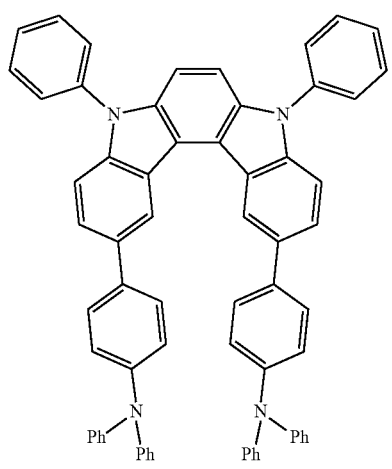
(138)
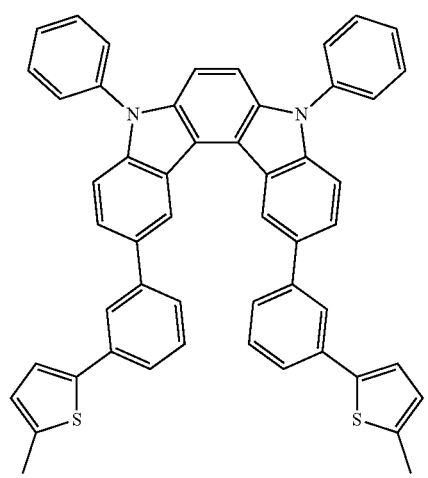
(139)
[Chem.17]
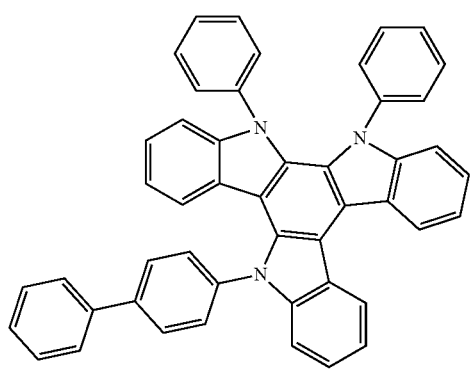
(140)
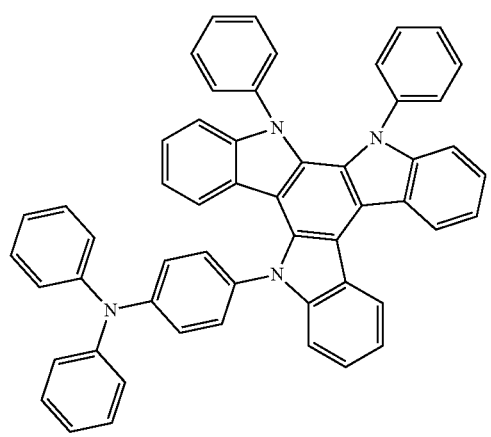
(141)

(142)
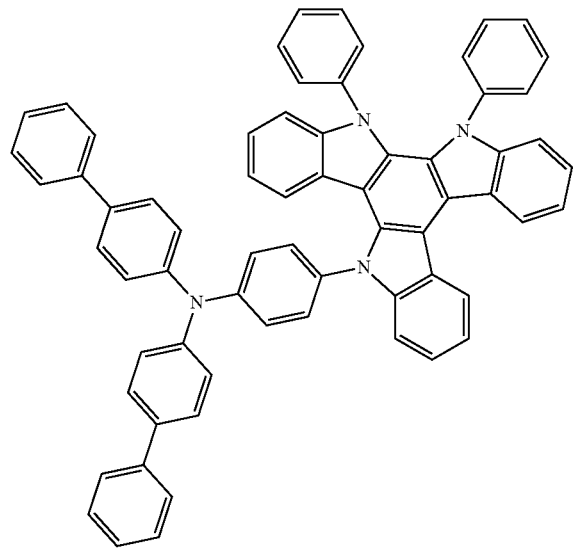
(143)
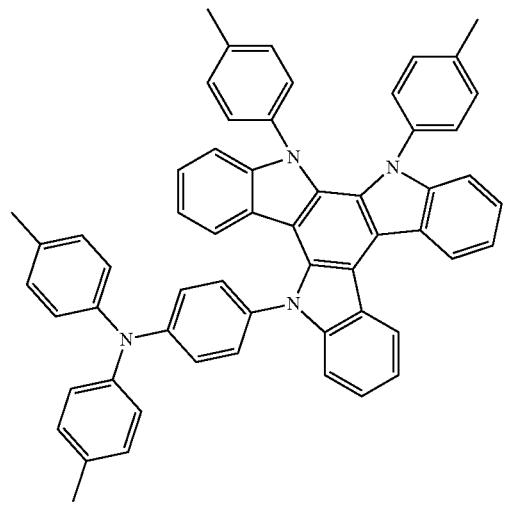
(144)
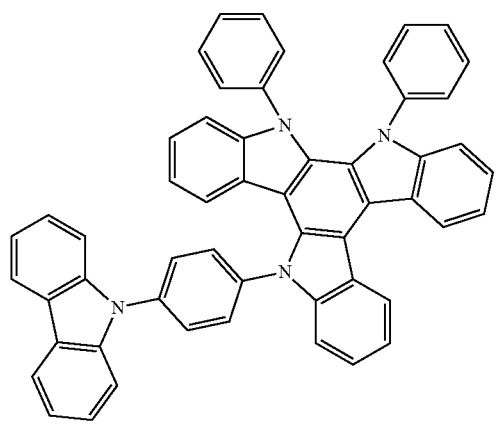
(145)
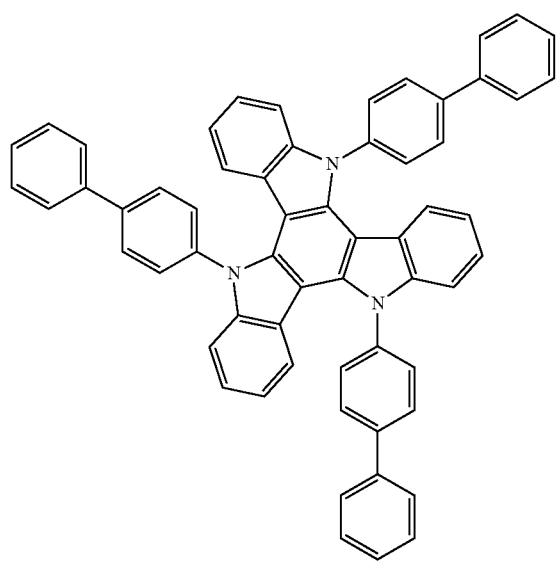

(146)
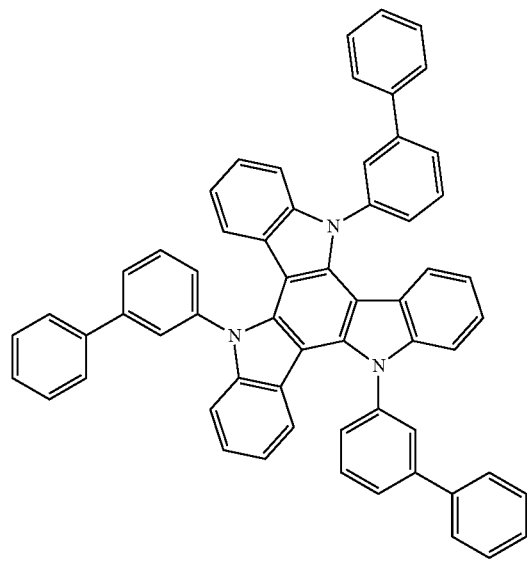
(147)
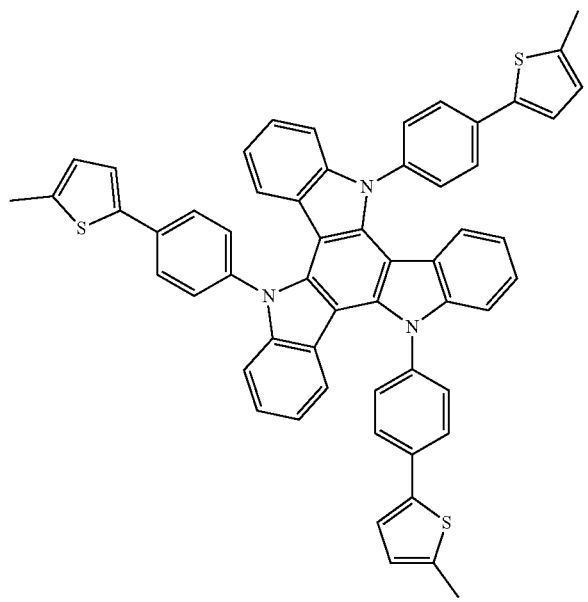
[Chem.18]
(148)
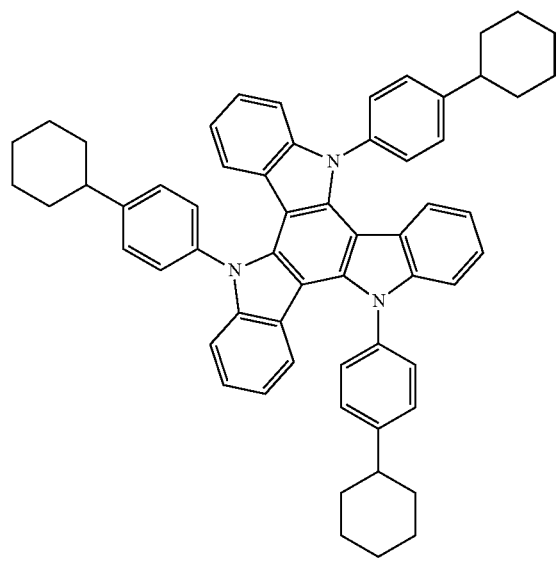
(149)
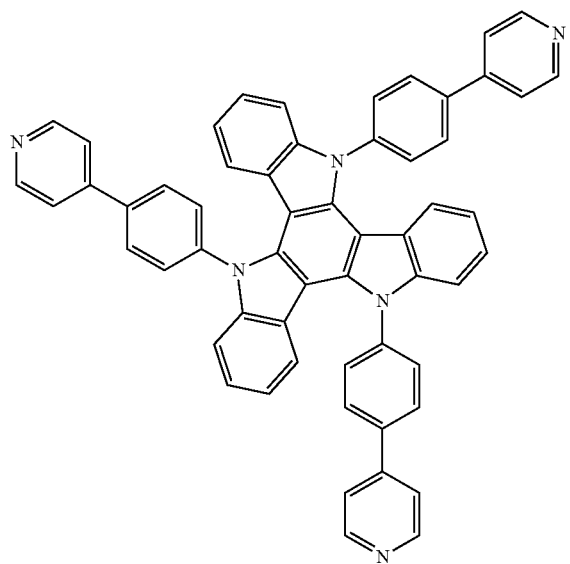

-continued (150)

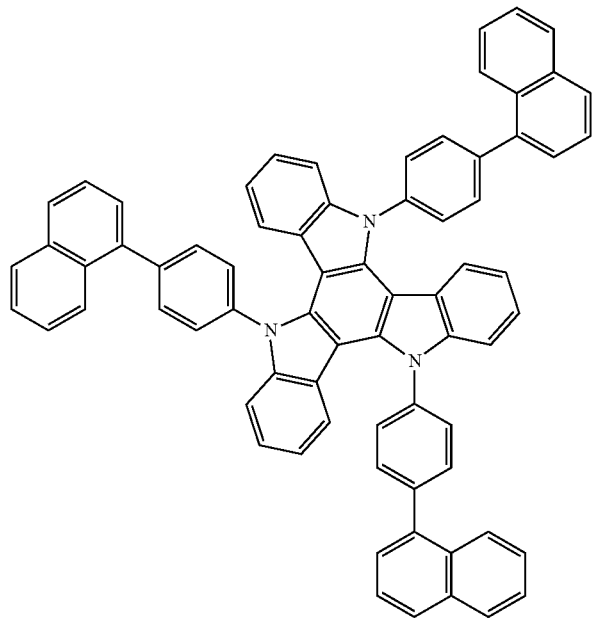

(Imaging Element)

The imaging element 1 may be an organic imaging element having a photoelectric conversion layer 23 which includes at least a p-type semiconductor and is an organic photoelectric conversion layer, or may be an inorganic imaging element in which the photoelectric conversion layer 23 is an inorganic photoelectric conversion layer.

(Organic Imaging Element)

The organic imaging element may employ vertical spectroscopy in which three layers of organic photoelectric conversion elements that absorb visible light corresponding to blue, green, and red are stacked vertically in the same pixel, or three colors of pixels may be arranged on a plane as in a Bayer array adopted in a general imaging element. When three layers of organic photoelectric conversion elements that absorb visible light corresponding to blue, green, and red are stacked in the same pixel, photoelectric conversion elements that can absorb light of 425 nm to 495 nm for blue, light of 495 nm to 500 nm for green, and light of 620 nm to 750 nm for red are used. The stacking order of the three color photoelectric conversion elements may be in the order of blue, green, and red in a light-incidence direction. This is because shorter wavelength light is more efficiently absorbed at the surface of incidence. Red has the longest wavelength among the three colors, and thus may provide additional advantageous effects by being located at the lowermost layer as viewed from a light-incidence surface. Green may be located at the middle among the two colors, but may be located at the uppermost layer with respect to the light-incidence surface. The characteristics of the present vertical spectroscopy include that, unlike Bayer array elements, spectroscopy for blue, green, and red is not performed using a color filter, and blue, green, and red pixels are not arranged on a plane, but photoelectric conversion elements of the three colors are stacked in parallel with the light-incidence direction in the same pixel, and thus sensitivity and recording density per unit volume can be improved. Furthermore, since an organic material has a high absorption coefficient, a film thickness of a photoelectric conversion layer of each color can be thinner than in a conventional Si-based photoelectric conversion layer, and light leakage from adjacent pixels and restriction on the light-incidence angle can be alleviated. Moreover, since the conventional Si-based imaging element produces color signals by performing interpolation processing among three-color pixels, false color is generated, but a stacked-type imaging element has an advantage in that false color can be suppressed. On the other hand, a color filter is generally used when three-color pixels are arranged on a plane as in a Bayer array, and thus it is considered that the specification of spectral characteristics of blue, green and red can be alleviated as compared to a photoelectric conversion layer using vertical spectroscopy, and mass productivity is also improved as compared to vertical spectroscopy.

(Inorganic Imaging Element)

The inorganic imaging element may include a Si-based photoelectric conversion layer, and for example, a backside illumination type imaging element as described in JP 2014-127545A may be used.

(Photoelectric Conversion Layer)

Hereinafter, the photoelectric conversion layer 23 will be described separately with respect to an organic photoelectric conversion layer and inorganic photoelectric conversion layer.

(Organic Photoelectric Conversion Layer)

The organic photoelectric conversion layer is formed of (1) a p-type organic semiconductor. The organic photoelectric conversion layer is formed of (2) a stacked structure of a p-type organic semiconductor layer/an n-type organic semiconductor layer. The organic photoelectric conversion layer is formed of a stacked structure of a p-type organic semiconductor layer/a mixed layer (bulk hetero structure) of a p-type organic semiconductor and an n-type organic semiconductor/an n-type organic semiconductor layer. The organic photoelectric conversion layer is formed of a stacked structure of p-type organic semiconductor layer/a mixed layer (bulk hetero structure) of a p-type organic semiconductor and an n-type organic semiconductor. The organic photoelectric conversion layer is formed of a stacked structure of an n-type organic semiconductor layer/a mixed layer (bulk hetero structure) of a p-type organic semiconductor and an n-type organic semiconductor. The organic photoelectric conversion layer is formed of (3) a mixture (bulk hetero structure) of a p-type organic semiconductor and an n-type organic semiconductor.

The organic photoelectric conversion layer may be formed by any one or more of the above three embodiments (1) to (3).

Further, one type of the p-type semiconductor and n-type semiconductor may be contained in the same layer, and two or more types thereof may be contained in the same layer. For example, the material forming the bulk hetero layer includes not only two types but also three or more types.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a picene derivative, a chrysene derivative, a fluoranthene derivative, a phthalocyanine derivative, a subphthalocyanine derivative, a metal complex having a heterocyclic compound as a ligand, a thienoacene material typified by a benzothienothiophene (BTBT) derivative, a dinaphthothienothiophene (DNTT) derivative, a dianthracenothienothiophene (DATT) derivative, a benzobisbenzothiophene (BBBT) derivative, a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, etc.

A p-type organic semiconductor which is one type of p-type semiconductor may be a compound represented by the following general formula (11).

[Chem. 19]

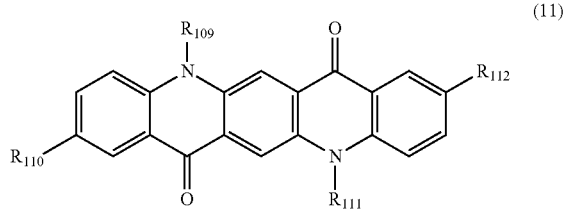

(11)

In the general formula (11), $R_{109}$ to $R_{112}$ each independently represent a hydrogen group, an alkyl group, an aryl group, an arylamino group, or a carbazolyl group, and the alkyl group, the aryl group, the arylamino group, and the carbazolyl group may or may not have a substituent.

Each of the aryl group and the aryl group having an arylamino group as a substituent may be a phenyl group, a biphenyl group, a naphthyl group, a naphthylphenyl group, a phenylnaphthyl group, a tolyl group, a xylyl group, a terphenyl group, an anthracenyl group, a phenanthryl group, a pyrenyl group, a tetracenyl group, a fluoranthenyl group, a pyridinyl group, a quinolinyl group, an acridinyl group, an indole group, an imidazole group, a benzimidazole group, or a thienyl group. The alkyl group may be a methyl group, an ethyl group, a propyl group, a butyl group, a pentyl group, or a hexyl group. The alkyl group may be a linear alkyl group or a branched alkyl group.

Examples of the n-type organic semiconductor include fullerenes and fullerene derivatives, organic semiconductors having HOMO levels and lowest unoccupied molecular orbital (LUMO) levels higher (deeper) than those of p-type organic semiconductors, transparent inorganic metal oxides, etc. Specific examples of the n-type organic semiconductor include a heterocyclic compound containing a nitrogen atom, an oxygen atom and a sulfur atom, for example, organic molecules, organometallic complexes and subphthalocyanine derivatives having pyridine, pyrazine, pyrimidine, triazine, quinoline, quinoxaline, isoquinoline, acridine, phenazine, phenanthroline, tetrazole, pyrazole, imidazole, thiazole, oxazole, benzimidazole, benzotriazole, benzoxazole, carbazole, benzofuran, dibenzofuran and the like as a part of the molecular skeleton, fullerenes and fullerene derivatives, etc. The thickness of the organic photoelectric conversion layer is not limited, but may be, for example, 10 nm to 500 nm, or 25 nm to 300 nm, or 25 nm to 250 nm, or 100 nm to 180 nm. Moreover, an organic semiconductor is often classified as p-type or n-type, but p-type means that holes can be easily transported, and n-type means that electrons can be easily transported, and an organic semiconductor is not limited to the interpretation that it has holes or electrons as majority carriers of thermal excitation like inorganic semiconductors.

(Inorganic Photoelectric Conversion Layer)

In addition to crystalline silicon, examples of inorganic materials forming the photoelectric conversion layer 23 include amorphous silicon, microcrystalline silicon, crystalline selenium, amorphous selenium, and compound semiconductors such as chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$ and AgInSe$_2$, or group III-V compounds such as GaAs, InP, AlGaAs, InGaP, AlGaInP and InGaAsP, and CdSe, CdS, In$_2$Se$_3$, In$_2$S$_3$, Bi$_2$Se$_3$, Bi$_2$S$_3$, ZnSe, ZnS, PbSe, PbS, etc. In addition, it is also possible to use quantum dots formed of these materials for the inorganic photoelectric conversion layer.

(Second Buffer Layer)

The second buffer layer 24 may be inserted between the second electrode (cathode) 25 and the photoelectric conversion layer 23. As a material used in the second buffer layer 24, a material having a work function higher (deeper) than that of the material used in the first buffer layer 22 may be used. For example, materials which are organic molecules and organometallic complexes having a heterocycle containing N such as pyridine, quinoline, acridine, indole, imidazole, benzimidazole, or phenanthroline as a part of the molecular skeleton, and have low absorption in the visible light region, may be used. Furthermore, in the case of forming a cathode side organic carrier blocking layer using a thin film of about 5 nm to 20 nm, fullerenes and derivatives thereof having absorption in the visible light region from 400 nm to 700 nm and typified by C60 and C70 may be used. However, the second buffer layer 24 used in the imaging element 1 according to the first embodiment of the present technology is not limited thereto.

(First Semiconductor Layer)

In order to improve the electrical bondability between the first buffer layer 22 and the first electrode (anode) 21 or the photoelectric conversion layer 23, or to adjust the electric capacity of the photoelectric conversion element, the first buffer layer may include a first semiconductor layer (not shown) adjacent to the first buffer layer 22. Examples of materials of the first semiconductor layer include compounds such as aromatic amine-based materials typified by triarylamine compounds, benzidine compounds, styrylamine compounds, carbazole derivatives, naphthalene derivatives, anthracene derivatives, phenanthrene derivatives, pyrene derivatives, perylene derivatives, tetracene derivatives, pentacene derivatives, picene derivatives, chrysene derivatives, fluoranthene derivatives, phthalocyanine derivatives, subphthalocyanine derivatives, hexaazatriphenylene derivatives, metal complexes having a heterocyclic compound as a ligand, thienoacene materials typified by benzothienothiophene (BTBT) derivatives, dinaphthothienothiophene (DNTT) derivatives, dianthracenothiothiophene (DATT) derivatives, benzobisbenzothiophene (BBBT) derivatives, thienobisbenzothiophene (TBBT) derivatives, dibenzothienobisbenzothiophene (DBTBT) derivatives, dithienobenzodithiophene (DTBDT) derivatives, dibenzothienodithiophene (DBTDT) derivatives, benzodithiophene (BDT) derivatives, naphthodithiophene (NDT) derivatives, anthracenodithiophene (ADT) derivatives, tetracenodithiophene (TDT) derivatives and pentacenodithiophene (PDT) derivatives, poly(3,4-ethylenedioxythiophene)/polystyrenesulfonic acid (PEDOT/PSS), polyaniline, molybdenum oxide (MoOx), ruthenium oxide (RuOx), vanadium oxide (VOx), tungsten oxide (WOx), etc. Particularly, in the case of increasing the film thickness of the semiconductor layer for the purpose of greatly reducing the electric capacity, thienoacene derivatives (material) typified by benzothienothiophene (BTBT) derivatives may be used.

(Film-Forming Method of First Buffer Layer, Photoelectric Conversion Layer, Second Buffer Layer and First Semiconductor Layer)

A dry film formation method and a wet film formation method are examples of a film-forming method for the first buffer layer 22, the photoelectric conversion layer 23, the second buffer layer 24 and the first semiconductor layer. Examples of the dry film formation method include a vacuum deposition method using resistance heating or high frequency heating, an EB vapor deposition method, various sputtering methods (a magnetron sputtering method, an RF-DC coupled bias sputtering method, an ECR sputtering method, a facing-target sputtering method and a high frequency sputtering method), an ion plating method, a laser ablation method, a molecular beam epitaxy method, and a laser transfer method. Furthermore, examples of a chemical vapor deposition (CVD) method include a plasma CVD method, a thermal CVD method, an MOCVD method, and a photo CVD method. On the other hand, as a wet method, methods such as a spin coating method, an inkjet method, a spray coating method, a stamp method, a microcontact printing method, a flexographic printing method, an offset printing method, a gravure printing method, a dipping method and the like may be used. For patterning, chemical etching such as shadow mask, laser transfer, photolithography and the like, and physical etching by ultraviolet light, laser and the like may be used. Examples of a planarization technology include a laser planarization method, a reflow method, etc.

(First Electrode and Second Electrode)

The first electrode (anode) 21 and the second electrode (cathode) 25 may be formed of a transparent conductive material. In the case of forming a stacked-type imaging element according to a second embodiment of the present technology which will be described later, the first electrode (anode) 21 and the second electrode (cathode) 25 may be formed of a transparent conductive material. When the imaging element or the like according to the first embodiment of the present technology is arranged on a plane as in a Bayer array, for example, one of the first electrode (anode) 21 and the second electrode (cathode) 25 may be formed of a transparent conductive material, and the other may be formed of a metal material. In this case, as shown in FIG. 2B, the first electrode 21 located on the light incident side may be formed of a transparent conductive material, and the second electrode 25 may be formed of aluminum (Al), an alloy of aluminum, silicon and copper (Al—Si—Cu) or an alloy of magnesium and silver (Mg—Ag). Alternatively, as shown in FIG. 2A, the second electrode 25 located on the light incident side may be formed of a transparent conductive material, and the first electrode 21 may be formed of an alloy of aluminum and neodymium (Al—Nd) or an alloy of aluminum, samarium and copper (ASC). Further, an electrode formed of a transparent conductive material may be referred to as a "transparent electrode." Here, examples of the transparent conductive material forming the transparent electrode include conductive metal oxides, and specific examples thereof include indium oxide, indium-tin oxide (ITO including Sn-doped $In_2O_3$, crystalline ITO and amorphous ITO), indium-zinc oxide (IZO) in which indium is added to zinc oxide as a dopant, indium-gallium oxide (IGO) in which indium is added to gallium oxide as a dopant, indium-gallium-zinc oxide (IGZO, In—$GaZnO_4$) in which indium and gallium are added to zinc oxide as a dopant, IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) in which aluminum is added to zinc oxide as a dopant, gallium-zinc oxide (GZO) in which gallium is added to zinc oxide as a dopant, titanium oxide ($TiO_2$), antimony oxide, a spinel type oxide, and an oxide having an $YbFe_2O_4$ structure. Alternatively, a transparent electrode having a mother layer of gallium oxide, titanium oxide, niobium oxide, nickel oxide or the like may be given as an example. The thickness of the transparent electrode may be $2\times10^{-8}$ m to $2\times10^{-7}$ m, or $3\times10^{-8}$ m to $1\times10^{-7}$ m.

Furthermore, when transparency is unnecessary, a conductive material forming an anode having a function as an electrode for extracting holes may be a conductive material having a high work function (e.g., $\phi$=4.5 eV to 5.5 eV), and specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, a conductive material forming a cathode having a function as an electrode for extracting electrons may be a conductive material having a low work function (e.g., =3.5 eV to 4.5 eV), and specific examples thereof include alkali metals (e.g., Li, Na, K, etc.) and fluorides or oxides thereof, alkaline earth metals (e.g., Mg, Ca, etc.) and fluorides or oxides thereof, aluminum (Al), zinc (Zn), tin (Sn), thallium (Tl), a sodium-potassium alloy, an aluminum-lithium alloy, a magnesium-silver alloy, indium and rare earth metals such as ytterbium, or alloys thereof. Alternatively, examples of the material forming an anode or cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo) or the like, or alloys including these metal elements, conductive particles formed of these metals, conductive particles of alloys including these metals, polysilicon containing impurities, carbon-based materials, oxide semiconductors, conductive materials such as carbon nanotubes, graphene and the like, and a stacked structure of layers containing these elements.

Furthermore, examples of a material forming an anode or cathode include organic materials (conductive polymers) such as poly(3,4-ethylenedioxythiophene)/polystyrenesulfonic acid (PEDOT/PSS). Further, a paste or ink prepared by mixing these conductive materials into a binder (polymer) may be cured to be used as an electrode.

The first electrode (anode) 21 and second electrode (cathode) 25 may be coated with a coating layer. Examples of materials forming the coating layer include inorganic insulating materials exemplified by a metal oxide high-dielectric constant insulating film such as silicon oxide-based materials, silicon nitride (SiNY), aluminum oxide ($Al_2O_3$) or the like as well as organic insulating materials (organic polymers) exemplified by polymethyl methacrylate (PMMA), polyvinyl phenol (PVP), polyvinyl alcohol (PVA), polyimide, polycarbonate (PC), polyethylene terephthalate (PET), polystyrene, silanol derivatives (silane coupling agents) such as N-2(aminoethyl)3-aminopropy ltrimethoxysi lane (AEAPTMS), 3-mercaptopropy ltrimethoxysi lane (MPTMS), octadecyltrichlorosilane (OTS) or the like, straight-chain hydrocarbons having a functional group capable of bonding to the electrode at one end such as octadecanethiol, dodecyl isocyanate and the like, and combinations thereof. In addition, examples of the silicon oxide-based materials include silicon oxide (SiOx), BPSG, PSG, BSG, AsSG, PbSG, silicon oxynitride (SiON), spin-on-glass (SOG), and low dielectric constant materials (e.g., polyaryl ether, cycloperfluorocarbon polymers, benzocyclobutene, cyclic fluoro resins, polytetrafluoroethylene, fluoroaryl ether, fluorinated polyimide, amorphous carbon and organic SOG). As a method for forming the insulating layer, for example, the dry film formation methods and the wet film formation methods described above may be used.

(Film-Forming Method of First Electrode and Second Electrode)

A dry method or wet method may be used as a film-forming method of the first electrode (anode) 21 and the second electrode (cathode) 25. Examples of the dry method include a physical vapor deposition method (PVD method) and a chemical vapor deposition method (CVD method). Examples of the film-forming method using the principle of a PVD method include a vacuum deposition method using resistance heating or high frequency heating, an electron beam (EB) deposition method, various sputtering methods (a magnetron sputtering method, an RF-DC coupled bias sputtering method, an ECR sputtering method, a facing-target sputtering method and a high-frequency sputtering method), an ion plating method, a laser ablation method, a molecular beam epitaxy method, and a laser transfer method. Furthermore, examples of the CVD method include a plasma CVD method, a thermal CVD method, an organic metal (MO) CVD method, and a photo CVD method. On the other hand, examples of the wet method include an electrolytic plating method and an electroless plating method, a spin coating method, an ink jet method, a spray coating method, a stamping method, a micro contact printing method, a flexographic printing method, an offset printing method, a gravure printing method, a dipping method, etc. For patterning, chemical etching such as shadow mask, laser transfer, photolithography and the like, physical etching by ultraviolet light, laser and the like may be used. Examples of a planarization technology include a laser planarization method, a reflow method, a chemical mechanical polishing (CMP) method, etc.

(Substrate)

The imaging element 1 may be formed on a substrate 20. Here, examples of the substrate 20 include organic polymers (having a form of a polymeric material such as a plastic film, a plastic sheet or a plastic substrate formed of polymeric materials and having flexibility) exemplified by polymethyl methacrylate (PMMA), polyvinyl alcohol (PVA), polyvinylphenol (PVP), polyethersulfone (PES), polyimide, polycarbonate (PC), polyethylene terephthalate (PET), and polyethylene naphthalate (PEN). When such a substrate formed of the polymeric material having flexibility is used, for example, it is possible to incorporate or integrate an imaging element in electronics having a curved surface shape. Alternatively, examples of the substrate 20 include various glass substrates, various types of glass substrates having an insulating film formed on surfaces thereof, quartz substrates, quartz substrates having an insulating film formed on surfaces thereof, silicon semiconductor substrates, metal substrates formed of various alloys and metals such as stainless steel and having an insulating film formed on surfaces thereof. Further, examples of the insulating film include silicon oxide-based material (e.g., SiOx or spin-on-glass (SOG)), silicon nitride (SiNγ), silicon oxynitride (SiON), aluminum oxide ($Al_2O_3$), metal oxides and metal salts. Furthermore, it is also possible to form an insulating film formed of an organic material. Examples thereof include lithographically processable polyphenol-based materials, polyvinyl phenol-based materials, polyimide-based materials, polyamide-based materials, polyamideimide-based materials, fluorine-based polymeric materials, borazine-silicon polymeric materials, torquecene-based materials, etc. Further, a conductive substrate (a substrate formed of a metal such as gold or aluminum, a substrate formed of highly oriented graphite) having these insulating films formed on a surface thereof may also be used. The surface of the substrate 20 may be smooth, but may have roughness to an extent that does not adversely affect the characteristics of the organic photoelectric conversion layer. The adhesion between the first electrode (anode) 21 and the substrate 20 or the adhesion between the second electrode (cathode) 25 and the substrate 20 may be improved by forming a silanol derivative on the surface of the substrate by a silane coupling method, or forming a thin film formed of a thiol derivative, a carboxylic acid derivative, a phosphoric acid derivative or the like by the SAM method or the like, or forming a thin film formed of an insulating metal salt or metal complex by a CVD method or the like.

In the imaging element according to the first embodiment of the present technology, an on-chip microlens or a light-shielding layer may be further provided, or a driving circuit or a wiring for driving the imaging element according to the first embodiment of the present technology may be provided. As necessary, a shutter for controlling incidence of light on the imaging element according to the first embodiment may be provided.

3. Second Embodiment (Stacked-Type Imaging Element)

The stacked-type imaging element according to the second embodiment of the present technology is an imaging element in which at least two of the imaging elements according to the first embodiment of the present technology are stacked. The imaging elements to be stacked may be a combination of an organic imaging element and inorganic imaging element, or only organic imaging elements, or only inorganic imaging elements.

(Regarding Imaging Element in which Organic Imaging Element and Inorganic Imaging Element are Stacked)

As described above, the stacked-type imaging element according to the second embodiment of the present technology may be an element in which one or two layers of organic photoelectric conversion elements and inorganic photoelectric conversion elements are combined. In the case of using vertical spectroscopy, as for the stacking order of the photoelectric conversion element, an inorganic photoelectric conversion element may be located at the lowermost layer as viewed from the light-incident direction. Since it may be ideal to locate an organic photoelectric conversion element at the upper layer with respect to the light-incident direction, in the case of one layer (single layer element), a blue or green photoelectric conversion element may be used, and in the case of two layers (stack of two color elements), a blue color may be the first layer and a green color may be the second layer, and vice versa. Regarding the visible light absorption wavelength of each color, it is the same as the wavelength range described in the organic imaging element, and the stacked-type imaging element can absorb light of 425 nm to 495 nm for blue, light of 495 nm to 500 nm for green, and light of 620 nm to 750 nm for red.

JP 2014-127545A provides an example of an imaging element in which an organic imaging element and an inorganic imaging element are stacked. However, although an organic photoelectric conversion element is described as being capable of obtaining a green color signal in this patent, the stacked-type imaging element of the present patent is not limited thereto. The present stacked-type imaging element has advantages of sensitivity, recording density, light leakage, restriction on light-incident angle, and reduction of false color described in the section of the organic imaging element. Furthermore, the organic photoelectric conversion layer and inorganic photoelectric conversion layer may be arrayed on a plane as in a Bayer array. In this case, it is considered that the specification of spectral characteristics of blue, green and red can be alleviated as compared to a photoelectric conversion layer using vertical spectroscopy, and mass productivity is also improved as compared to vertical spectroscopy.

In the stacked-type imaging element according to the second embodiment of the present technology, an on-chip microlens or a light-shielding layer may be further provided as necessary, or a driving circuit or a wiring for driving the stacked-type imaging element according to the second embodiment of the present technology may be provided. As necessary, a shutter for controlling incidence of light into the stacked-type imaging element according to the second embodiment may be provided.

4. Third Embodiment (Imaging Apparatus)

The imaging apparatus according to a third embodiment of the present technology is an apparatus including a plurality of the imaging elements according to the first embodiment of the present technology, or an apparatus including a plurality of the stacked-type imaging element according to the second embodiment of the present technology.

In the imaging apparatus according to the third embodiment of the present technology, an on-chip microlens or a light-shielding layer may be further provided as necessary. An optical cut filter may be provided in accordance with the purpose of the imaging apparatus according to the third embodiment of the present technology. Furthermore, examples of the arrangement of the imaging element according to the first embodiment of the present technology or the stacked-type imaging element according to the second embodiment of the present technology in the imaging apparatus according to the third embodiment of the present technology include an interline arrangement, a G stripe-RB checkered array, a G stripe-RB full-checkered array, a checkered complementary color array, a stripe array, a diagonal stripe array, a primary color difference array, a field color difference sequential array, a flame color difference sequential array, an MOS-type array, a modified MOS-type array, a flame interleave array and a field interleave array in addition to a Bayer array.

5. Fourth Embodiment (Electronic Apparatus)

The electronic apparatus according to a fourth embodiment of the present technology is an apparatus including the imaging apparatus according to the third embodiment of the present technology.

6. Usage Examples of Imaging Apparatus to which Present Technology is Applied

FIG. 5 is a diagram illustrating usage examples in which the above-described imaging apparatus is used. For example, the above-described imaging apparatus can be used for various cases in which light such as visible light, infrared light, ultraviolet light, or X-rays is detected as follows.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to take images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of fields and crops.

In addition, embodiments of the present technology are not limited to the above-described embodiments, and various alterations may occur insofar as they are within the scope of the present technology.

Note that the effects described in the present specification are merely illustrative examples and not limitative; other effects may be exhibited.

Additionally, the present technology may also be configured as described below.

EXAMPLES

Hereinafter, effects of the present technology will be described in detail with reference to examples. Further, the scope of the present technology is not limited to the examples.

Example 1

An imaging element for evaluation represented by a schematic partial cross-sectional view shown in FIG. 3 was prepared by the following method. Further, an imaging element for green was used as the imaging element for evaluation.

(Preparation of Organic Imaging Element)

An ITO film was formed to a thickness of 120 nm on a quartz substrate by a sputtering apparatus and a first electrode formed of ITO was formed on the basis of a lithography technology using a photomask. Subsequently, an insulating layer was formed on the quartz substrate and the first electrode, pixels were formed so as to expose an ITO first electrode of 1 mm square is exposed by a lithography technology, followed by ultrasonic cleaning sequentially with a neutral detergent, acetone and ethanol. After drying this ITO substrate, an UV/ozone treatment was further carried out for 10 minutes. Thereafter, after the ITO substrate was fixed to a substrate holder of a vapor deposition apparatus, a vapor deposition tank was depressurized to 5.5×10$^{-5}$ Pa.

Thereafter, a first buffer layer with a thickness of 5 nm was formed by vacuum deposition film formation using a shadow mask using materials of Compounds A to F having the physical property values shown in Table 1 and having the molecular structure shown below. Subsequently, a p-type organic semiconductor layer having a thickness of 5 nm in a photoelectric conversion layer was formed using a quinacridone derivative (BQD) substituted with a t-butyl group in the same evaporator. Further, BQD and fluorinated subphthalocyanine chloride (F6-SubPc-Cl) were co-deposited to a thickness of 150 nm at a deposition speed ratio of 1:1 to form a photoelectric conversion layer by a mixed layer (bulk hetero structure) of a p-type organic semiconductor and an n-type organic semiconductor. Subsequently, B4PyMPM was deposited to a thickness of 5 nm to form a second buffer layer. Then, the second buffer layer was placed in a container that can be transported in an inert atmosphere, transported to a sputtering apparatus, and ITO was deposited to a thickness of 50 nm on the upper layer of B4PyMPM to form a second electrode. Thereafter, in a nitrogen atmosphere, annealing which simulates a process for forming the actual imaging element, particularly, a heating process such as installation of a color filter, installation of a protective film, soldering of an element and the like was performed at 150° C. for 2.5 hours to prepare an organic imaging element.

Furthermore, the physical property values shown in the following Table 1 were evaluated by the following method. HOMO (ionization potential) was obtained by forming each of Compounds A to F to a thickness of 20 nm on a Si substrate and measuring thin film surface thereof by ultraviolet photoelectron spectroscopy (UPS). Further, an optical energy gap was calculated from the absorption end of the absorption spectrum of the thin film of each material and LUMO was calculated from the difference between HOMO and the energy gap (LUMO=−1*|HOMO−energy gap|). For mobility, an element for measuring mobility was prepared and evaluated by the following method. First, a thin film of Pt was formed at a thickness of 100 nm by an EB vapor deposition method and a first electrode of Pt was formed on the basis of a lithography technology using a photomask. Next, an insulating layer was formed on the substrate and the Pt first electrode, pixels were formed so that the Pt first electrode of 0.25 mm square was exposed by a lithography technology, and a molybdenum oxide (MoO$_3$) film with a thickness of 1 nm, films of Compounds A to F of which the mobility is to be measured with a thickness of 200 nm, a molybdenum oxide (MoO$_3$) film with a thickness of 3 nm, and an Au second electrode with a thickness of 100 nm each were stacked and formed thereon. A voltage of −1 V to −20 V or a voltage of +1 V to +20 V was applied to the element for mobility film formation obtained by the above-described method, the formula of space charge limited current (SCLC) was fitted to a current-voltage curve where more current was flowed by a negative bias or a positive bias, and the mobility at −1 V or +1 V was measured.

The glass transition temperatures of Compounds A to F were measured using a device manufactured by Seiko Instruments Inc. (model name: DSC 6200). Each sample of Compounds A to F was weighed by 5 to 10 mg and placed in a sample pan and heated to a melting temperature at a heating rate of 20° C./min under N$_2$ atmosphere to perform a first measurement. Thereafter, the sample pan was taken out of the apparatus, placed on an Al block and quenched. Subsequently, in a second measurement, heating was performed from 30° C. to a melting point at a heating rate of 20° C./min, and the temperature at which the second phase transition appeared was measured as the glass transition temperature.

(Evaluation of Organic Imaging Element)

The organic imaging element thus obtained was placed on a prober stage of which the temperature was controlled to 60° C. and a voltage of −1 V was applied between the second electrode and first electrode while performing light irradiation under the conditions of a wavelength of 560 nm and 2 μW/cm$^2$ to measure bright current. Thereafter, light irradiation was stopped and dark current was measured. The results of calculating an external quantum efficiency (EQE=|((light current−dark current)×100/(2×10^−6))×(1240/560)×100|) and an SN ratio (SN ratio=Log(light current−dark current)/dark current)) from the bright current and dark current are shown in Table 1. Furthermore, as for the afterimage evaluation, light having a wavelength of 560 nm and an intensity of 2 μW/cm$^2$ was irradiated while applying −1 volt (so-called reverse bias voltage of 1 volt) between the second electrode and the first electrode, and subsequently, when light irradiation was stopped, the amount of current flowing between the second electrode and the first electrode immediately before the light irradiation was stopped was defined as I$_0$ and the time from the stop of light irradiation until the current amount reaches (0.03×I$_0$) was defined as T$_0$, and T$_0$ was defined as the afterimage time, and are shown in Table 1. However, the dark current, the external quantum efficiency, and the afterimage T$_0$ are represented by relative values when the value of Compound A is 1.

Referring to Table 1, the SN ratio of the four materials of Compounds C to F was close to 4 and excellent imaging characteristics were obtained. This is because the deeper the HOMO level, the more dark current is suppressed in consideration of the SN ratio formula. In any one of the first buffer layer materials (compounds A to F) used in the present study, the LUMO level was shallower than −3 eV, and there is an energy barrier because the work function (−4.8 eV) of the first electrode and the LUMO level of the first buffer layer were separated by about 1.8 eV. As a result, it is considered that electron injection from the first electrode (ITO) into the organic photoelectric conversion layer via the LUMO level of the first buffer layer is suppressed in the dark. However, dark current source may be caused not only by electron injection from the first electrode via the first buffer layer, but also by carriers generated in the photoelectric conversion layer or in the interface between the first buffer layer and the photoelectric conversion layer (grain of p-type organic semiconductor) (internal generation of dark current). Particularly, although the cause of the internal occurrence of the dark current has not been investigated in the conventional technology, it is considered that, from the study result of examples 1, deepening of the HOMO level of the first buffer layer is effective as a countermeasure against the internal generation of the dark current. In other words, it may be necessary not only to obtain excellent light current but also to suppress dark current in order to improve the SN ratio, and also, it may be important to lower the HOMO level and prevent internally generated carriers from leakage in addition to preventing carrier injection from the first electrode by increasing the LUMO level of the first buffer layer.

On the other hand, the afterimage characteristics of Compounds A to E are excellent, but Compound F has about 2 times afterimage value. It can be considered that "the bonding state between the HOMO level of the first buffer material and the HOMO level of a p material in the photoelectric conversion layer" and "the hole mobility of the first buffer material" are involved in the afterimage characteristics. The hole mobility of the first buffer material group used in Example 1 has a difference of about one digit, and it turns out that there is no correlation between the mobility and the afterimage value when the correlation between the mobility and the afterimage value is actually examined. On the other hand, it turns out that, as shown in Table 1, the material having a high HOMO level has an excellent afterimage value, when noting "the bonding state between the HOMO level of the first buffer material and the HOMO level of a p material in the photoelectric conversion layer" and investigating a correlation of the HOMO level with respect to the afterimage value. Regarding this mechanism, it is considered because a barrier is formed between the grain of the p-type organic semiconductor and the first buffer layer, and thereby the afterimage characteristics are deteriorated in the case where the HOMO of the first buffer layer is too deep when the carriers in the afterimage evaluation under reverse bias of −1 V in the afterimage evaluation. When it is taken into consideration together with the results of the SN ratio, in the case where the HOMO level of the first buffer layer is higher as compared to the HOMO level of the grain of the p-type organic semiconductor, the dark current characteristics are not good while the afterimage characteristics are excellent. Furthermore, in the case of the reversed energy level relation, whether the afterimage characteristics and the dark current are excellent or not is also reversed. That is, it may be that the energy level of the first buffer layer and the p material of the photoelectric conversion layer are substantially the same, and a difference in the work function of the first buffer layer and the work function of the p material in the photoelectric conversion layer may be in the range of ±0.2 eV in order to satisfy both the SN ratio and the afterimage characteristics. In the present embodiment, since a quinacridone derivative (BQD) which is a p material having a HOMO level of −5.7 eV is used, the HOMO level of the first buffer layer may be in the range of −5.5 eV to −5.9 eV, and the indolocarbazole derivative according to an embodiment of the present disclosure may be a useful material satisfying this range.

Example 2

(Preparation of Organic Imaging Element)

An ITO substrate was prepared in the same manner as in Example 1. After the ITO substrate was dried, a UV/ozone treatment was further performed for 10 minutes. Then, after the ITO substrate was fixed in the substrate holder of the vapor deposition apparatus, the vapor deposition tank was depressurized to $5.5 \times 10^{-5}$ Pa. Thereafter, a first buffer layer having a film thickness of 10 nm was formed by vacuum deposition using a shadow mask using the materials of Compound A, C and E. Then, 2 Ph-BTBT, fluorinated subphthalocyanine chloride (F6-SubPc-Cl), and C60 were co-deposited to a thickness of 200 nm at a deposition speed ratio of 4:4:2 to form a photoelectric conversion layer by a mixed layer (bulk hetero structure) of a p-type organic semiconductor and an n-type organic semiconductor. Subsequently, B4PyMPM was deposited to a thickness of 10 nm to form a second buffer layer. Thereafter, the second buffer layer was placed in a container that can be transported in an inert atmosphere, transported to a sputtering apparatus, and ITO was deposited to a thickness of 50 nm on the upper layer of B4PyMPM to form a second electrode. Thereafter, in a nitrogen atmosphere, annealing which simulates a process for forming the actual imaging element and apparatus, particularly, a heating process such as installation of a color filter, installation of a protective film, soldering of an element and the like was performed at 150° C. for 3.5 hours to prepare an organic imaging element.

(Evaluation of Organic Imaging Element)

The organic imaging element obtained here was placed on a prober stage controlled to a temperature of 95° C., and irradiation of white light corresponding to 2000 times normal light was performed while applying a voltage of −2.6 V to the second electrode and the first electrode, and thereby the dark current of the organic imaging element was measured. The dark current value at the start of measurement was defined as Jdko, the dark current value after 12 hours passed was defined as $J_{dkE}$, and the dark current change during the present test was defined as $\Delta J_{dk}=|(J_{dkE}-J_{dko})/J_{dko} \times 100|$ to perform the evaluation. The results are shown in Table 2. Three materials of Compounds A, C and E were evaluated, and a change in dark current of Compounds C and E was suppressed as compared with Compound A. This is considered that, as compared to a carbazole skeleton of Compound A, Compounds C and E have an indolocarbazole skeleton as the mother skeleton, and the size of the mother skeleton in the whole molecule is large, and there is no molecular rotation of the mother skeleton itself due to heat, light and voltage, and no change in the molecular structure of the mother skeleton, and thus the thin film form of the first buffer layer can be maintained even when three loads of heat, light and voltage are applied, and also, a change in dark current can be suppressed even when three loads of heat, light and voltage are applied. It has been found that, in the conventional technology, resistance to a process of forming the imaging element, particularly, heating processes such as particularly the installation of the color filter, the installation of the protective film, the soldering of the element and the like, and preservability can be improved by using a material having a glass transition temperature of 140° C. or more for a buffer layer, but when the glass transition temperatures of Compounds A and C shown in Table 1 are compared, the glass transition temperatures of Compound A was rather higher, and thereby it turns out that a glass transition temperature is not a major factor with respect to resistance to three loads of heat, light, and voltage.

It can be seen from Examples 1 and 2 that, when an indolocarbazole derivative compound is used in the first buffer layer, not only the initial characteristics of the SN as viewed from the light-incident direction in the imaging element. Physical property values and electrical characteristics of the material of the first buffer layer used in Example 1 are shown in the following Table 1. Further, the results of the reliability test of Example 2 are shown in the following Table 2.

TABLE 1

|  | Physical properties | | | | Electrical characteristics | | | |
| --- | --- | --- | --- | --- | --- | --- | --- | --- |
|  | Glass transition temperature (° C.) | HOMO (eV) | LUMO (eV) | Hole mobility (cm2/Vs) | Dark current (relative value) | External quantum efficiency (relative value) | SN ratio | After-image To (relative value) |
| Compound A | 189 | −5.3 | −2.1 | 2.02E−06 | 1.00 | 1.00 | 3.76 | 1.00 |
| Compound B | 176 | −5.4 | −2.1 | 5.50E−06 | 0.79 | 1.01 | 3.87 |  |
| Compound C | 174 | −5.5 | −2.3 | 1.00E−05 | 0.63 | 1.00 | 3.96 | 0.95 |
| Compound D | 184 | −5.5 | −2.3 | 3.24E−06 | 0.42 | 1.01 | 4.14 | 0.96 |
| Compound E | 207 | −5.6 | −2.4 | 1.50E−05 | 0.48 | 0.96 | 4.06 | 1.02 |
| Compound F | 203 | −6.0 | −2.9 |  | 0.39 | 0.91 | 4.13 | 2.12 | ratio and afterimage characteristics are excellent, but also degradation of electric characteristics can be suppressed even in the reliability test in which three loads of "light, voltage and heat" are applied simultaneously and continuously.

Example 3

(Method of Evaluating Absorption Rate of First Buffer Layer Containing Indolocarbazole Derivative) A spectroscopic measurement was performed to measure light absorption in the visible light region when the indolocarbazole derivative was thinned. Specifically, thin films formed of indolocarbazole derivative compounds (compounds C, D and E) having a thickness of 50 nm was formed on a quartz substrate by a vacuum deposition method, and a light transmittance measurement and light reflectance measurement were carried out to obtain a light absorption spectrum (light absorption rate) calculated in the case in which the film thickness is 10 nm.

(Evaluation Result of Absorption Rate of First Buffer Layer Containing Indolocarbazole Derivative)

Table 3 and FIG. 4 show the measurement results of the absorption rate of the thin film at the film thickness of 10 nm according to an embodiment of the present disclosure. FIG. 4 shows a change in absorption rate of the thin film in the wavelength region from 350 nm to 700 nm. In the case of the indolocarbazole material according to an embodiment of the present technology, almost no absorption is confirmed in the visible light region of a wavelength longer than 450 nm. Furthermore, the wavelength region from 450 nm to 400 nm is a region corresponding to blue light, but as shown in Table 3, in the light absorption at 450 nm, 425 nm and 400 nm of Compounds C, D, and E which are the indolocarbazole derivatives according to an embodiment of the present technology, even the highest light absorption is suppressed to 1% or less. That is, it can be seen that the thin film of the indolocarbazole derivative according to an embodiment of the present technology has almost no absorption in the visible light region, has excellent light absorption characteristics, and a photoelectric conversion function is not inhibited with respect to the imaging element and photoelectric conversion layer located under the first buffer layer

TABLE 2

|  | ΔJdk |
| --- | --- |
| Compound A | 32.90% |
| Compound C | 9.30% |
| Compound E | 0.80% |

TABLE 3

|  | 400 nm | 425 nm | 450 nm |
| --- | --- | --- | --- |
| Compound C | 1.04% | 0.02% | 0.01% |
| Compound D | 0.23% | 0.04% | 0.01% |
| Compound E | 0.08% | 0.01% | 0.01% |

[Chem.20]

Compound A

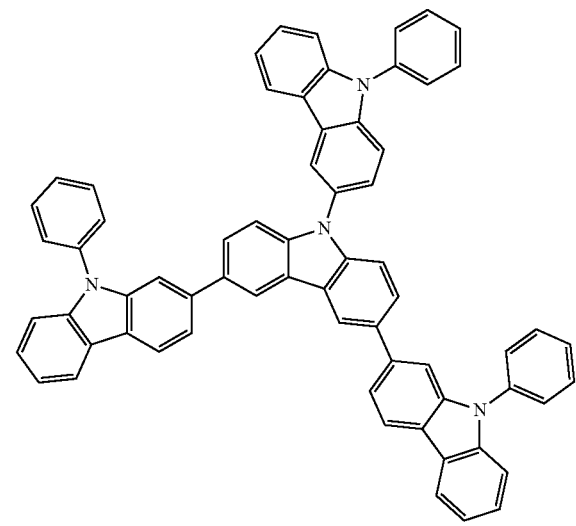

[Chem.21]
Compound B
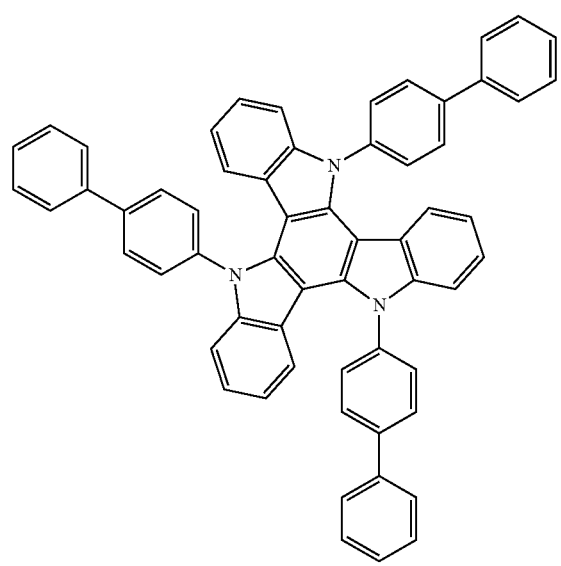
[Chem.22]
Compound C
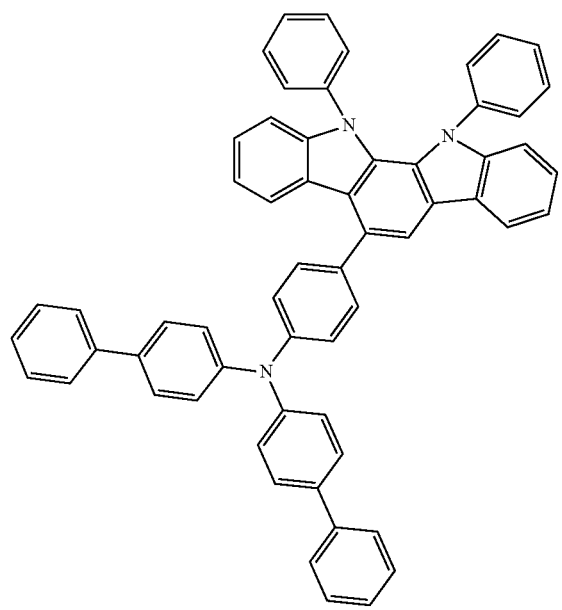
[Chem.23]
Compound D
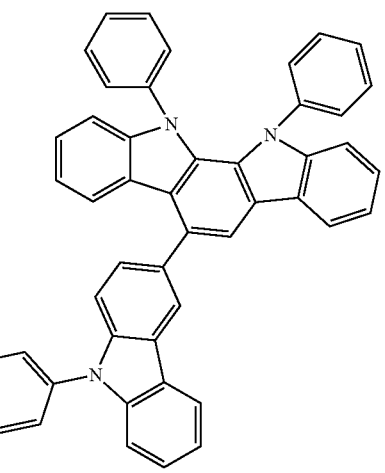
[Chem.24]
Compound E
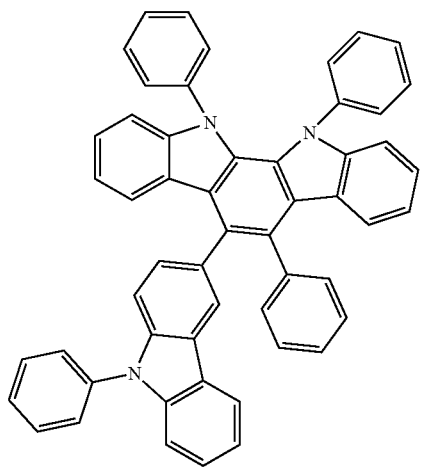
[Chem.25]
Compound F
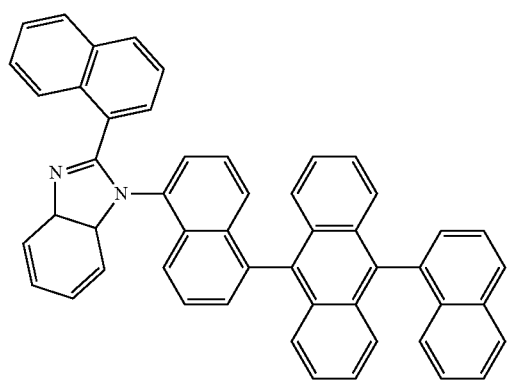

-continued

[Chem.26]

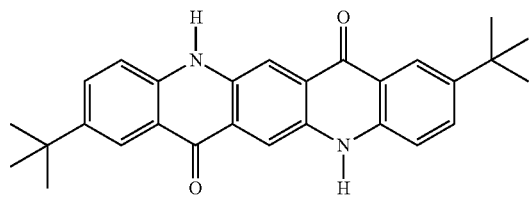

Quinacridone derivative (BQD) substituted with t-butyl group

[Chem.27]

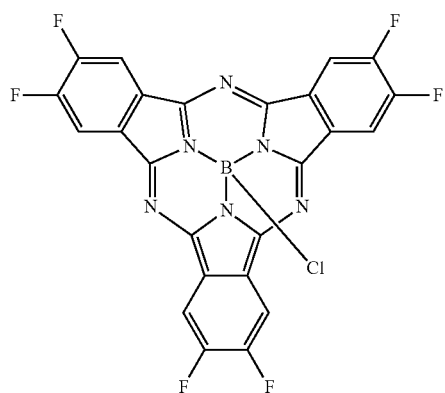

Fluorinated subphthalocyanine chloried (F6-SubPc-Cl)

[Chem.28]

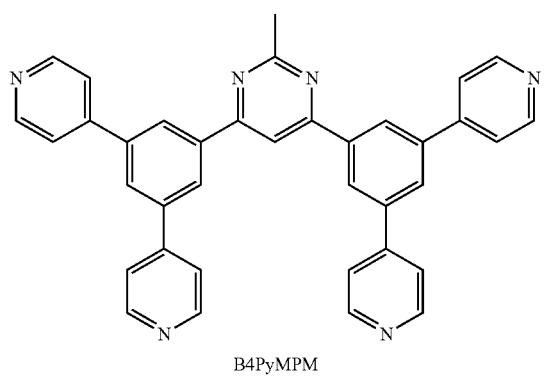

B4PyMPM

[Chem.29]

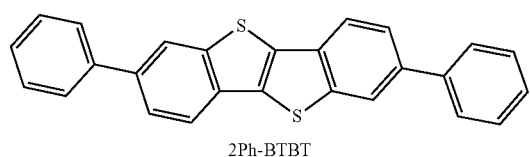

2Ph-BTBT

The structure of C60 is shown in FIG. 6.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 (1-1 to 1-3) imaging element
20 substrate
21 anode (first electrode)
22 first buffer layer
23 photoelectric conversion layer
24 second buffer layer
25 cathode (second electrode)
31 insulator Additionally, the present technology may also be configured as:

(A1)

An imaging device, including: an upper electrode; a lower electrode; a photoelectric conversion layer disposed between the upper electrode and the lower electrode; and a first organic semiconductor material including an indolocarbazole derivative and disposed between the upper electrode and the lower electrode.

(A2)

The imaging device according to (A1), where the first organic semiconductor material is disposed between the photoelectric conversion layer and the lower electrode.

(A3)

The imaging device according to any of A(1) to A(2), where the indolocarbazole derivative is selected from the group consisting of

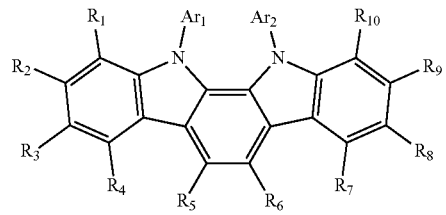

(1)

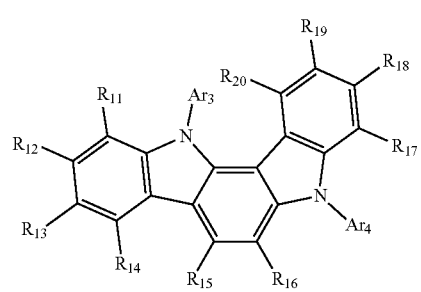

(2)

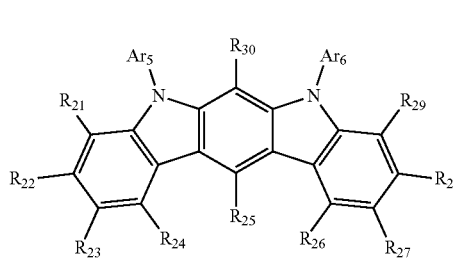

(3)

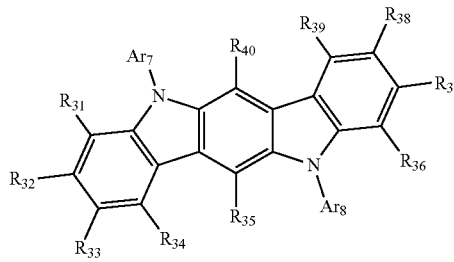

(4)

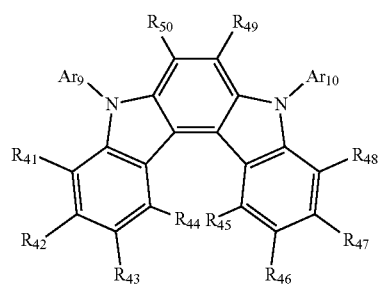

(5)

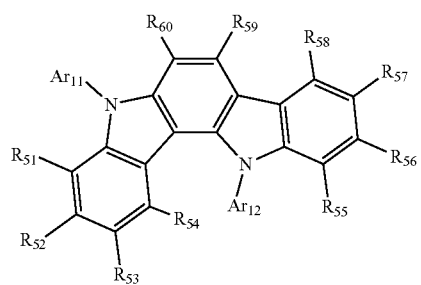

(6)

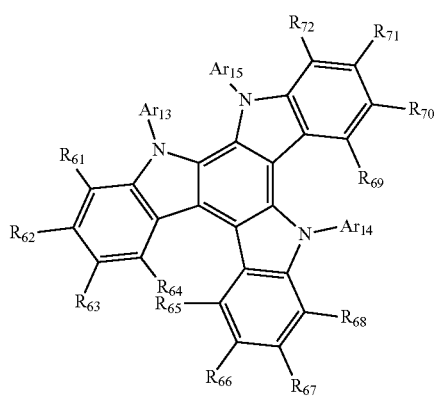

(7)

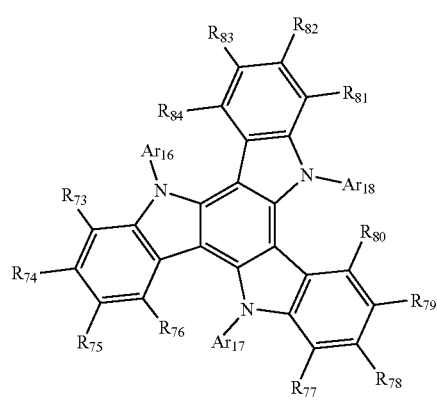

(8)

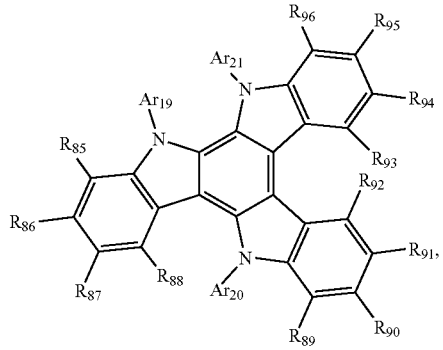

(9)

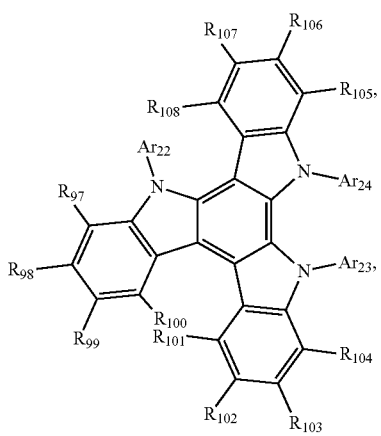

(10)

where in the formulas (1) to (10), the $Ar_1$ to $Ar_{24}$ each independently represent an aryl group; and $R_1$ to $R_{108}$ each independently represent a hydrogen group, an alkyl group, an aryl group, an arylamino group, an aryl group having an arylamino group as a substituent, or a carbazolyl group.

(A4) The imaging device according to any of A(1) to A(3), where the formulas (1) to (10) are further selected from the group consisting of

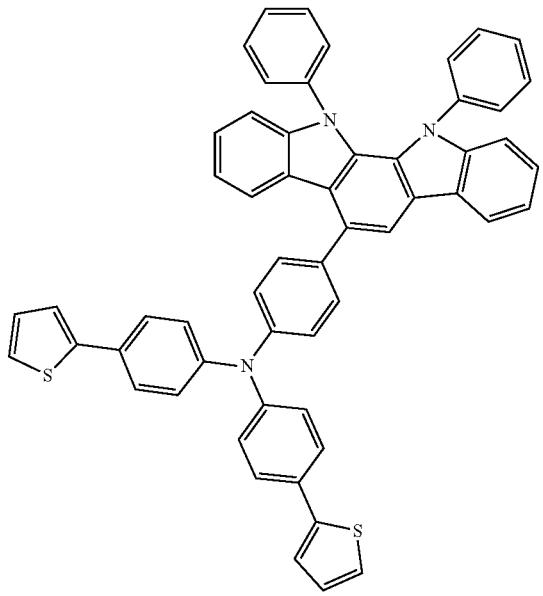

(100)

(101)
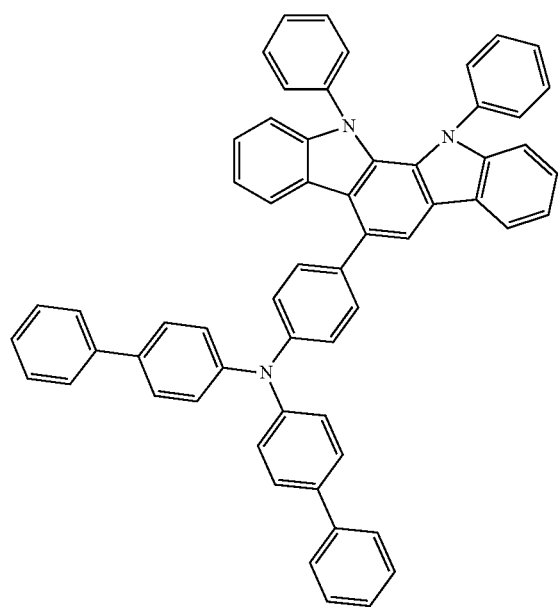
(102)
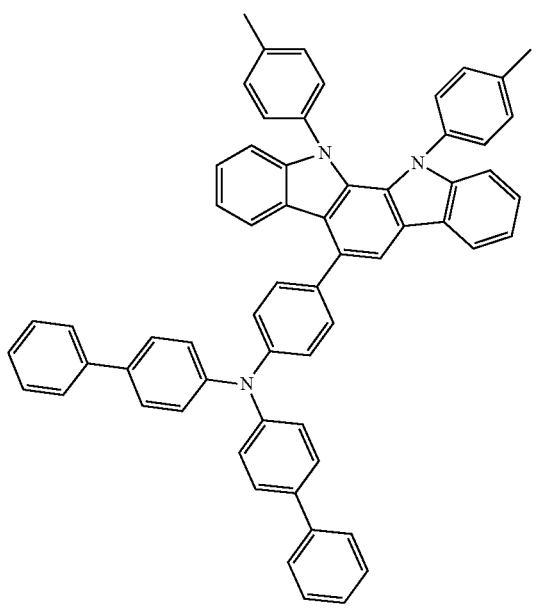
(103)
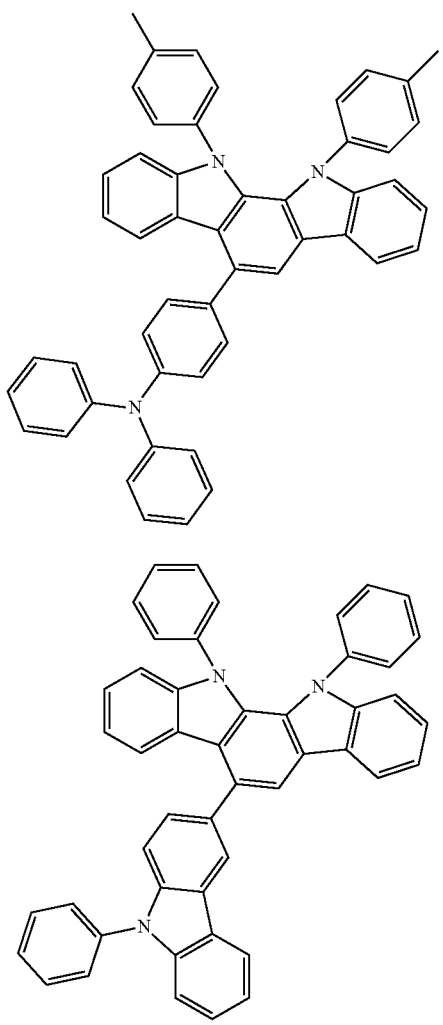
(104)
(105)
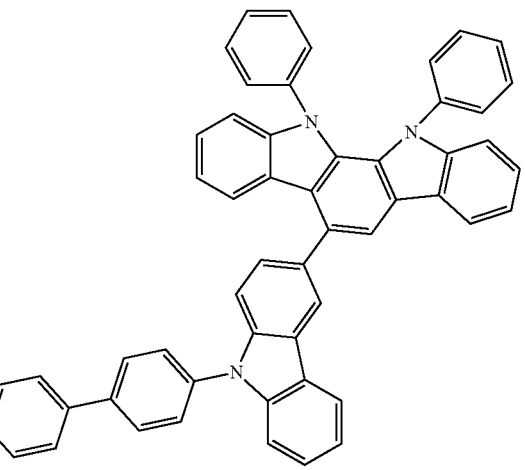

(106)
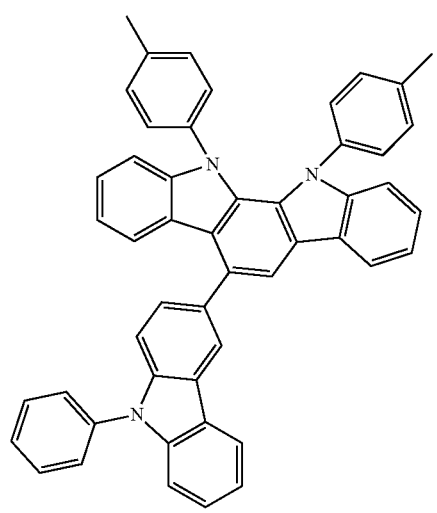
(107)
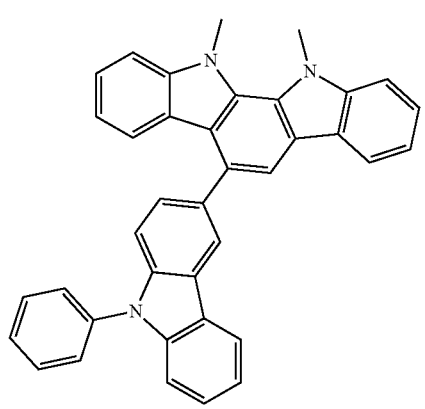
(108)
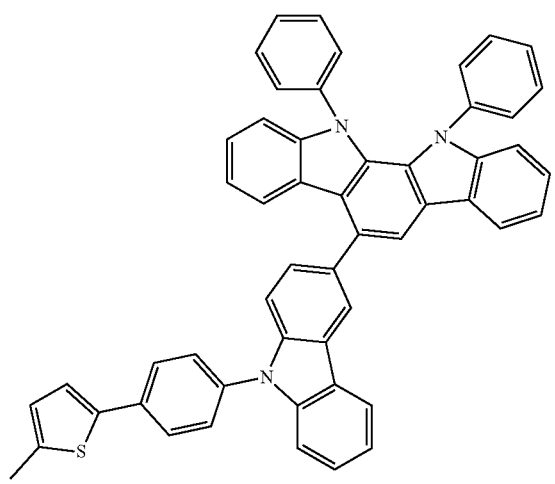
(109)
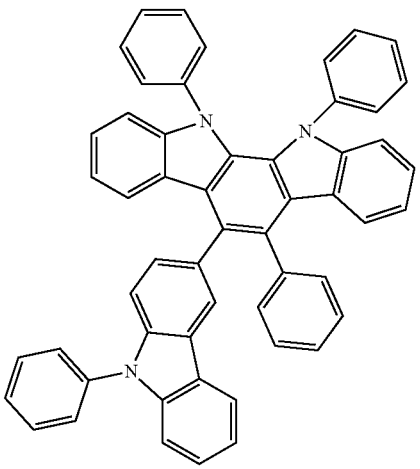
(110)
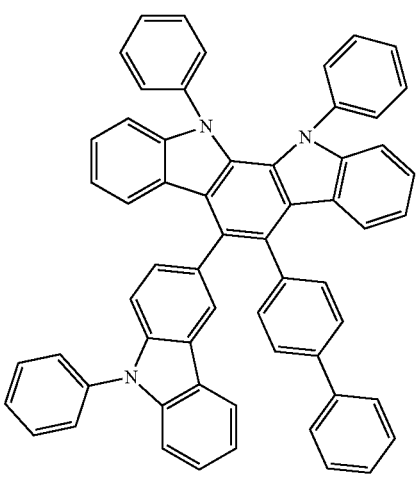
(111)
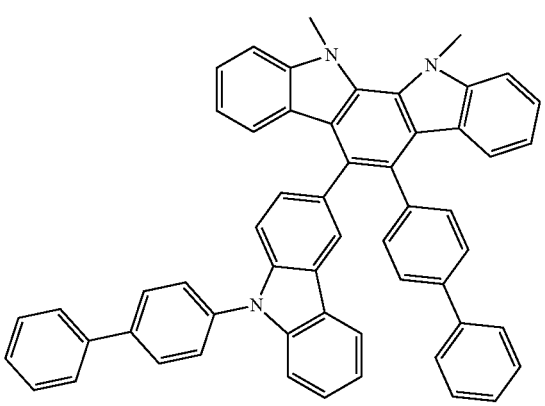

(112)
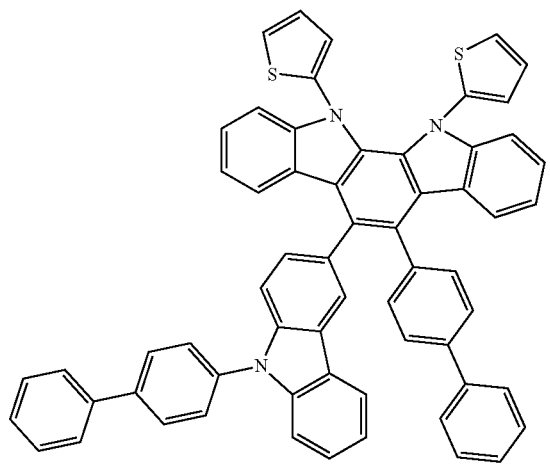
(113)
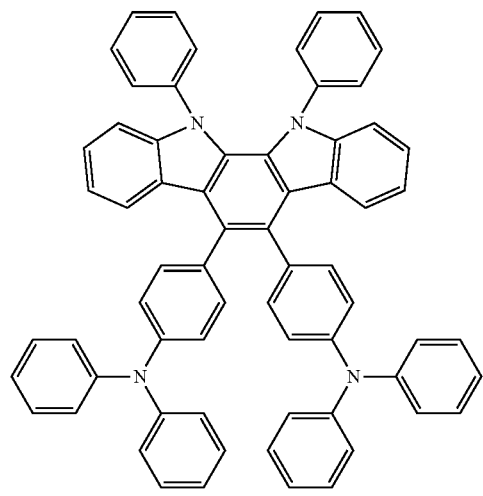
(114)
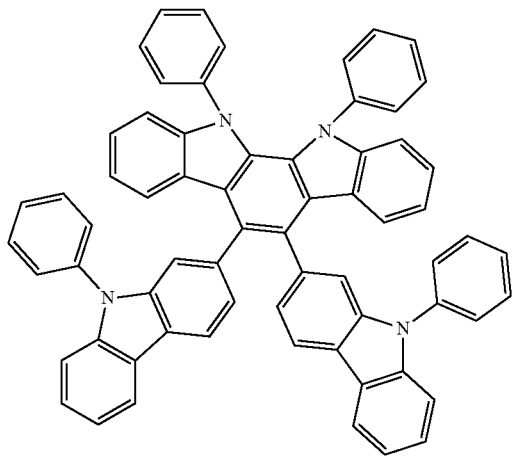
(115)
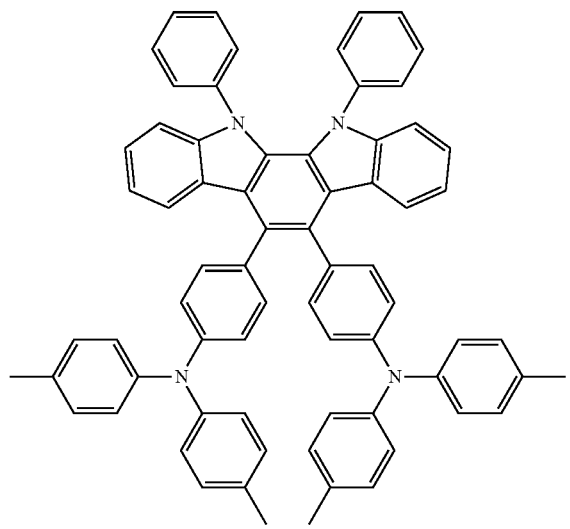
(A5) The imaging device according to any of A(1) to A(4), where the formulas (1) to (10) are further selected from the group consisting of
(116)
(117)

-continued
(118)
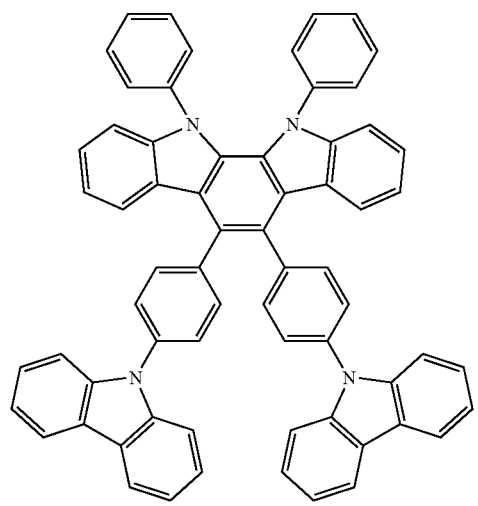
(119)
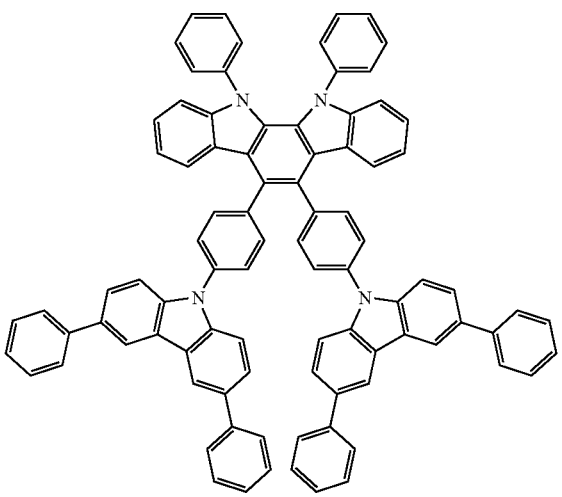
(120)
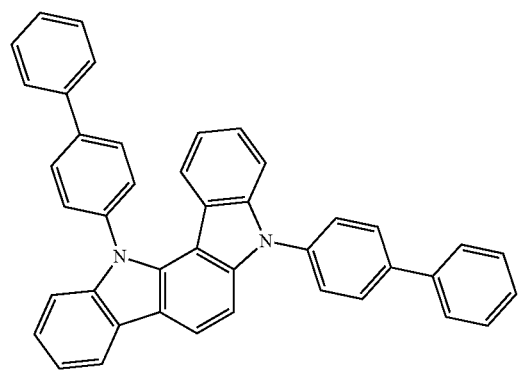
(121)
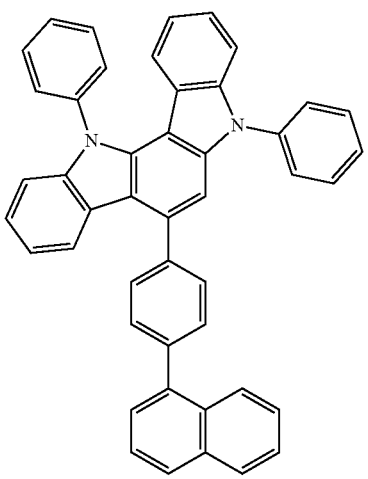
(122)
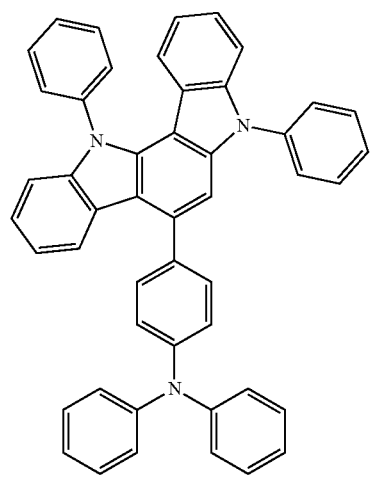
(123)
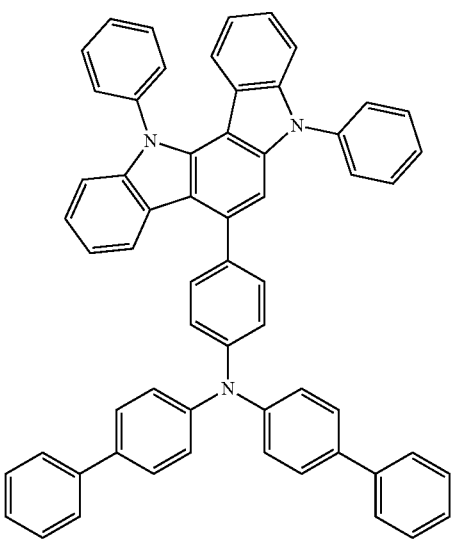

-continued
(124)
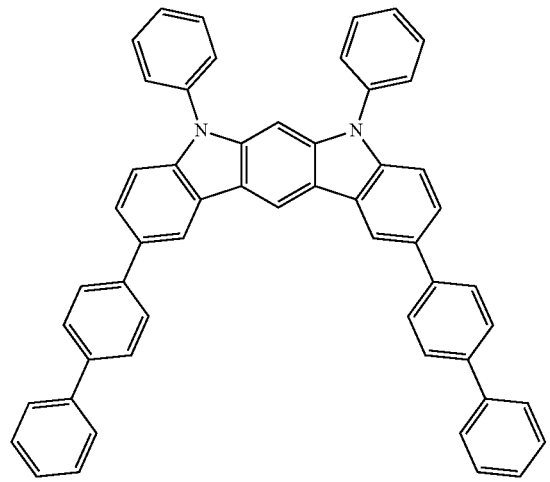
(125)
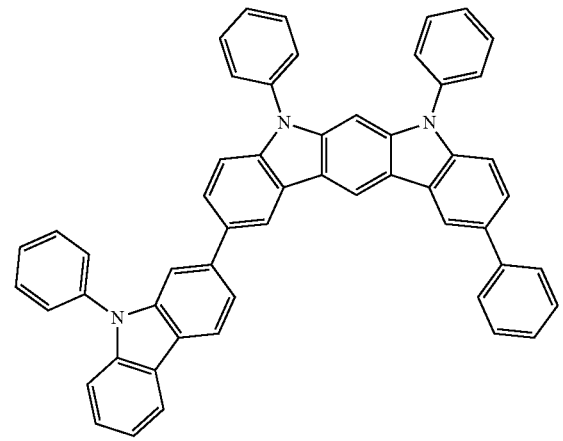
(126)
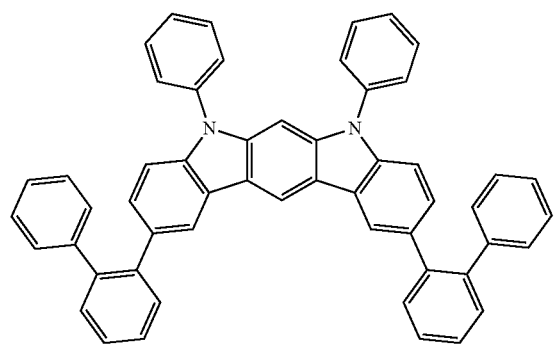
(127)
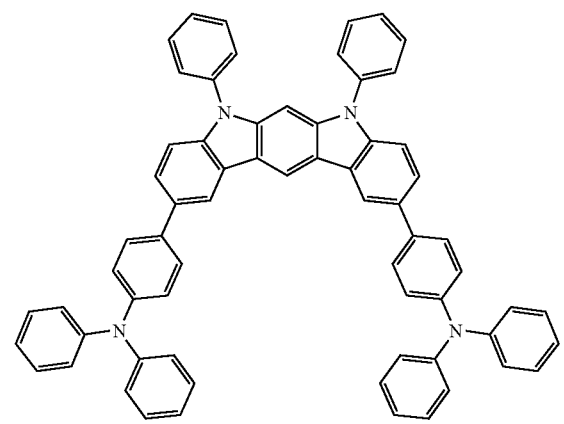
(128)
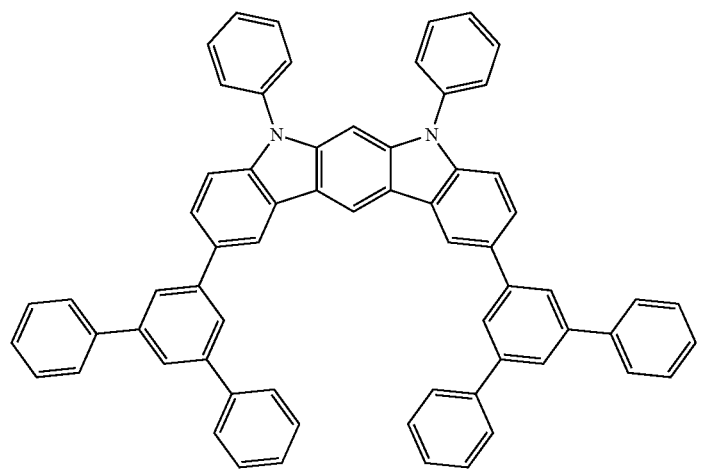

(129)
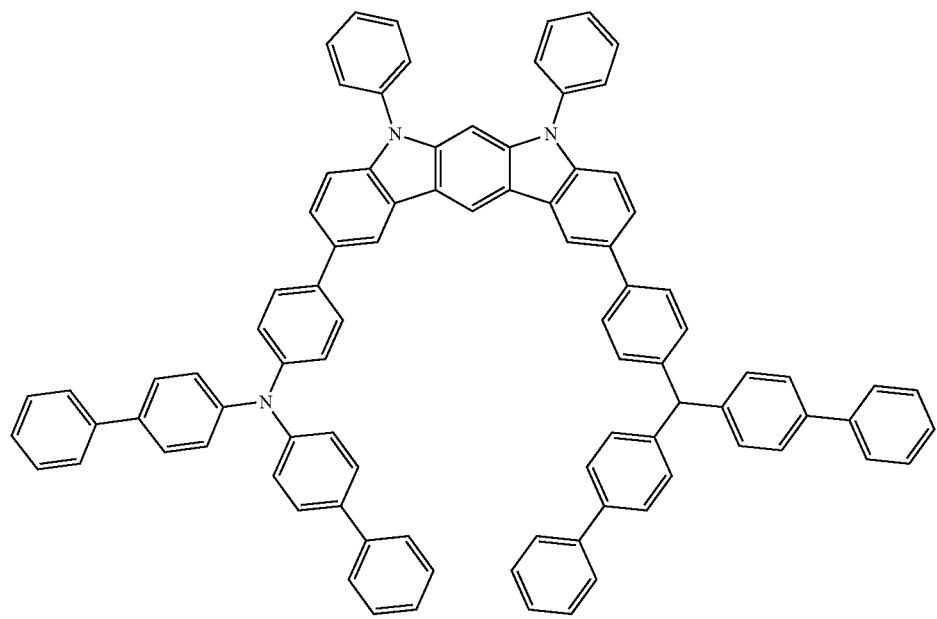
(130)
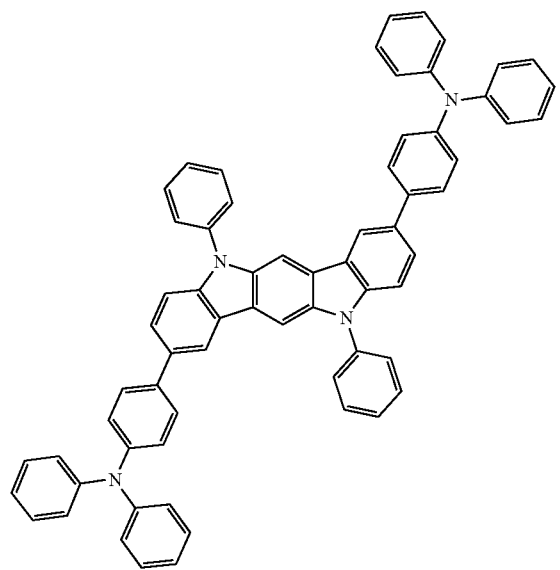

(131)
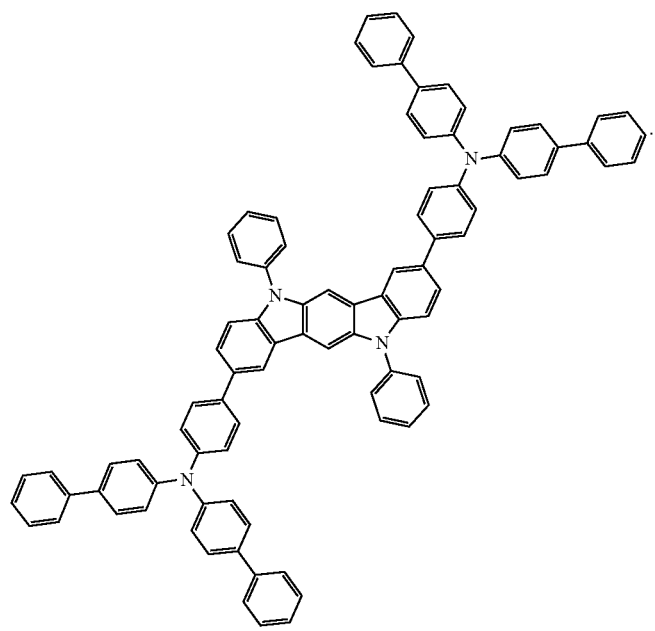
(A6)
The imaging device according to any of A(1) to A(5), where the formulas (1) to (10) are further selected from the group consisting of
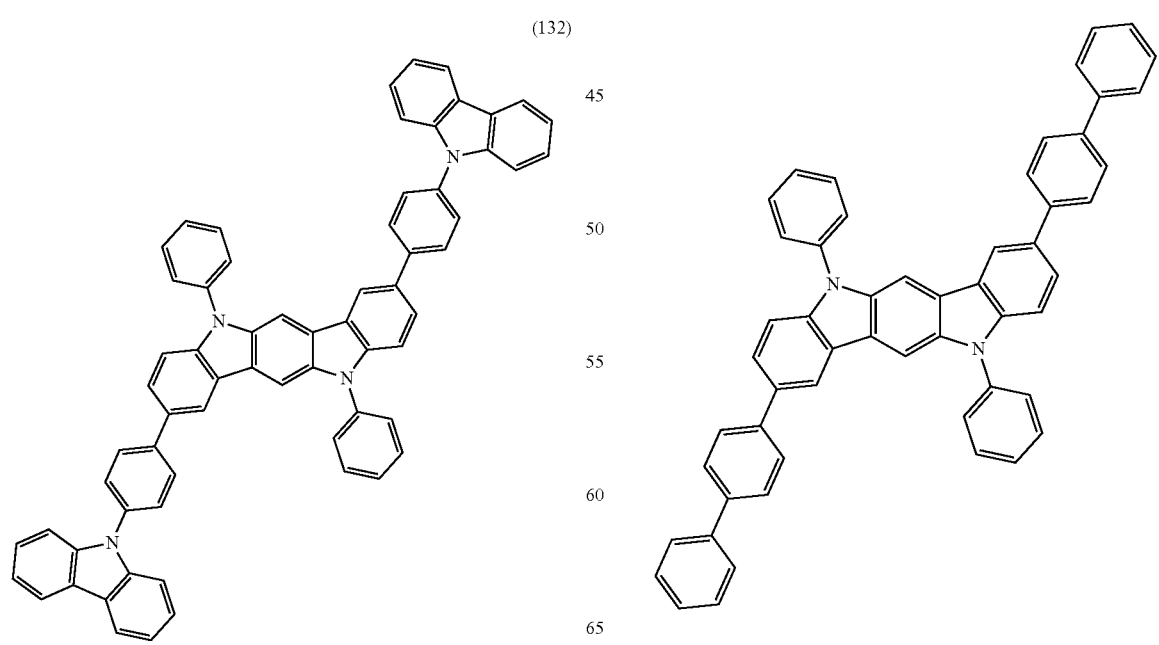

(134)
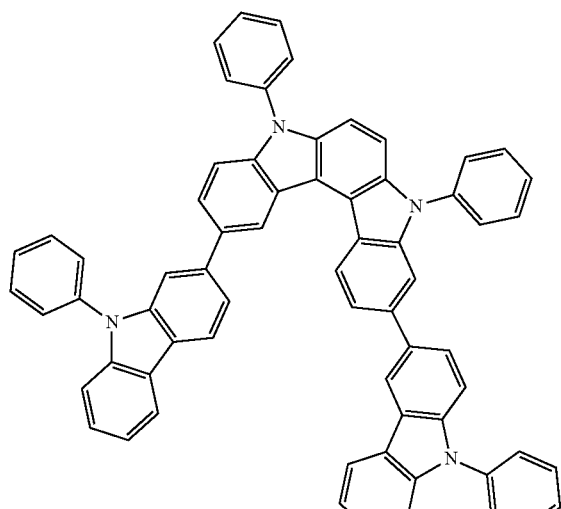
(135)
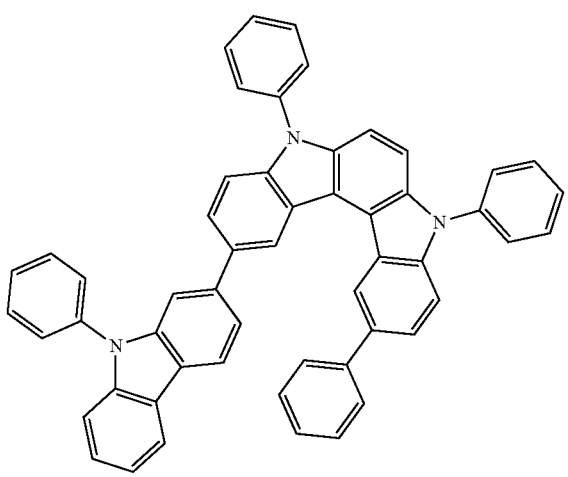
(136)
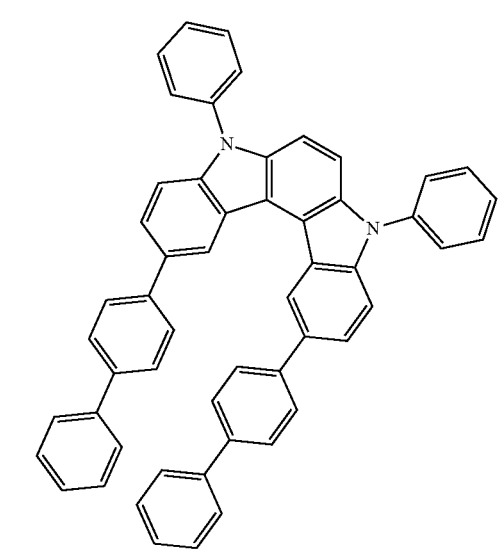
(137)
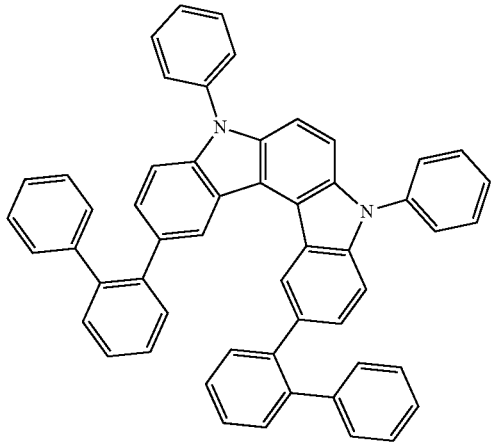
(138)
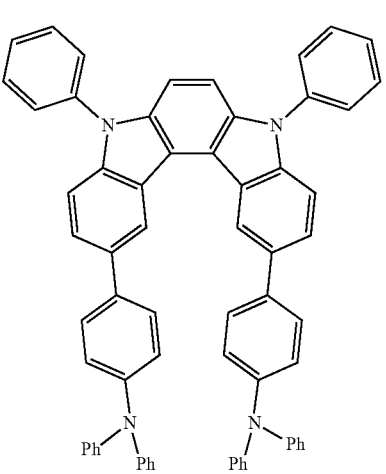
(139)
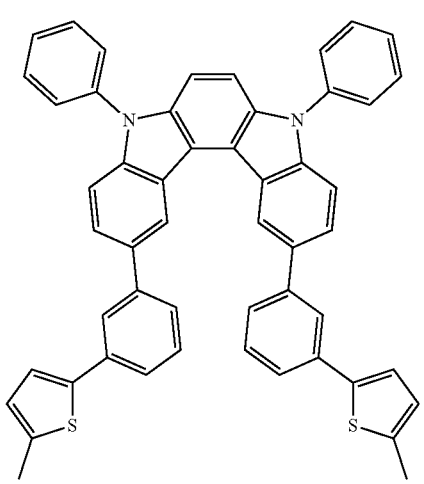

(140)
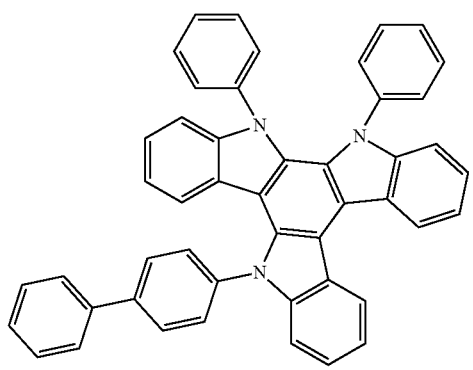
(141)
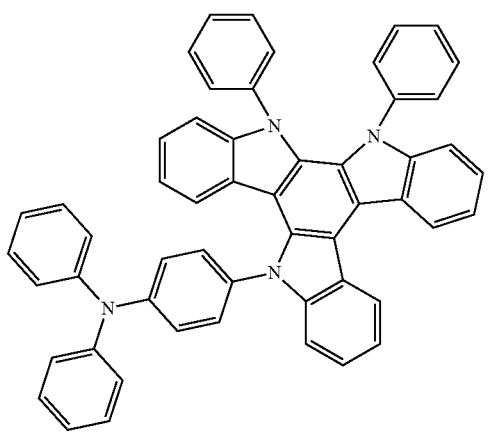
(142)
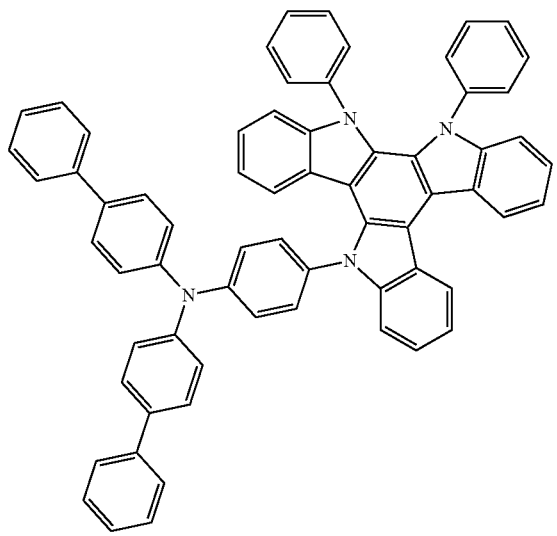
(143)
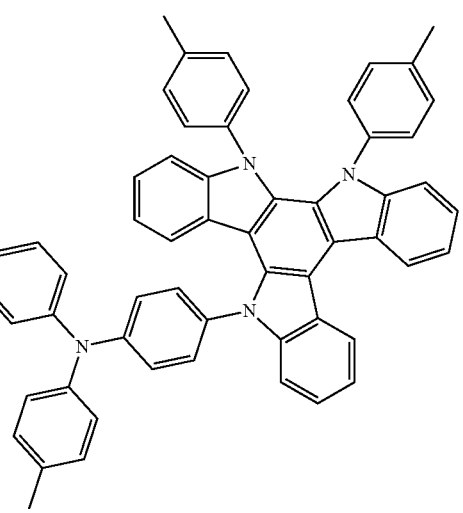
(144)
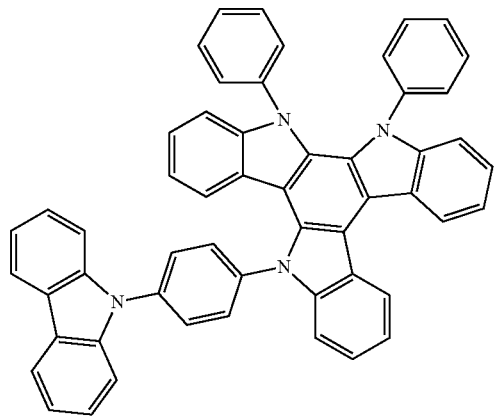
(145)
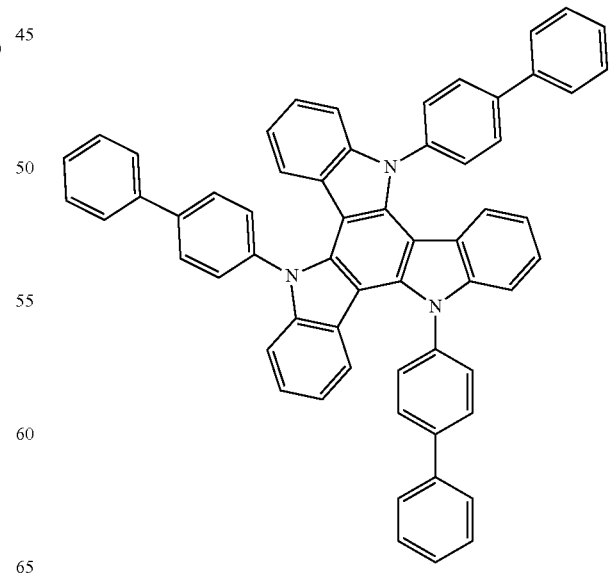

(146)
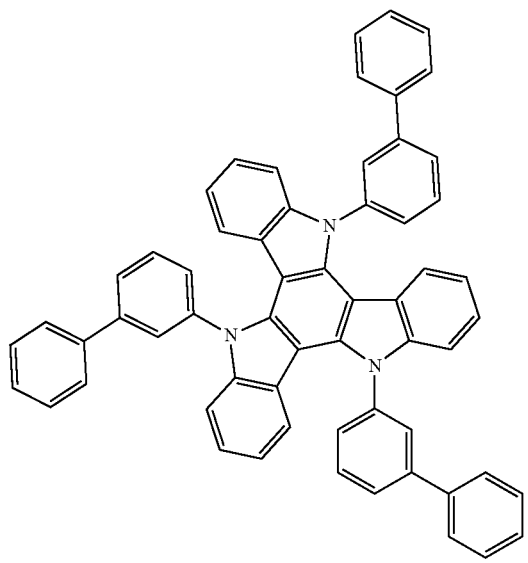
(148)
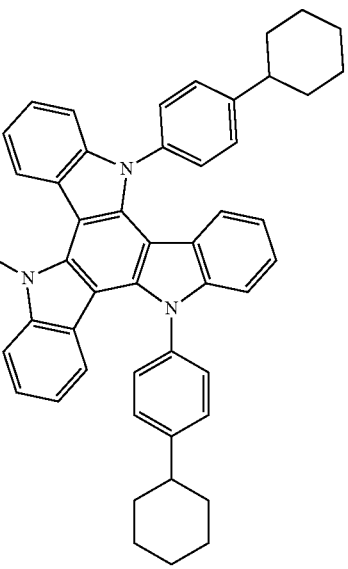
(147)
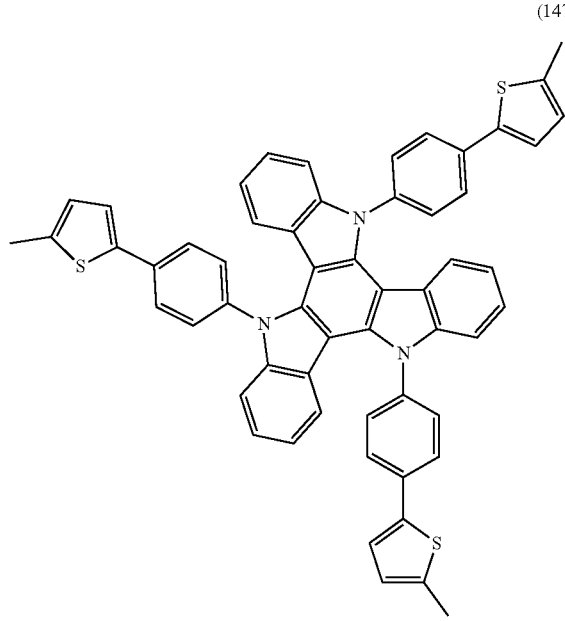
(149)
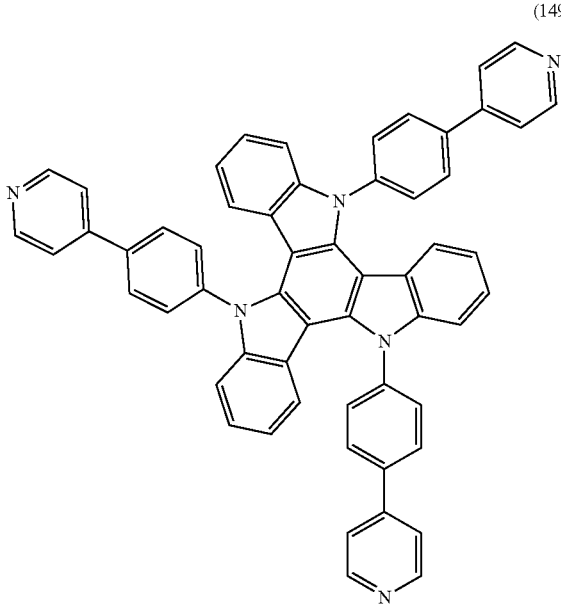

-continued (150)

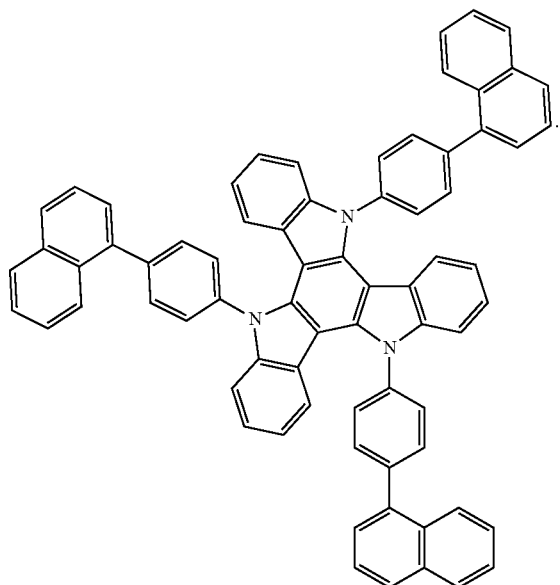

(A7)

The imaging device according to any of A(1) to A(6), where a highest occupied molecular orbital level or work function of a p-type semiconductor contained in the photoelectric conversion layer is −5.6 eV to −5.7 eV.

(A8)

The imaging device according to any of A(1) to A(7), where a difference between a highest occupied molecular orbital level of the first organic semiconductor material and a highest occupied molecular orbital level or work function of a p-type semiconductor contained in the photoelectric conversion layer is in the range of ±0.2 eV.

(A9)

The imaging device according to any of A(1) to A(8), where a difference between a highest occupied molecular orbital level of the first organic semiconductor material and the highest occupied molecular orbital level or the work function of the p-type semiconductor is in the range of ±0.2 eV.

(A10)

The imaging device according to any of A(1) to A(9), where an indolocarbazole skeleton of the indolocarbazole derivative has intramolecular symmetry and a 5-membered pyrrole ring.

(A11)

The imaging device according to any of A(1) to A(10), where a mother skeleton of the indolocarbazole derivative has a large size and has no molecular rotation when heat, light and voltage are applied to the mother skeleton.

(A12)

The imaging device according to any of A(1) to A(11), where the mother skeleton of the indolocarbazole derivative has no molecular rotation when heat, light and voltage are applied simultaneously to the mother skeleton.

(A13)

The imaging device according to any of A(1) to A(12), where the first organic semiconductor material is an electron blocking layer.

(A14)

The imaging device according to any of A(1) to A(13), where the upper electrode includes indium-zinc oxide.

(A15)

The imaging device according to any of A(1) to A(14), where the lower electrode includes indium-tin oxide.

(A16)

The imaging device according to any of A(l) to A(15), where the photoelectric conversion layer includes at least two materials selected from the group consisting of a naphthalene derivative, an anthracene derivative, a phenanthrene derivative, a pyrene derivative, a perylene derivative, a tetracene derivative, a pentacene derivative, a quinacridone derivative, a picene derivative, a chrysene derivative, a fluoranthene derivative, a phthalocyanine derivative, a subphthalocyanine derivative, a metal complex having a heterocyclic compound as a ligand, a thienoacene material typified by a benzothienothiophene (BTBT) derivative, a dinaphthothienothiophene (DNTT) derivative, a dianthracenothienothiophene (DATT) derivative, a benzobisbenzothiophene (BBBT) derivative, a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, and a compound represented by the following formula (11)

(11)

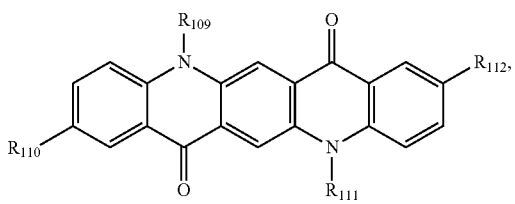

where, $R_{109}$ to $R_{112}$ each independently represent a hydrogen group, an alkyl group, an aryl group, an arylamino group, or a carbazolyl group, organic semiconductors having HOMO levels and LUMO levels higher than those of p-type organic semiconductors, transparent inorganic metal oxides, a heterocyclic compound containing a nitrogen atom and an oxygen atom and a sulfur atom, organic molecules, organometallic complexes and subphthalocyanine derivatives having pyridine, pyrazine, pyrimidine, triazine, quinoline, quinoxaline, isoquinoline, acridine, phenazine, phenanthroline, tetrazole, pyrazole, imidazole, thiazole, oxazole, benzimidazole, benzotriazole, benzoxazole, carbazole, benzofuran, dibenzofuran, fullerenes, and fullerene derivatives.

(A17)

The imaging device according to any of A(1) to A(16), further including: a second organic semiconductor material disposed between the photoelectric conversion layer and the upper electrode, where the second organic semiconductor material includes at least one of pyridine, quinoline, acridine, indole, imidazole, benzimidazole, phenanthroline, and fullerenes and derivatives thereof having absorption in the visible light region from 400 nm to 700 nm and typified by C60 and C70.

(A18)

The imaging device according to any of A(1) to A(17), wherein the indolocarbazole derivative includes at least two indole rings in one molecule.

(A19)

The imaging device according to A(1), further comprising: a first semiconductor material is disposed adjacent to the first organic semiconductor material.

(A20)

The imaging device according to A(19), wherein the first semiconductor material comprises at least one material selected from the group consisting of triarylamine compounds, benzidine compounds, styrylamine compounds, carbazole derivatives, naphthalene derivatives, anthracene derivatives, phenanthrene derivatives, pyrene derivatives, perylene derivatives, tetracene derivatives, pentacene derivatives, picene derivatives, chrysene derivatives, fluoranthene derivatives, phthalocyanine derivatives, subphthalocyanine derivatives, hexaazatriphenylene derivatives, metal complexes having a heterocyclic compound as a ligand, thienoacene materials typified by benzothienothiophene (BTBT) derivatives, dinaphthothienothiophene (DNTT) derivatives, dianthracenothienothiophene (DATT) derivatives, benzobisbenzothiophene (BBBT) derivatives, thienobisbenzothiophene (TBBT) derivatives, dibenzothienobisbenzothiophene (DBTBT) derivatives, dithienobenzodithiophene (DTBDT) derivatives, dibenzothienodithiophene (DBTDT) derivatives, benzodithiophene (BDT) derivatives, naphthodithiophene (NDT) derivatives, anthracenodithiophene (ADT) derivatives, tetracenodithiophene (TDT) derivatives and pentacenodithiophene (PDT) derivatives, poly(3,4-ethylenedioxythiophene)/polystyrenesulfonic acid (PEDOT/PSS), polyaniline, molybdenum oxide (MoOx), ruthenium oxide (RuOx), vanadium oxide (VOx), tungsten oxide (WOx).

(A21)

The imaging device according to any of A(1) to A(18), further including: a second organic semiconductor material disposed between the photoelectric conversion layer and the upper electrode, where the upper electrode includes indium-zinc oxide, where the lower electrode includes indium-tin oxide, where the photoelectric conversion layer includes 2 Ph-benzothienothiophene, subphthalocyanine, and C60, and where the second organic semiconductor material includes at least one of pyridine, quinoline, acridine, indole, imidazole, benzimidazole, phenanthroline, and fullerenes and derivatives thereof having absorption in the visible light region from 400 nm to 700 nm and typified by C60 and C70.

(A22)

An electronic apparatus, including: a lens; signal processing circuitry; and an imaging device, including: an upper electrode; a lower electrode; a photoelectric conversion layer disposed between the upper electrode and the lower electrode; a first organic semiconductor material including an indolocarbazole derivative and disposed between the upper electrode and the lower electrode.

The invention claimed is:

1. An imaging device, comprising:
   a first electrode;
   a second electrode;
   a photoelectric conversion layer disposed between the first electrode and the second electrode;
   a first organic semiconductor material comprising an indolocarbazole derivative and disposed between the first electrode and the second electrode; and
   a second organic semiconductor material disposed between the photoelectric conversion layer and the second electrode,
   wherein the first electrode comprises indium-tin oxide,
   wherein the second electrode comprises indium-zinc oxide,
   wherein the photoelectric conversion layer comprises 2 Ph-benzothienothiophene, subphthalocyanine, and C60, and
   wherein the second organic semiconductor material comprises at least one of pyridine, quinoline, acridine, indole, imidazole, benzimidazole, phenanthroline, and fullerenes and derivatives thereof having absorption in the visible light region from 400 nm to 700 nm.

2. The imaging device according to claim 1,
wherein the first organic semiconductor material is disposed between the photoelectric conversion layer and the first electrode.

3. The imaging device according to claim 1,
wherein the indolocarbazole derivative is selected from the group consisting of

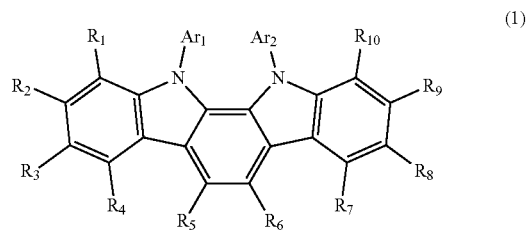

(1)

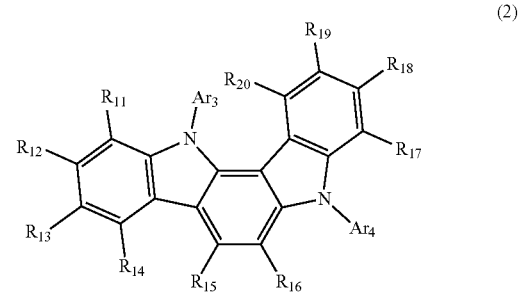

(2)

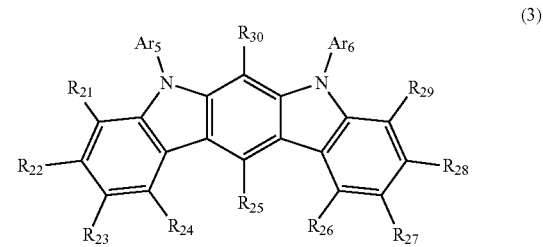

(3)

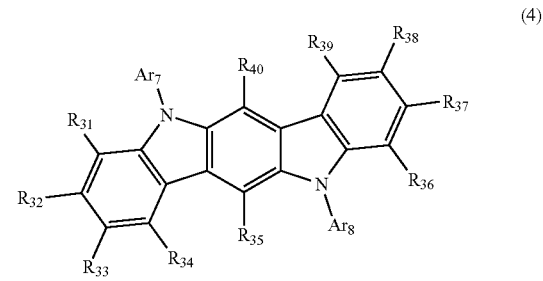

(4)

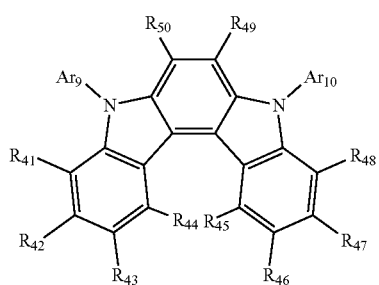

(5)

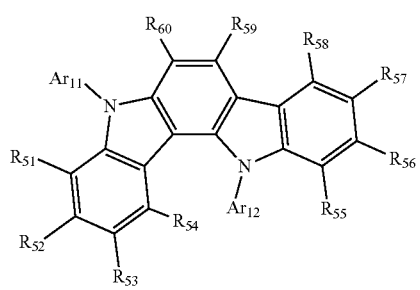

(6)

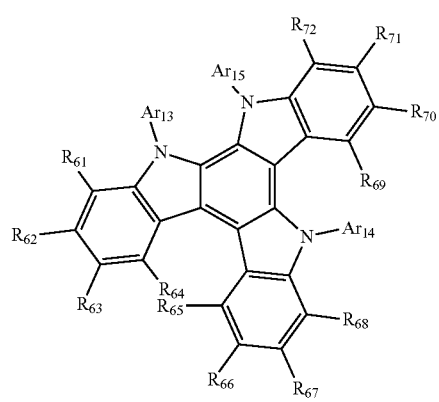

(7)

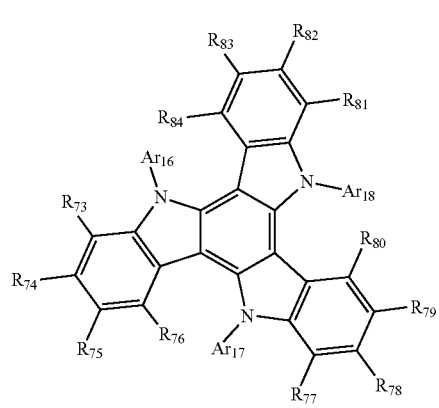

(8)

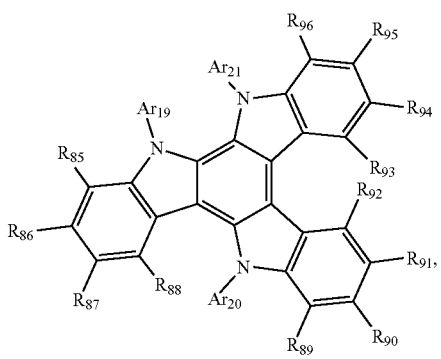

(9), and

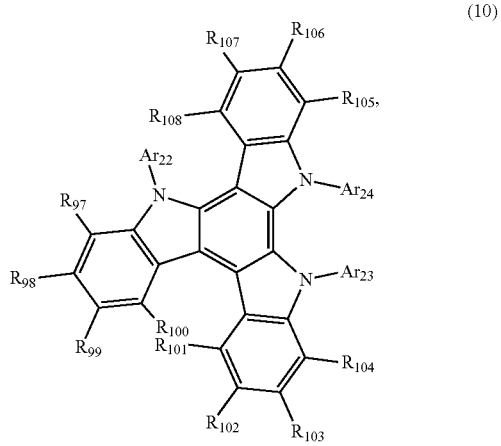

(10)

wherein in the formulas (1) to (10), the $Ar_1$ to $Ar_{24}$ each independently represent an aryl group; and $R_1$ to $R_{108}$ each independently represent a hydrogen group, an alkyl group, an aryl group, an arylamino group, an aryl group having an arylamino group as a substituent, or a carbazolyl group.

4. The imaging device according to claim 3, wherein the formulas (1) to (10) are further selected from the group consisting of (100)
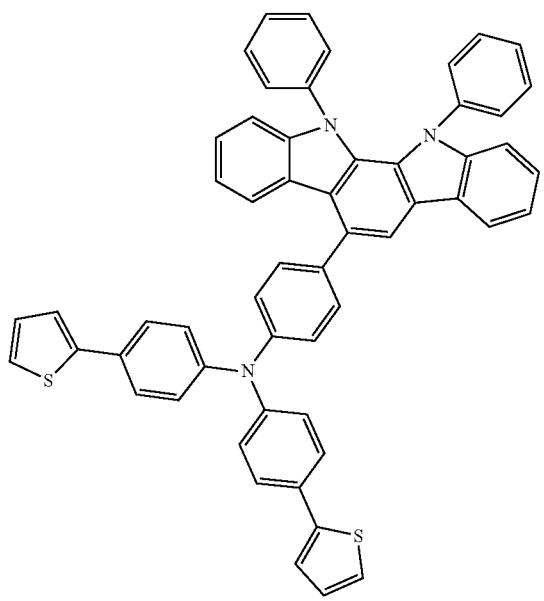
(101)
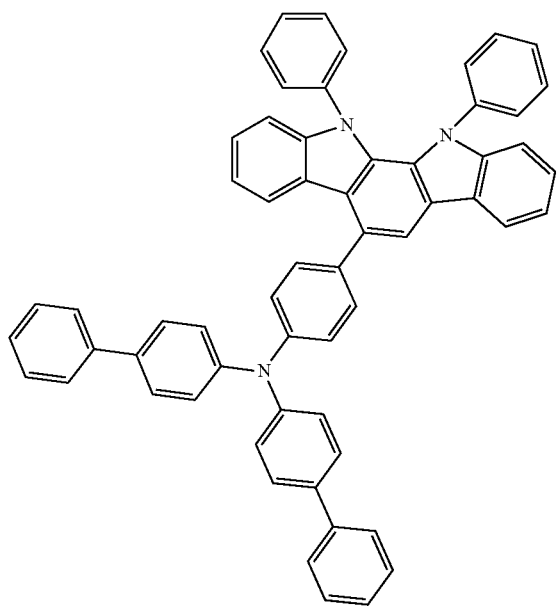
(102)
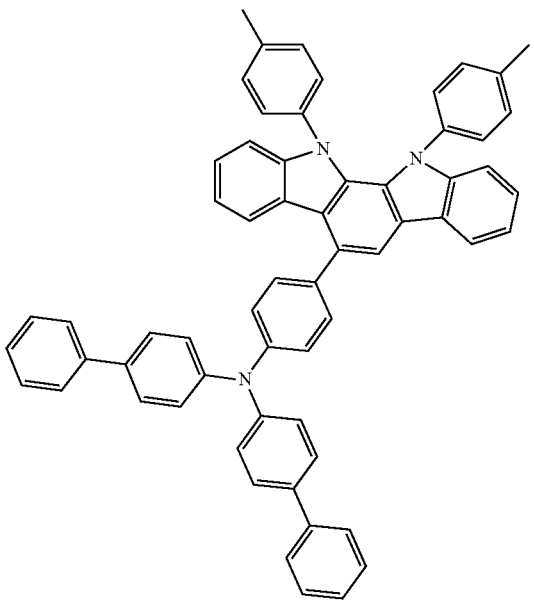
(103)
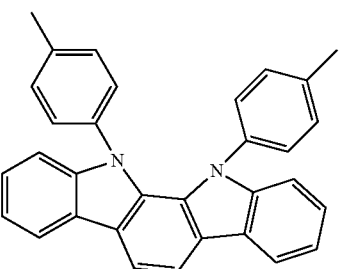
(104)
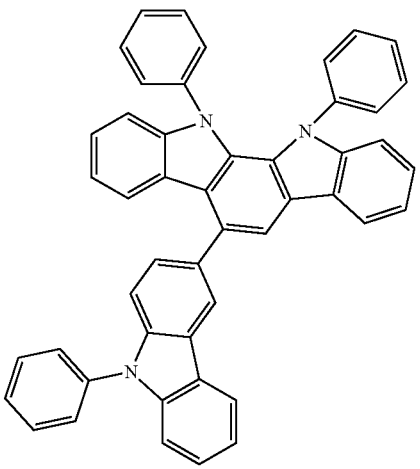

(105)
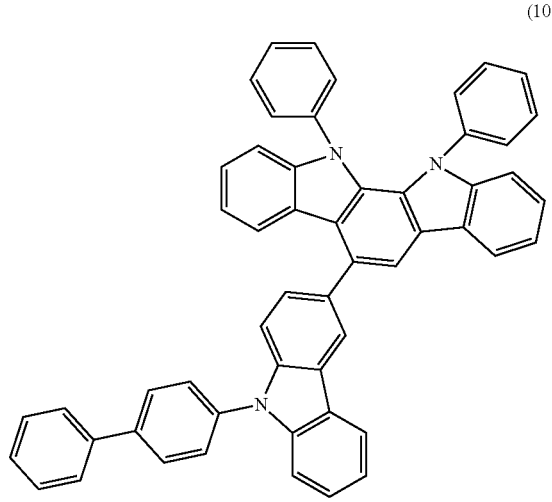
(106)
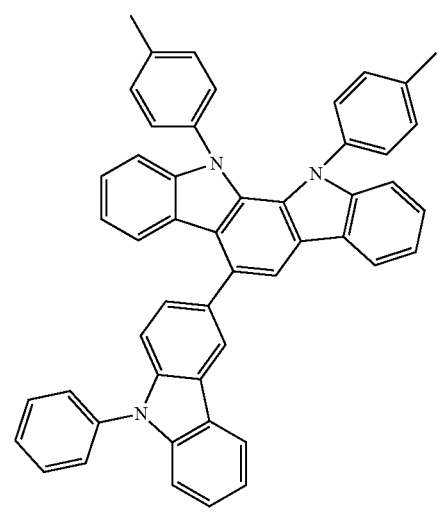
(107)
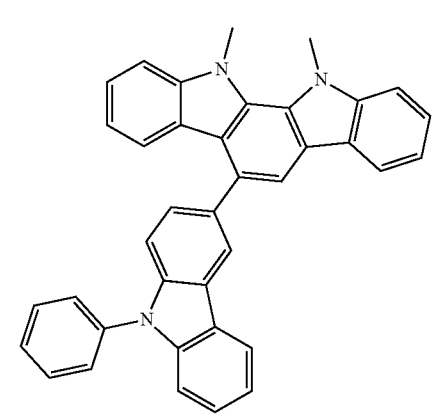
(108)
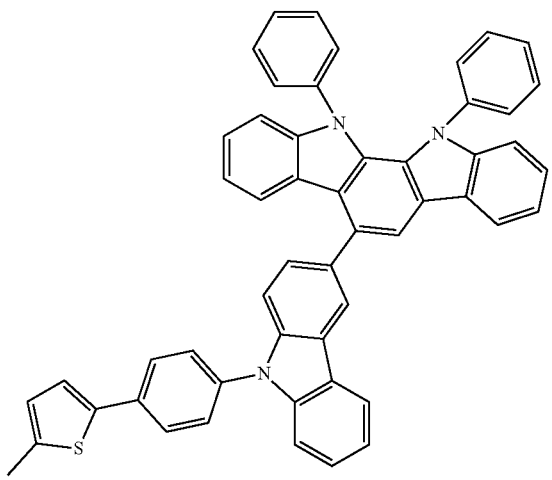
(109)
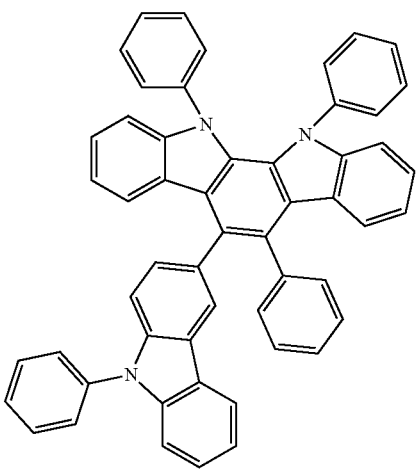
(110)
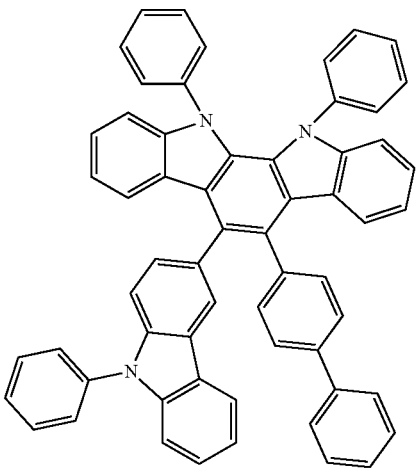

-continued
(111)
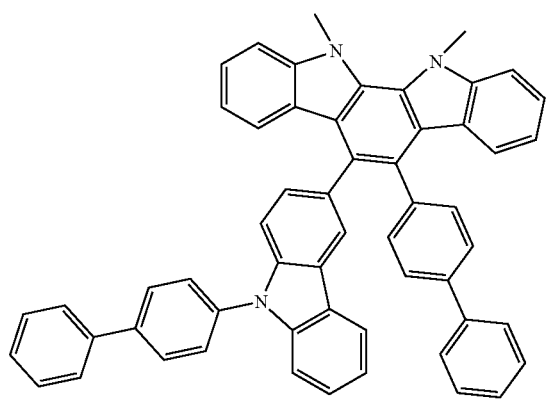
(112)
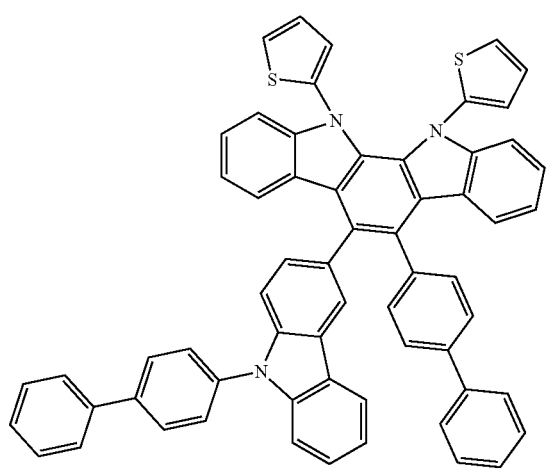
(113)
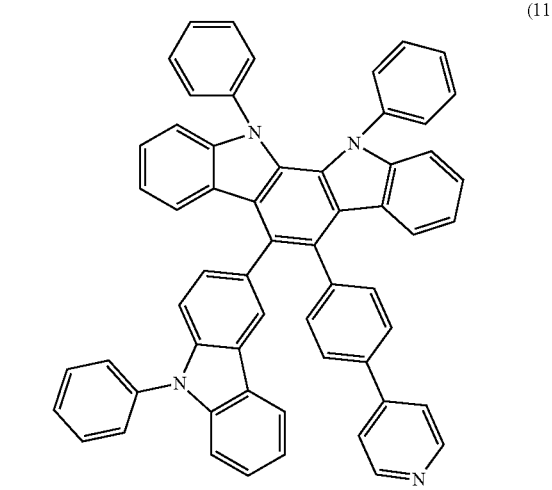
-continued
(114)
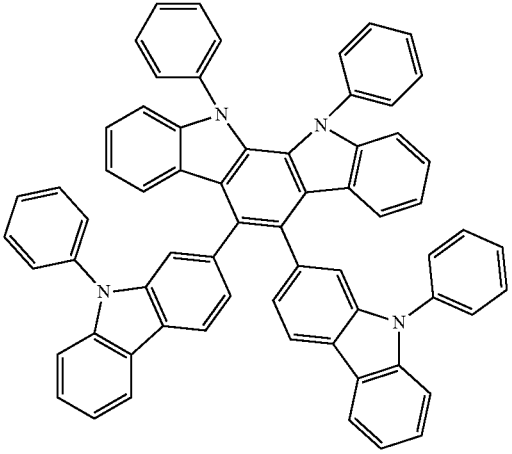
(115)
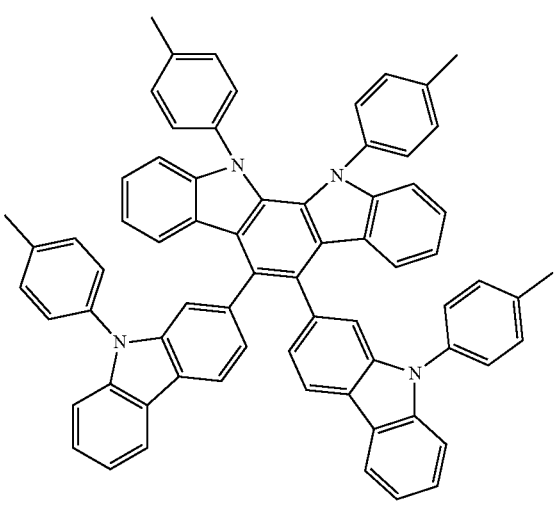
5. The imaging device according to claim 3, wherein the formulas (1) to (10) are further selected from the group consisting of

113           114
(116)
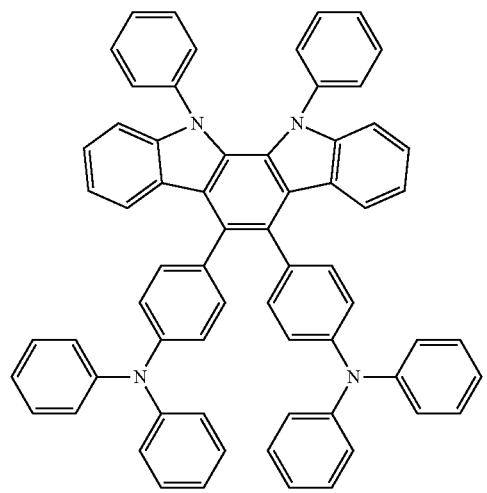
(117)
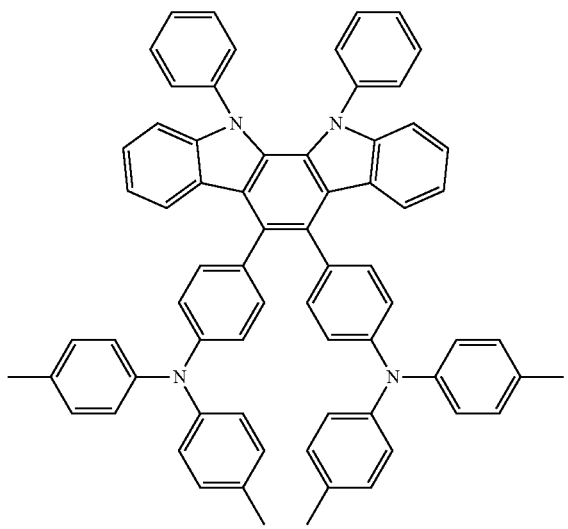
(118)
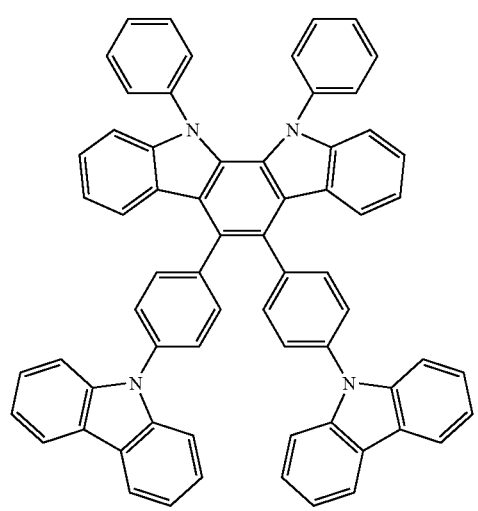
(119)
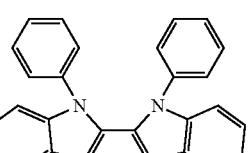
(120)
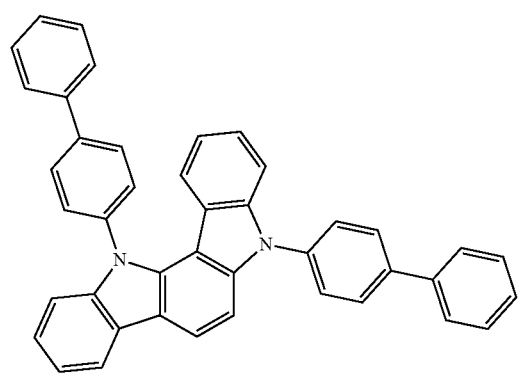
(121)
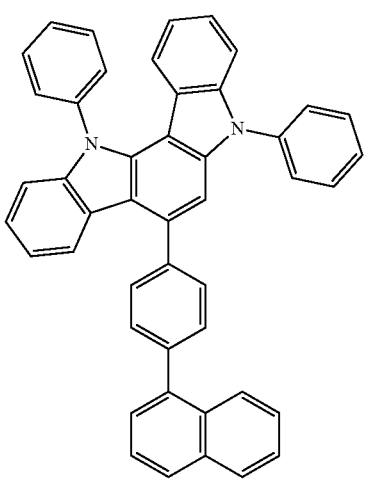

-continued
(122)
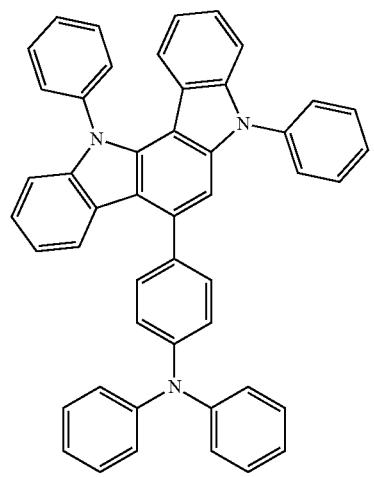
(123)
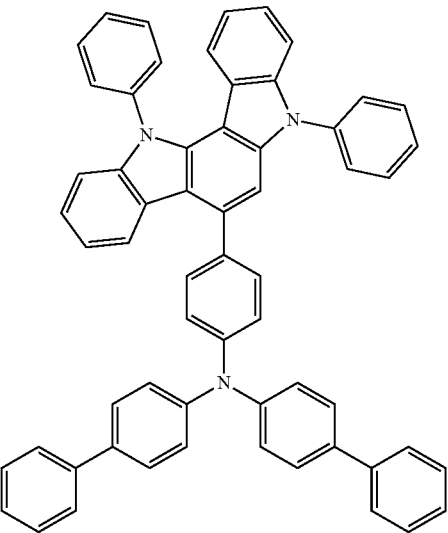
(124)
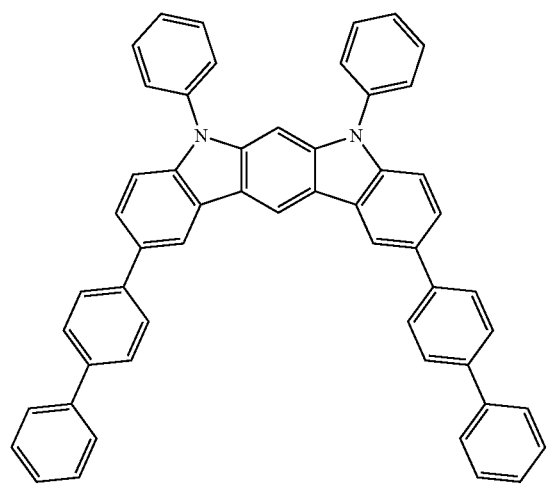
(125)
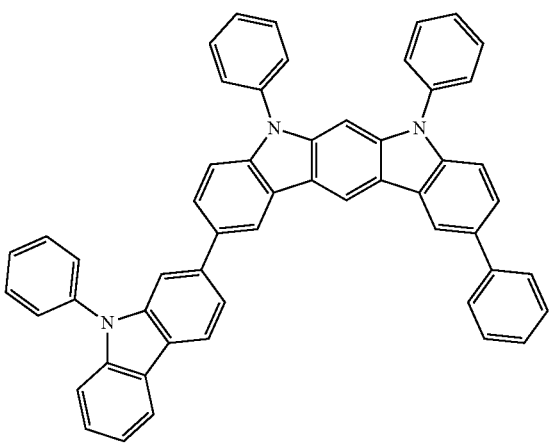
(126)
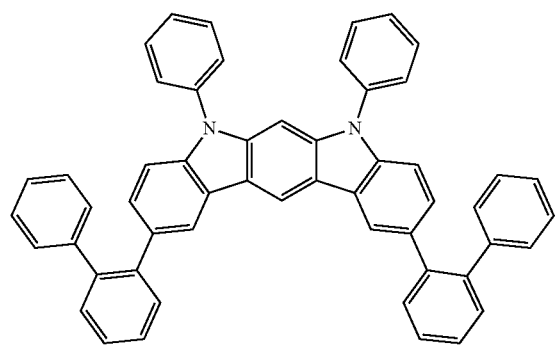
(127)
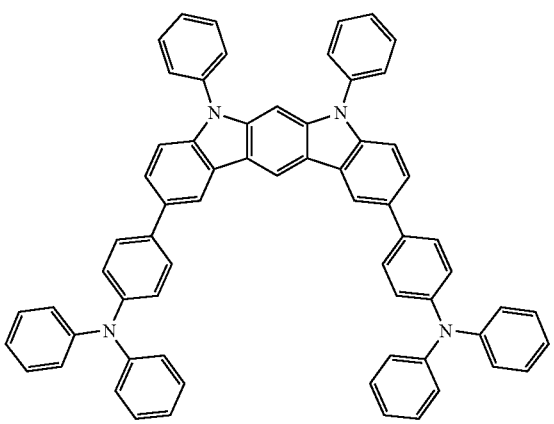

(128)
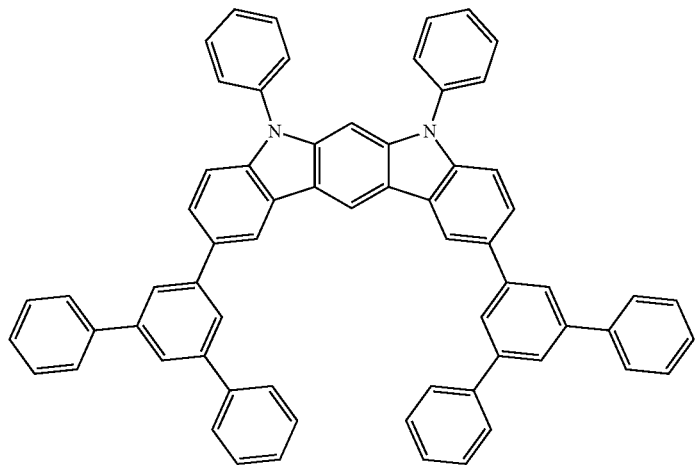
(129)
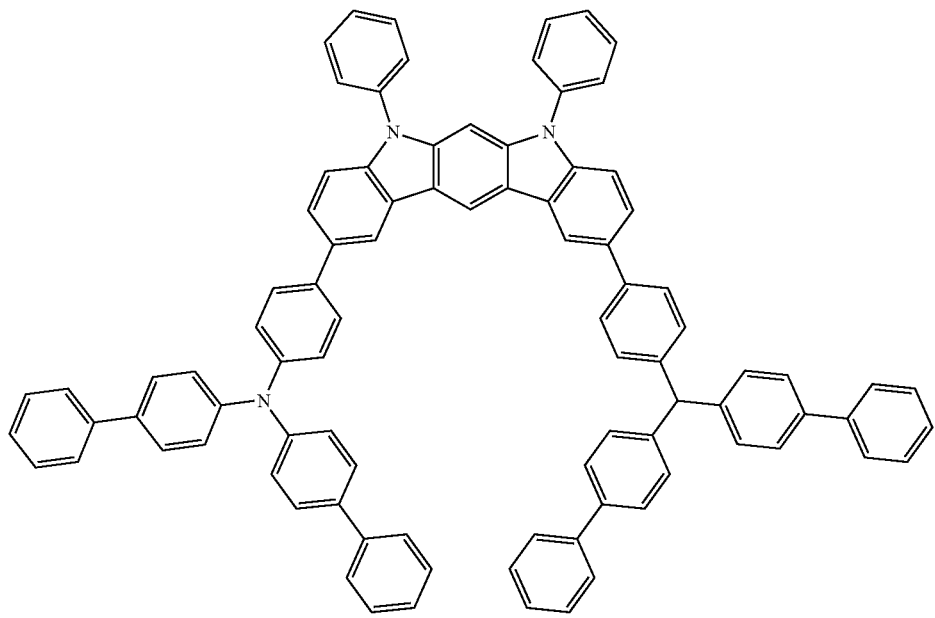
(130)
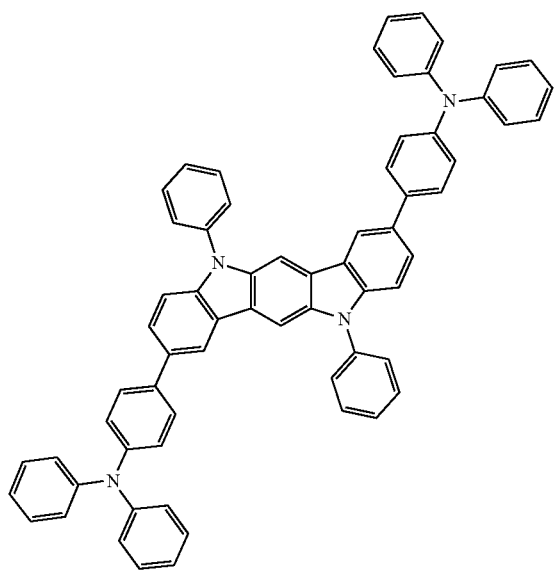

(131)
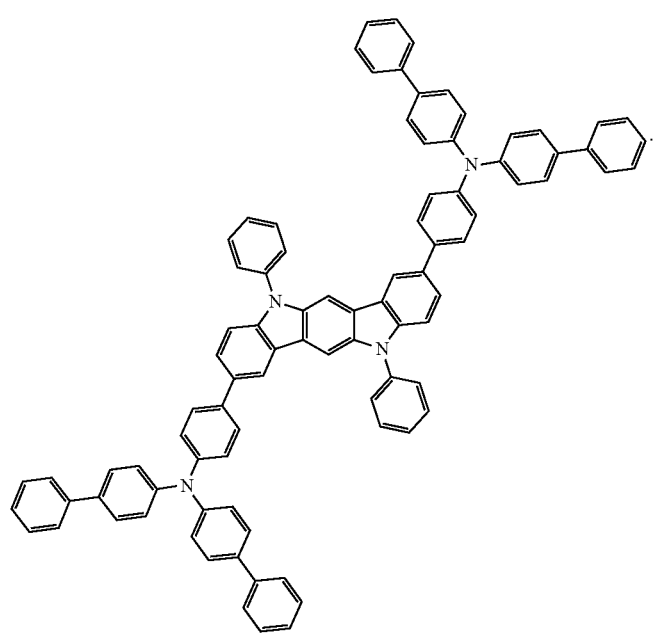
6. The imaging device according to claim 3, wherein the formulas (1) to (10) are further selected from the group consisting of
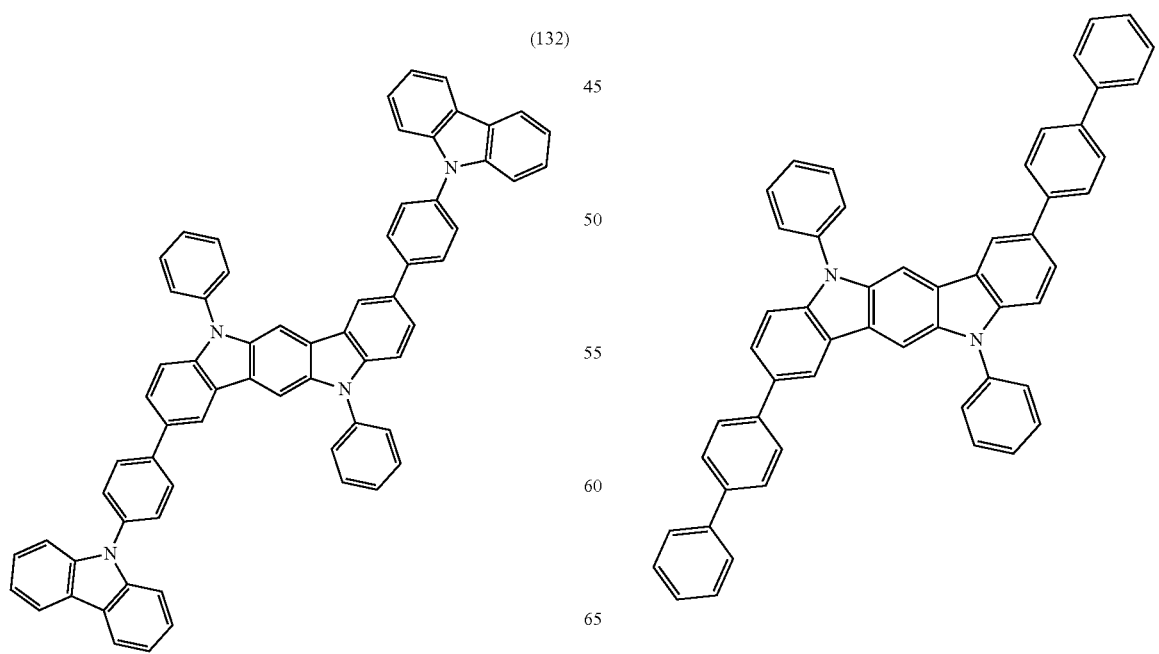

(134)
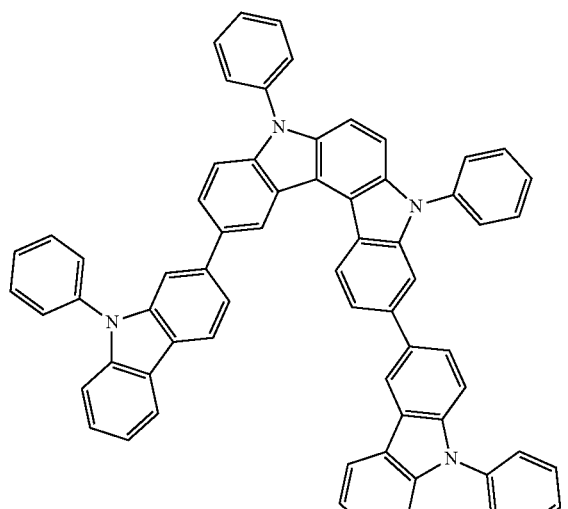
(135)
(136)
(137)
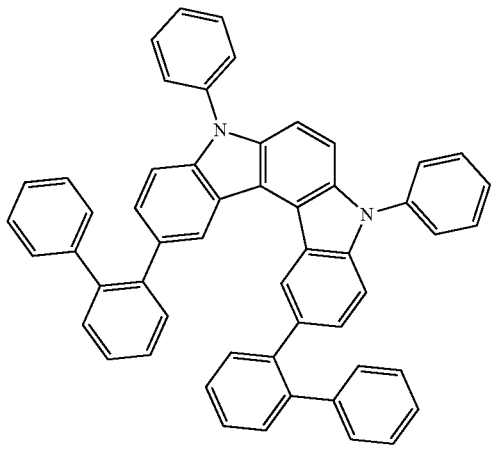
(138)
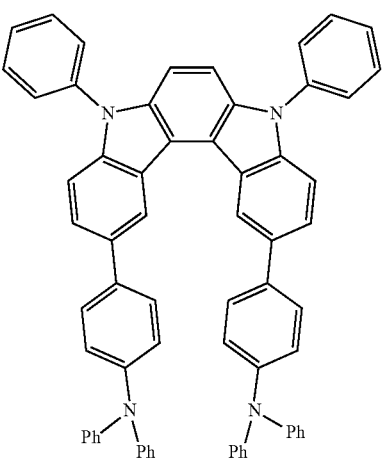
(139)
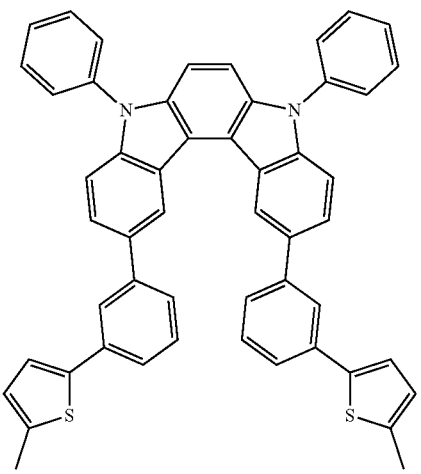

(140)
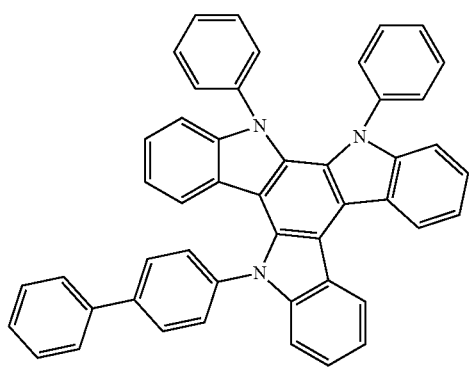
(141)
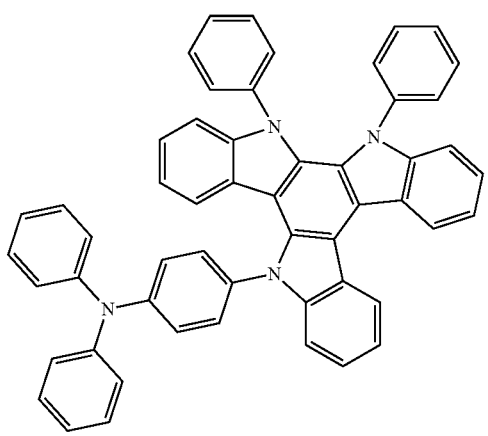
(142)
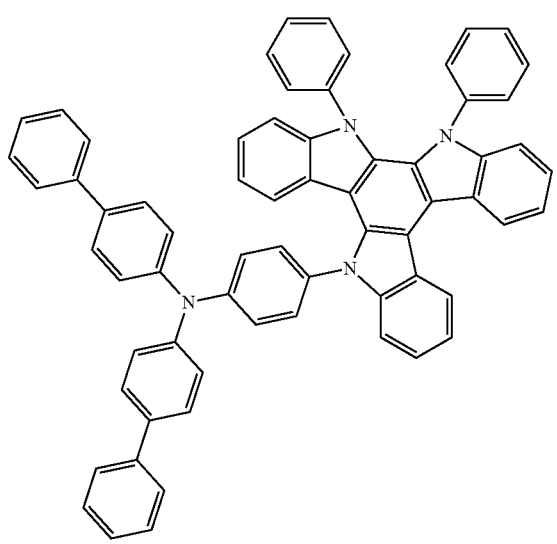
(143)
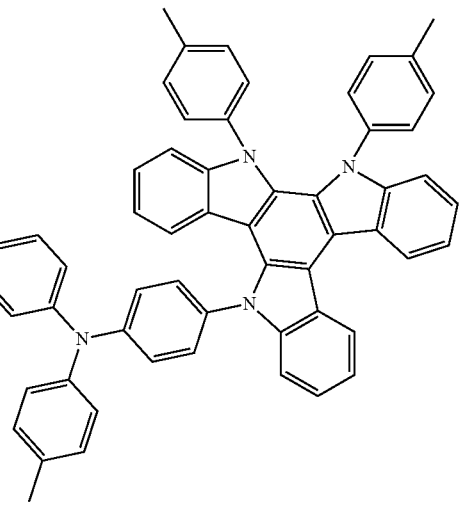
(144)
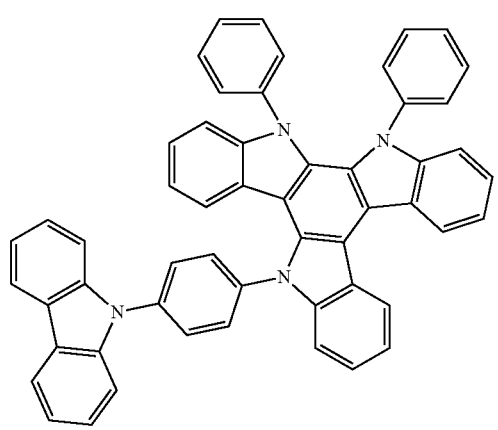
(145)
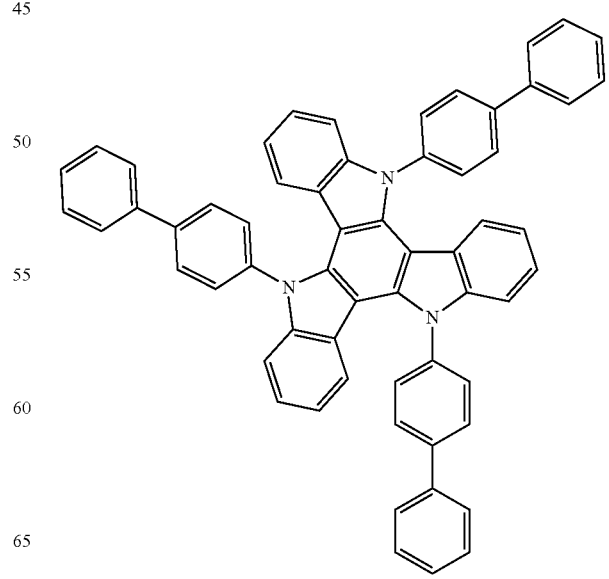

(146)
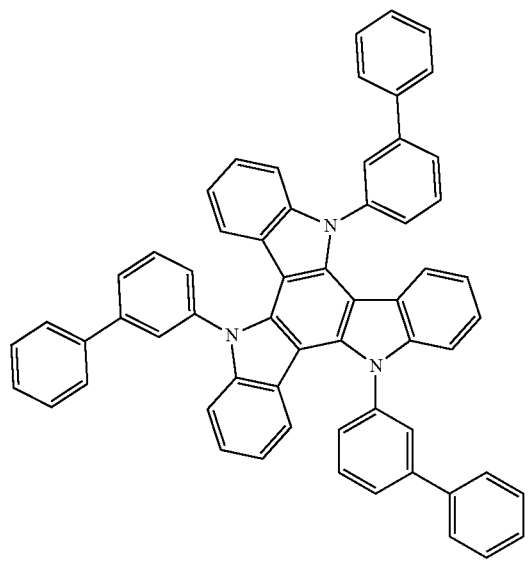
(148)
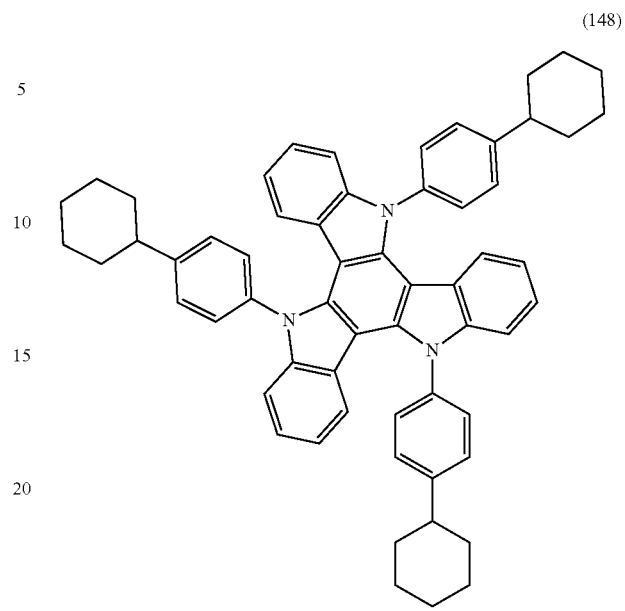
(147)
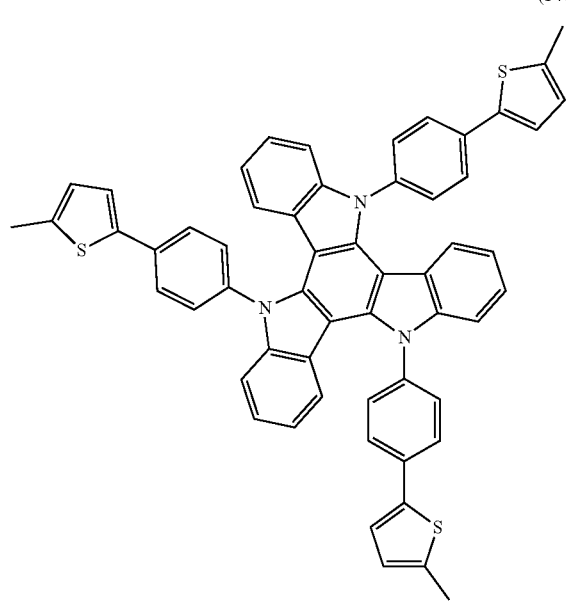
(149)
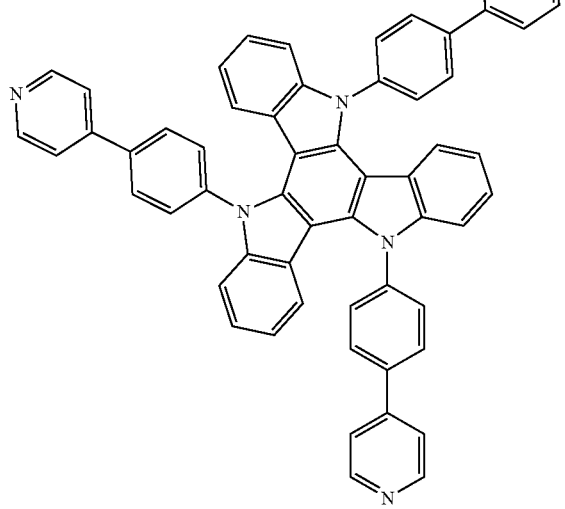

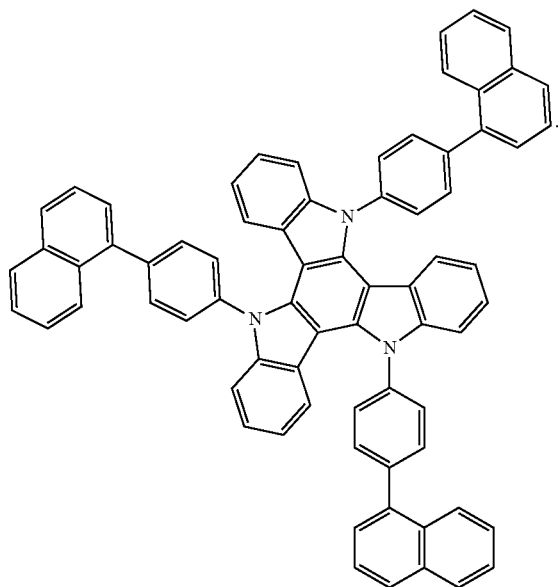

(150)

heterocyclic compound as a ligand, a thienoacene material typified by a benzothienothiophene (BTBT) derivative, a dinaphthothienothiophene (DNTT) derivative, a dianthracenothienothiophene (DATT) derivative, a benzobisbenzothiophene (BBBT) derivative, a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, and a compound represented by the following formula (11)

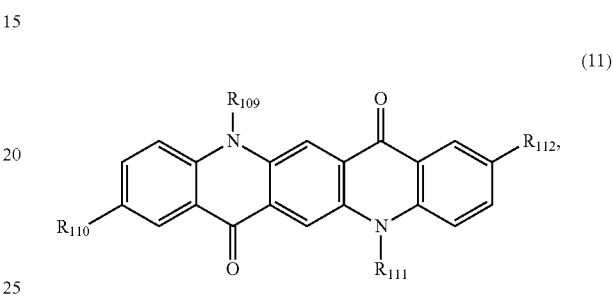

(11)

wherein, $R_{109}$ to $R_{112}$ each independently represent a hydrogen group, an alkyl group, an aryl group, an arylamino group, or a carbazolyl group, organic semiconductors having HOMO levels and LUMO levels higher than those of p-type organic semiconductors, transparent inorganic metal oxides, a heterocyclic compound containing a nitrogen atom and an oxygen atom and a sulfur atom, organic molecules, organometallic complexes and subphthalocyanine derivatives having pyridine, pyrazine, pyrimidine, triazine, quinoline, quinoxaline, isoquinoline, acridine, phenazine, phenanthroline, tetrazole, pyrazole, imidazole, thiazole, oxazole, benzimidazole, benzotriazole, benzoxazole, carbazole, benzofuran, dibenzofuran, fullerenes, and fullerene derivatives.

7. The imaging device according to claim 1, wherein a narrowest highest occupied molecular orbital level or work function of the photoelectric conversion layer is −5.6 eV to −5.7 eV.

8. The imaging device according to claim 1, wherein a difference between a highest occupied molecular orbital level of the first organic semiconductor material and a narrowest highest occupied molecular orbital level or work function of the photoelectric conversion layer is in the range of ±0.2 eV.

9. The imaging device according to claim 7, wherein a difference between a highest occupied molecular orbital level of the first organic semiconductor material and the narrowest highest occupied molecular orbital level or the work function of the photoelectric conversion layer is in the range of ±0.2 eV.

10. The imaging device according to claim 1, wherein an indolocarbazole skeleton of the indolocarbazole derivative has intramolecular symmetry and a 5-membered pyrrole ring.

11. The imaging device according to claim 1, wherein a mother skeleton of the indolocarbazole derivative has a large size and has no molecular rotation when heat, light and voltage are applied to the mother skeleton.

12. The imaging device according to claim 10, wherein the mother skeleton of the indolocarbazole derivative has no molecular rotation when heat, light and voltage are applied simultaneously to the mother skeleton.

13. The imaging device according to claim 1, wherein the first organic semiconductor material is an electron blocking layer.

14. The imaging device according to claim 2, wherein the photoelectric conversion layer comprises at least two materials selected from the group consisting of a naphthalene derivative, an anthracene derivative, a phenanthrene derivative, a pyrene derivative, a perylene derivative, a tetracene derivative, a pentacene derivative, a quinacridone derivative, a picene derivative, a chrysene derivative, a fluoranthene derivative, a phthalocyanine derivative, a subphthalocyanine derivative, a metal complex having a 15. The imaging device according to claim 1, wherein the indolocarbazole derivative comprises at least two indole rings in one molecule.

16. The imaging device according to claim 1, further comprising: a first semiconductor material disposed adjacent to the first organic semiconductor material.

17. The imaging device according to claim 16, wherein the first semiconductor material comprises at least one material selected from the group consisting of triarylamine compounds, benzidine compounds, styrylamine compounds, carbazole derivatives, naphthalene derivatives, anthracene derivatives, phenanthrene derivatives, pyrene derivatives, perylene derivatives, tetracene derivatives, pentacene derivatives, picene derivatives, chrysene derivatives, fluoranthene derivatives, phthalocyanine derivatives, subphthalocyanine derivatives, hexaazatriphenylene derivatives, metal complexes having a heterocyclic compound as a ligand, thienoacene materials typified bybenzothienothiophene (BTBT) derivatives, dinaphthothienothiophene (DNTT) derivatives, dianthracenothienothiophene (DATT) derivatives, benzobisbenzothiophene (BBBT) derivatives, thienobisbenzothiophene (TBBT) derivatives, dibenzothienobisbenzothiophene (DBTBT) derivatives, dithienobenzodithiophene (DTBDT) derivatives, dibenzothienodithiophene (DBTDT) derivatives, benzodithiophene (BDT) derivatives, naphthodithiophene (NDT) derivatives, anthracenodithiophene (ADT) derivatives, tetracenodithiophene (TDT) derivatives and pentacenodithiophene (PDT) derivatives, poly(3,4-ethylenedioxythiophene)/polystyrenesulfonic acid (PEDOT/PSS), polyaniline, molybdenum oxide (MoOx), ruthenium oxide (RuOx), vanadium oxide (VOx), and tungsten oxide (WOx).

18. An electronic apparatus, comprising:
   a lens;
   signal processing circuitry; and
      an imaging device, comprising:
      a first electrode;
      a second electrode;
      a photoelectric conversion layer disposed between the first electrode and the second electrode;
      a first organic semiconductor material comprising an indolocarbazole derivative and disposed between the first electrode and the second electrode; and
      a second organic semiconductor material disposed between the photoelectric conversion layer and the second electrode,
      wherein the first electrode comprises indium-tin oxide,
      wherein the second electrode comprises indium-zinc oxide,
      wherein the photoelectric conversion layer comprises 2 Ph-benzothienothiophene, subphthalocyanine, and C60, and
      wherein the second organic semiconductor material comprises at least one of pyridine, quinoline, acridine, indole, imidazole, benzimidazole, phenanthroline, and fullerenes and derivatives thereof having absorption in the visible light region from 400 nm to 700 nm.

* * * * *